(12) United States Patent
Yamazaki et al.

(10) Patent No.: US 11,152,513 B2
(45) Date of Patent: Oct. 19, 2021

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yoshinobu Asami, Kanagawa (JP); Takahisa Ishiyama, Shizuoka (JP); Motomu Kurata, Kanagawa (JP); Ryo Tokumaru, Kanagawa (JP); Noritaka Ishihara, Kanagawa (JP); Yusuke Nonaka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 43 days.

(21) Appl. No.: 16/643,453

(22) PCT Filed: Aug. 24, 2018

(86) PCT No.: PCT/IB2018/056414
§ 371 (c)(1),
(2) Date: Feb. 28, 2020

(87) PCT Pub. No.: WO2019/048968
PCT Pub. Date: Mar. 14, 2019

(65) Prior Publication Data
US 2021/0126130 A1    Apr. 29, 2021

(30) Foreign Application Priority Data

Sep. 5, 2017  (JP) ............................. JP2017-170017
Sep. 5, 2017  (JP) ............................. JP2017-170018

(Continued)

(51) Int. Cl.
*H01L 29/786* (2006.01)
*H01L 29/22* (2006.01)
*H01L 29/66* (2006.01)

(52) U.S. Cl.
CPC .......... *H01L 29/7869* (2013.01); *H01L 29/22* (2013.01); *H01L 29/66969* (2013.01)

(58) Field of Classification Search
CPC ...................... H01L 27/1225; H01L 29/7869
See application file for complete search history.

(56) References Cited

U.S. PATENT DOCUMENTS 8,129,717 B2   3/2012  Yamazaki et al.
8,519,387 B2   8/2013  Endo et al.
(Continued)

FOREIGN PATENT DOCUMENTS

JP   2012-257187 A   12/2012
JP   2017-034258 A    2/2017
(Continued)

OTHER PUBLICATIONS

International Search Report (Application No. PCT/IB2018/056414) dated Dec. 18, 2018.
(Continued)

*Primary Examiner* — Raj R Gupta
(74) *Attorney, Agent, or Firm* — Fish & Richardson P.C.

(57) ABSTRACT

A semiconductor device with favorable reliability is provided. The semiconductor device includes a first insulator; a second insulator positioned over the first insulator; an oxide positioned over the second insulator; a first conductor and a second conductor positioned apart from each other over the oxide; a third insulator positioned over the oxide, the first conductor, and the second conductor; a third conductor positioned over the third insulator and at least partly overlapping with a region between the first conductor and the (Continued)

second conductor; a fourth insulator positioned to cover the oxide, the first conductor, the second conductor, the third insulator, and the third conductor; a fifth insulator positioned over the fourth insulator; and a sixth insulator positioned over the fifth insulator. An opening reaching the second insulator is formed in at least part of the fourth insulator; the fifth insulator is in contact with the second insulator through the opening; and the first insulator, the fourth insulator, and the sixth insulator have a lower oxygen permeability than the second insulator.

20 Claims, 40 Drawing Sheets

(30) Foreign Application Priority Data

| | | |
|---|---|---|
| Dec. 12, 2017 | (JP) | JP2017-237526 |
| Feb. 20, 2018 | (JP) | JP2018-027691 |
| Feb. 20, 2018 | (JP) | JP2018-027723 |

(56) References Cited

U.S. PATENT DOCUMENTS

| | | | |
|---|---|---|---|
| 8,547,771 | B2 | 10/2013 | Koyama |
| 8,557,641 | B2 | 10/2013 | Sasaki et al. |
| 8,633,480 | B2 | 1/2014 | Yamazaki et al. |
| 8,995,174 | B2 | 3/2015 | Koyama |
| 9,082,857 | B2 | 7/2015 | Yamazaki et al. |
| 9,111,795 | B2 | 8/2015 | Ieda et al. |
| 9,240,492 | B2 | 1/2016 | Yamazaki |
| 9,269,821 | B2 | 2/2016 | Yamazaki |
| 9,698,276 | B2 | 7/2017 | Yamazaki |
| 9,773,810 | B2 | 9/2017 | Ieda et al. |
| 9,911,861 | B2 | 3/2018 | Okazaki et al. |
| 10,084,048 | B2 | 9/2018 | Noda |
| 10,388,670 | B2 | 8/2019 | Ieda et al. |
| 10,522,690 | B2 | 12/2019 | Okazaki et al. |
| 2015/0280691 | A1 | 10/2015 | Koyama |
| 2015/0349127 | A1* | 12/2015 | Kurata ............... H01L 23/5226 257/43 |
| 2016/0035865 | A1 | 2/2016 | Nagamatsu et al. |
| 2016/0284859 | A1 | 9/2016 | Asami |
| 2017/0040457 | A1 | 2/2017 | Okazaki et al. |
| 2017/0170211 | A1* | 6/2017 | Yamazaki ............ H01L 29/4908 |
| 2018/0190827 | A1 | 7/2018 | Okazaki et al. |
| 2018/0375498 | A1 | 12/2018 | Koyama |
| 2019/0157309 | A1 | 5/2019 | Ieda et al. |

FOREIGN PATENT DOCUMENTS

| | | |
|---|---|---|
| JP | 2017-098535 A | 6/2017 |
| WO | WO-2017/072627 | 5/2017 |

OTHER PUBLICATIONS

Written Opinion (Application No. PCT/IB2018/056414) dated Dec. 18, 2018.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology: Digest of Technical Papers, 2015, pp. T216-T217.

Amano.S et al., "Low Power LC Display Using In—Ga—Zn-Oxide TFTs Based on Variable Frame Frequency", SID Digest '10 : SID International Sympbsium Digest of Technical Papers, May 23, 2010, vol. 41, No. 1, pp. 626-629.

* cited by examiner

FIG. 12A
FIG. 12C
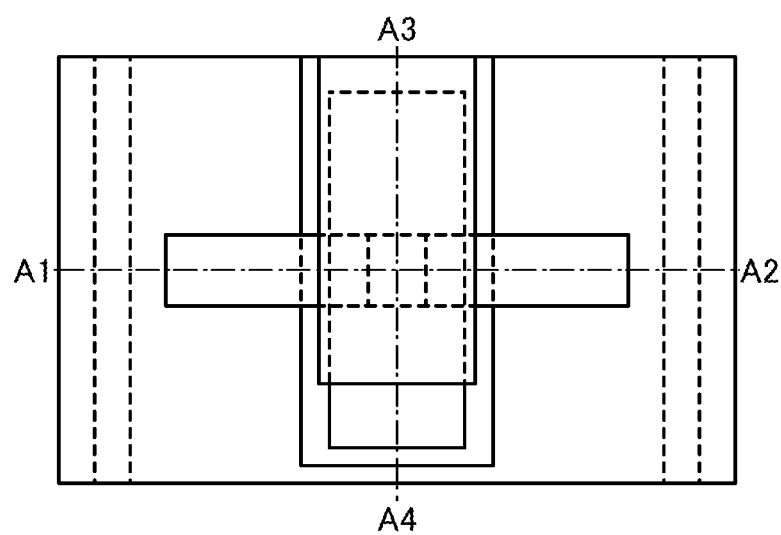
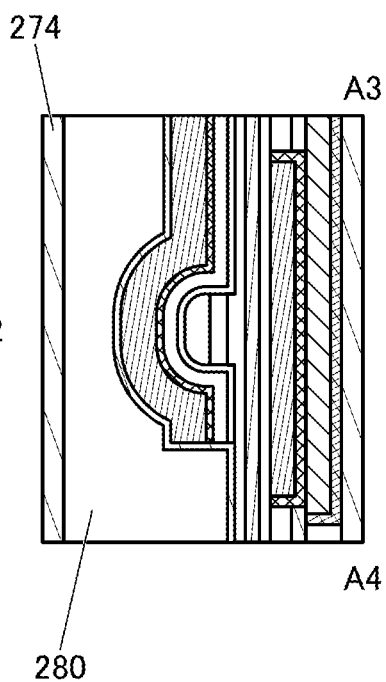
FIG. 12B
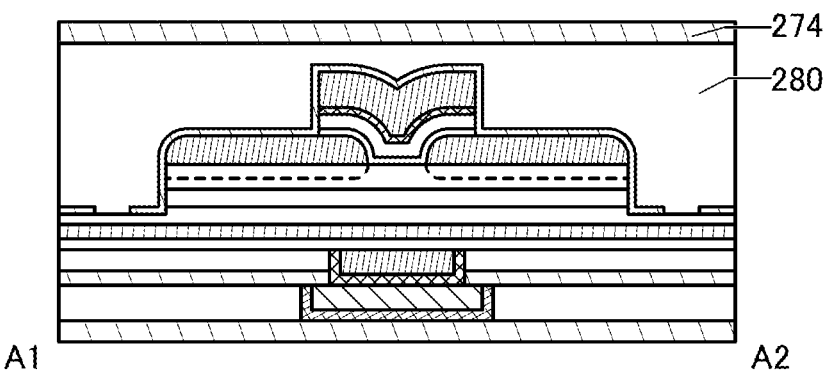

FIG. 16A
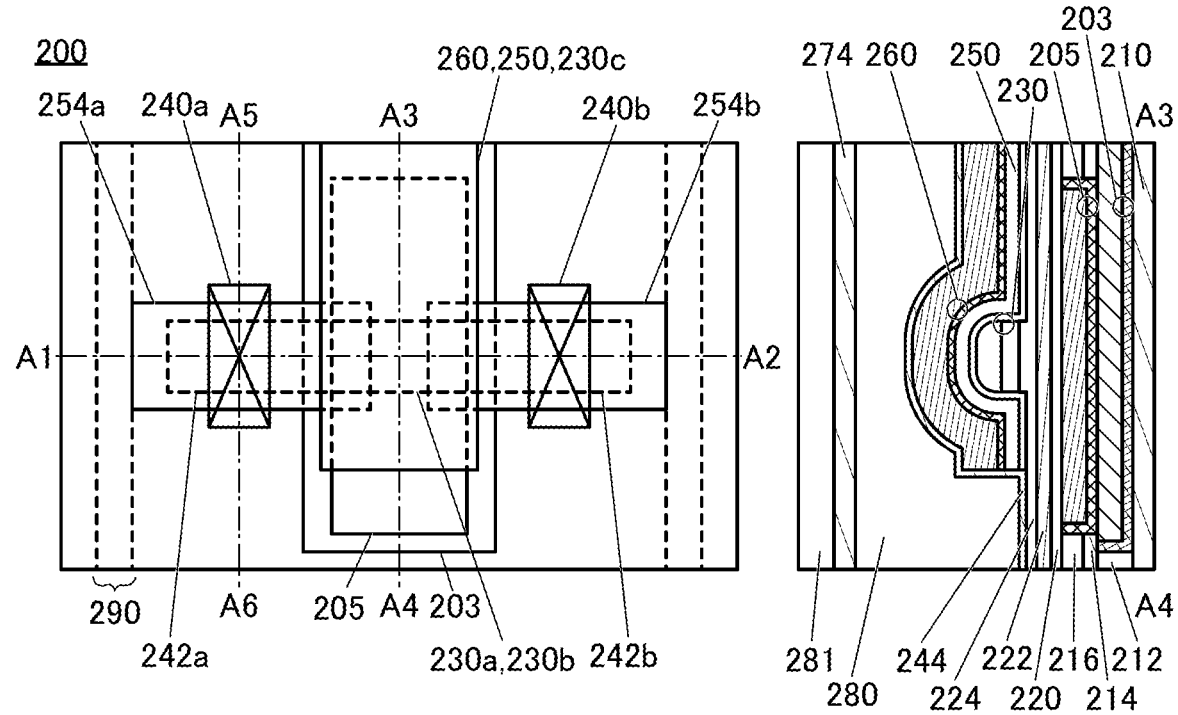
FIG. 16C
FIG. 16B
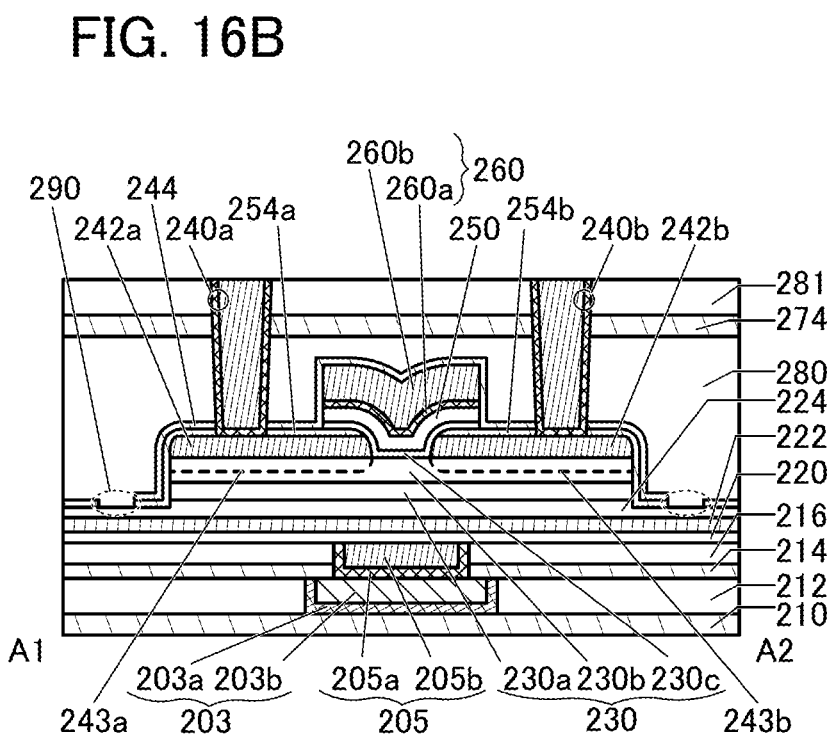

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2018/056414, filed on Aug. 24, 2018, which is incorporated by reference and which claims the benefit of foreign priority applications filed in Japan on Sep. 5, 2017, as Application No. 2017-170017, on Sep. 5, 2017, as Application No. 2017-170018, on Dec. 12, 2017, as Application No. 2017-237526, on Feb. 20, 2018, as Application No. 2018-027723, and on Feb. 20, 2018, as Application No. 2018-027691.

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed and an LSI, a processor such as a CPU (Central Processing Unit) and a GPU (Graphics Processing Unit), and a memory have been developed. A processor is an aggregation of semiconductor elements in which an electrode which is a connection terminal is formed, which includes a semiconductor integrated circuit (including at least a transistor and a memory) separated from a semiconductor wafer.

A semiconductor circuit (IC chip) of an LSI, a processor such as a CPU and a GPU, a memory, or the like is mounted on a circuit board, for example, a printed wiring board, to be used as one of components of a variety of electronic devices.

In addition, a technique for forming a transistor by using a semiconductor thin film formed over a substrate having an insulating surface has attracted attention. The transistor is applied to a wide range of electronic devices such as an integrated circuit (IC) and an image display device (also simply referred to as a display device). A silicon-based semiconductor material is widely known as a material for a semiconductor thin film that can be used in a transistor, and as another material, an oxide semiconductor has attracted attention.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1).

In recent years, demand for an integrated circuit in which transistors and the like are integrated with high density has risen with reductions in the size and weight of an electronic device. Furthermore, the productivity of a semiconductor device including an integrated circuit is required to be improved.

As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for manufacturing a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

PRIOR ART DOCUMENTS

Patent Documents

[Patent Document 1] Japanese Published Patent Application No. 2012-257187

Non-Patent Document

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device with favorable reliability. An object of one embodiment of the present invention is to provide a semiconductor device that can be miniaturized or highly integrated. An object of one embodiment of the present invention is to provide a semiconductor device having favorable electrical characteristics. An object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device in which power consumption can be reduced. An object of one embodiment of the present invention is to provide a novel semiconductor device.

Note that the descriptions of these objects do not disturb the existence of other objects. Note that one embodiment of the present invention does not necessarily achieve all of these objects. Objects other than these will be apparent from the description of the specification, the drawings, the claims, and the like, and objects other than these can be derived from the description of the specification, the drawings, the claims, and the like.

Means for Solving the Problems

One embodiment of the present invention is a semiconductor device characterized by including a first insulator; a second insulator positioned over the first insulator; an oxide positioned over the second insulator; a first conductor and a second conductor positioned apart from each other over the oxide; a third insulator positioned over the oxide, the first conductor, and the second conductor; a third conductor positioned over the third insulator and at least partly overlapping with a region between the first conductor and the second conductor; a fourth insulator positioned to cover the oxide, the first conductor, the second conductor, the third insulator, and the third conductor; a fifth insulator positioned over the fourth insulator; and a sixth insulator positioned over the fifth insulator. An opening reaching the second insulator is formed in at least part of the fourth insulator; the fifth insulator is in contact with the second insulator through the opening; and the first insulator, the fourth insulator, and the sixth insulator have a lower oxygen permeability than the second insulator.

In the above, the fourth insulator may be in contact with a side surface of the oxide, a side surface of the first conductor, a side surface of the second conductor, and a top surface of the second insulator. Moreover, in the above, the first insulator, the fourth insulator, and the sixth insulator may be oxides containing at least one of aluminum and hafnium.

In the above, a seventh insulator may be positioned between the second insulator, the oxide, and the first conductor and the third insulator and the fourth insulator; an eighth insulator may be positioned between the second insulator, the oxide, and the second conductor and the third insulator and the fourth insulator; and the seventh insulator and the eighth insulator may have a lower oxygen permeability than the second insulator. Moreover, in the above, a side surface of the seventh insulator or the eighth insulator may be substantially aligned with an edge of the opening formed in the fourth insulator. Furthermore, in the above, the seventh insulator and the eighth insulator may be oxides containing at least one of aluminum and hafnium.

In the above, the oxide may contain In and an element M (M is Al, Ga, Y, or Sn). Moreover, in the above, the oxide may contain Zn and an atomic ratio of Zn in the oxide may be smaller than an atomic ratio of In in the oxide. Furthermore, in the above, the oxide may have crystallinity.

In the above, the first conductor and the second conductor may include at least one of tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel.

Another embodiment of the present invention is a semiconductor device characterized by including a first insulator; a second insulator positioned over the first insulator; a first oxide positioned over the second insulator and including, in at least part of the first oxide, a region where the second insulator is exposed; a second oxide positioned over the first oxide and in contact with the second insulator via the region where the second insulator is exposed; a third oxide positioned over the second oxide; a first conductor and a second conductor positioned apart from each other over the third oxide; a third insulator positioned over the oxide, the first conductor, and the second conductor; a third conductor positioned over the third insulator and at least partly overlapping with a region between the first conductor and the second conductor; a fourth insulator positioned to cover the oxide, the first conductor, the second conductor, the third insulator, and the third conductor; a fifth insulator positioned over the fourth insulator; and a sixth insulator positioned over the fifth insulator. An opening reaching the second insulator is formed in at least part of the fourth insulator; the fifth insulator is in contact with the second insulator through the opening; the first insulator, the fourth insulator, and the sixth insulator have a lower oxygen permeability than the second insulator; and the first oxide has a lower oxygen permeability than the second oxide.

In the above, the first oxide to the third oxide may contain In, an element M (M is Al, Ga, Y, or Sn), and Zn; an atomic ratio of the element M in the first oxide may be larger than an atomic ratio of the element M in the second oxide; and an atomic ratio of In in the third oxide may be larger than an atomic ratio of In in the second oxide.

Another embodiment of the present invention is a method for manufacturing a semiconductor device, characterized by including depositing a first insulating film, a second insulating film, a first oxide film, a second oxide film, and a first conductive film in this order over a substrate; selectively removing part of the first oxide film, part of the second oxide film, and part of the first conductive film to form an oxide, a first conductor, and a second conductor over the second insulating film; depositing a third insulating film and a second conductive film in this order over the second insulating film, the oxide, the first conductor, and the second conductor; selectively removing part of the third insulating film and part of the second conductive film to form a first insulator and a third conductor; depositing a fourth insulating film by an ALD method to cover the oxide, the first conductor, the second conductor, the first insulator, and the third conductor; selectively removing part of the fourth insulating film to form an opening reaching the second insulating film in at least part of the fourth insulating film; depositing a fifth insulating film over the fourth insulating film; depositing a sixth insulating film over the fifth insulating film by a sputtering method in an oxygen-containing atmosphere; and performing heat treatment. The first insulating film, the fourth insulating film, and the sixth insulating film have a lower oxygen permittivity than the second insulating film.

One embodiment of the present invention is a method for manufacturing a semiconductor device, characterized by including depositing a first insulating film, a second insulating film, a first oxide film, a second oxide film, and a first conductive film in this order over a substrate; selectively removing part of the first oxide film, part of the second oxide film, and part of the first conductive film to form an oxide, a first conductor, and a second conductor over the second insulating film; depositing a third insulating film and a second conductive film in this order over the second insulating film, the oxide, the first conductor, and the second conductor; selectively removing part of the third insulating film and part of the second conductive film to form a first insulator and a third conductor; depositing a fourth insulating film by an ALD method to cover the oxide, the first conductor, the second conductor, the first insulator, and the third conductor; selectively removing part of the fourth insulating film to form an opening reaching the second insulating film in at least part of the fourth insulating film; depositing a fifth insulating film over the fourth insulating film; adding oxygen from above the fifth insulating film by an ion implantation method; depositing a sixth insulating film over the fifth insulating film by a sputtering method in an oxygen-containing atmosphere; and performing heat treatment. The first insulating film, the fourth insulating film, and the sixth insulating film have a lower oxygen permittivity than the second insulating film.

Another embodiment of the present invention is a method for manufacturing a semiconductor device, characterized by including depositing a first insulating film, a second insulating film, a first oxide film, a second oxide film, and a first conductive film in this order over a substrate; selectively removing part of the first oxide film, part of the second oxide film, and part of the first conductive film to form an oxide, a first conductor, and a second conductor over the second insulating film; depositing a third insulating film and a second conductive film in this order over the second insulating film, the oxide, the first conductor, and the second conductor; selectively removing part of the third insulating film and part of the second conductive film to form a first insulator and a third conductor; depositing a fourth insulating film by an ALD method to cover the oxide, the first conductor, the second conductor, the first insulator, and the third conductor; selectively removing part of the fourth insulating film to form an opening reaching the second insulating film in at least part of the fourth insulating film; depositing a fifth insulating film over the fourth insulating film; depositing a sixth insulating film over the fifth insulating film by a sputtering method in an oxygen-containing atmosphere; adding oxygen from above the sixth insulating film by an ion implantation method; and performing heat treatment. The first insulating film, the fourth insulating film, and the sixth insulating film have a lower oxygen permittivity than the second insulating film.

In the above, heat treatment may be performed before the third insulating film is deposited, and the third insulating film may be deposited without exposure to an air after the heat treatment.

The oxide film may be deposited by a sputtering method using a target containing In and an element M (M is Al, Ga, Y, or Sn). Moreover, in the above, the target may contain Zn, and an atomic ratio of Zn in the target may be smaller than an atomic ratio of In in the target. Furthermore, in the above, the deposition of the oxide film by sputtering may be performed while the substrate is heated in an oxygen-containing atmosphere.

In the above, the first insulating film, the fourth insulating film, and the sixth insulating film may be oxides containing at least one of aluminum and hafnium.

Effect of the Invention

According to one embodiment of the present invention, a semiconductor device with favorable reliability can be provided. According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with high productivity can be provided.

A semiconductor device capable of retaining data for a long time can be provided. A semiconductor device capable of high-speed data writing can be provided. A semiconductor device with high design flexibility can be provided. A semiconductor device in which power consumption can be reduced can be provided. A novel semiconductor device can be provided.

Note that the descriptions of these effects do not disturb the existence of other effects. Note that one embodiment of the present invention does not necessarily have all of these effects. Effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIGS. 12A to 12C A top view and cross-sectional views illustrating a method for manufacturing a semiconductor device of one embodiment of the present invention.

FIGS. 16A to 16C A top view and cross-sectional views of a semiconductor device of one embodiment of the present invention.

FIGS. 36A to 36F Diagrams illustrating electronic devices and a system of one embodiment of the present invention.

MODE FOR CARRYING OUT THE INVENTION

Figure 1A:
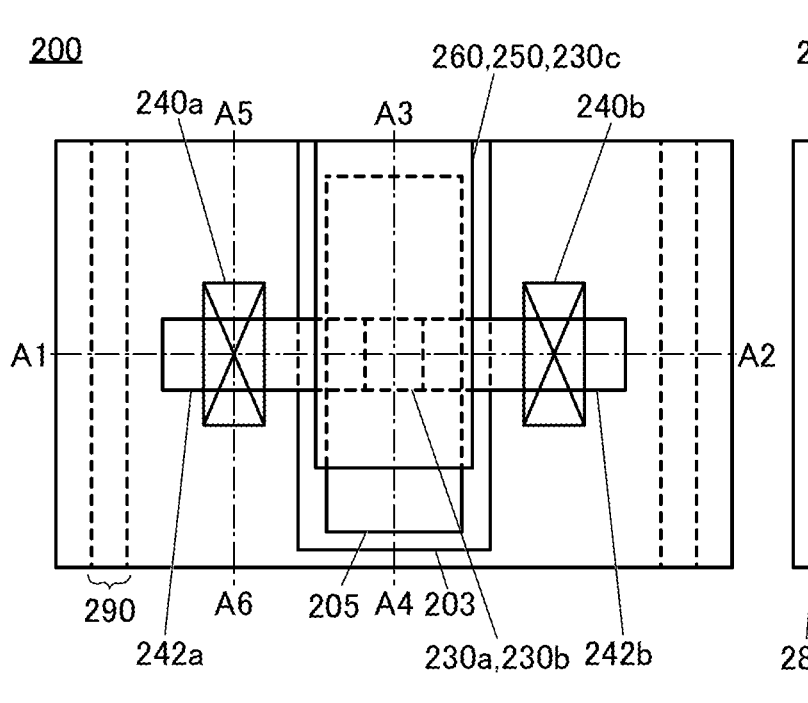
FIGS. 1A to 1C A top view and cross-sectional views of a semiconductor device of one embodiment of the present invention.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the scale. Note that the drawings are schematic views showing ideal examples, and embodiments of the present invention are not limited to shapes, values, or the like shown in the drawings. For example, in the actual manufacturing process, a layer, a resist mask, or the like might be unintentionally reduced in size by treatment such as etching, which is not reflected in the drawings in some cases for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is included in the drawings or the texts.

Here, X and Y denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

In an example of the case where X and Y are electrically connected, one or more elements that allow electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being in a conduction state (on state) or non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. Note that even if another circuit is interposed between X and Y, for example, X and Y are regarded as being functionally connected when a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor includes a region where a channel is formed between the drain (a drain terminal, a drain region, or a drain electrode) and the source (a source terminal, a source region, or a source electrode), and current can flow between the source and the drain through the region where a channel is formed. Note that in this specification and the like, a region where a channel is formed refers to a region through which current mainly flows.

Functions of a source and a drain might be switched when transistors having different polarities are employed or a direction of current is changed in circuit operation. Therefore, the terms "source" and "drain" can be interchanged with each other in this specification and the like in some cases.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other, or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is in an on state) and a gate electrode overlap with each other, or a region where a channel is formed. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

Thus, in this specification, an apparent channel width is referred to as a "surrounded channel width (SCW)" in some cases. Furthermore, in this specification, the simple term "channel width" refers to a surrounded channel width or an apparent channel width in some cases. Alternatively, in this specification, the simple term "channel width" refers to an effective channel width in some cases. Note that values of a channel length, a channel width, an effective channel width, an apparent channel width, a surrounded channel width, and the like can be determined, for example, by analyzing a cross-sectional TEM image and the like.

Note that an impurity in a semiconductor refers to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies are formed by entry of impurities, for example. Furthermore, in the case where the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, a silicon oxynitride film is a film in which oxygen content is higher than nitrogen content in its composition. A silicon oxynitride film refers to a film preferably containing, for example, oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Moreover, a silicon nitride oxide film is a film in which nitrogen content is higher than oxygen content in its composition. A silicon nitride oxide film refers to a film preferably containing, for example, nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

Furthermore, unless otherwise specified, transistors described in this specification and the like are field-effect transistors. Furthermore, unless otherwise specified, transistors described in this specification and the like are n-channel transistors. Thus, unless otherwise specified, the threshold voltage (also referred to as "$V_{th}$") is higher than 0 V.

In this specification and the like, the term "parallel" indicates a state where two straight lines are placed such that the angle formed therebetween is greater than or equal to −10° and less than or equal to 10°. Thus, the case where the angle is greater than or equal to −5° and less than or equal to 5° is also included. Furthermore, the term "substantially parallel" indicates a state where two straight lines are placed such that the angle formed therebetween is greater than or equal to −30° and less than or equal to 30°. Moreover, "perpendicular" indicates a state where two straight lines are placed such that the angle formed therebetween is greater than or equal to 80° and less than or equal to 100°. Thus, the case where the angle is greater than or equal to 85° and less than or equal to 95° is also included. In addition, "substantially perpendicular" indicates a state where two straight lines are placed such that the angle formed therebetween is greater than or equal to 60° and less than or equal to 120°.

Note that in this specification, a barrier film means a film having a function of inhibiting the passage of oxygen and impurities such as hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS FET or an OS transistor is stated, it can also be referred to as a transistor including an oxide or an oxide semiconductor.

In this specification and the like, the term of normally off means that current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

An example of a semiconductor device including a transistor 200 of one embodiment of the present invention is described below.

Structure Example of Semiconductor Device

Figure 1C:
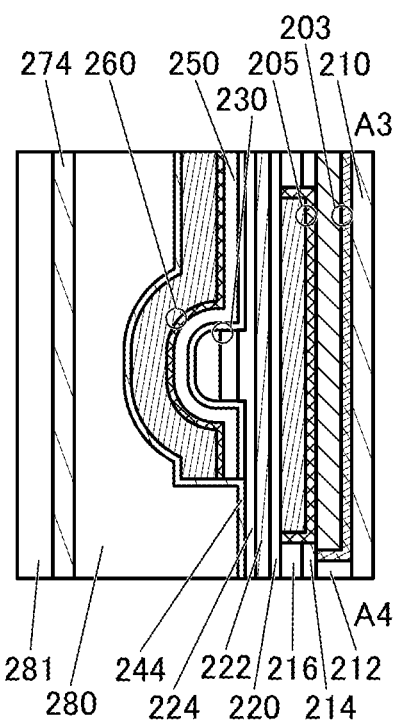
Figure 1B:
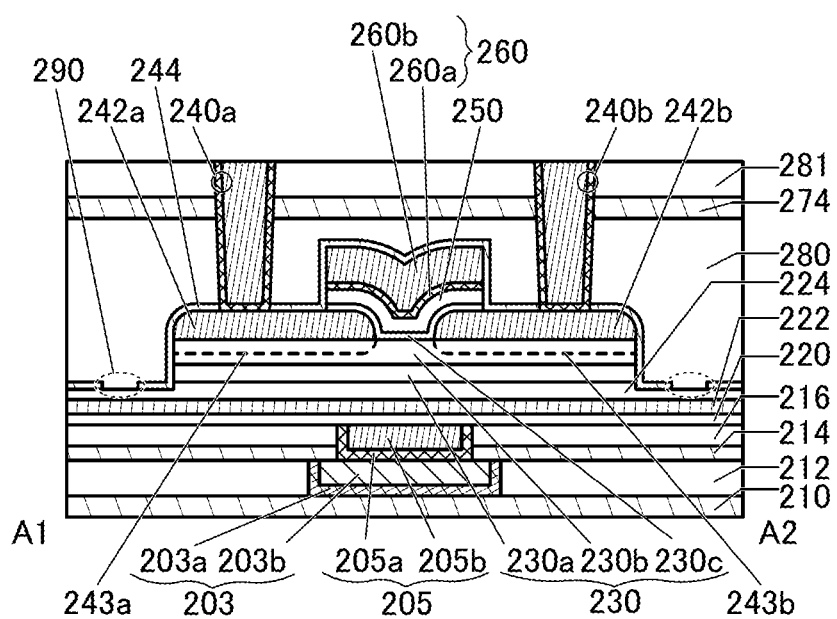

FIG. 1(A), FIG. 1(B), and FIG. 1(C) are a top view and cross-sectional views of the transistor 200 of one embodiment of the present invention and the periphery of the transistor 200.

FIG. 1(A) is a top view of the semiconductor device including the transistor 200. FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is also a cross-sectional view in the channel length direction of the transistor 200. FIG. 1(C) is a cross-sectional view of a portion indicated by a dashed-dotted line A3-A4 in FIG. 1(A), and is also a cross-sectional view in the channel width direction of the transistor 200. Note that for simplification of the drawing, some components are not illustrated in the top view in FIG. 1(A).

The semiconductor device of one embodiment of the present invention includes the transistor 200, and an insulator 210, an insulator 212, and an insulator 281 that function as interlayer films. The semiconductor device also includes a conductor 203 functioning as a wiring and conductors 240 (a conductor 240a and a conductor 240b) functioning as plugs; the conductor 203 and the conductors 240 are electrically connected to the transistor 200.

Note that in the conductor 203, a conductor 203a is formed in contact with an inner wall of an opening of the insulator 212, and a conductor 203b is formed on the inner side. Here, the top surface of the conductor 203 and the top surface of the insulator 212 can be substantially level with each other. Although the transistor 200 having a structure in which the conductor 203 has a stacked-layer structure of the conductor 203a and the conductor 203b is illustrated, the present invention is not limited thereto. The conductor 203 may be provided to have a single-layer structure or a stacked-layer structure of three or more layers, for example. In the case where a structure body has a stacked-layer structure, the layers may be distinguished by ordinal numbers given according to the formation order.

Moreover, in the conductor 240, a first conductor of the conductor 240 is formed in contact with an inner wall of an opening of an insulator 244, an insulator 280, an insulator 274, and the insulator 281, and a second conductor of the conductor 240 is formed on the inner side. Here, the top surface of the conductor 240 and the top surface of the insulator 281 can be substantially level with each other. Although the transistor 200 having a structure in which the first conductor of the conductor 240 and the second conductor of the conductor 240 are stacked is illustrated, the present invention is not limited thereto. The conductor 240 may be provided to have a single-layer structure or a stacked-layer structure of three or more layers, for example. In the case where a structure body has a stacked-layer structure, the layers may be distinguished by ordinal numbers given according to the formation order.

[Transistor 200]

As illustrated in FIG. 1, the transistor 200 includes an insulator 222 positioned over a substrate (not illustrated); an insulator 224 positioned over the insulator 222; an oxide 230 positioned over the insulator 224; a conductor 242a and a conductor 242b positioned apart from each other over the oxide 230; an insulator 250 positioned over the oxide 230, the conductor 242a, and the conductor 242b; a conductor 260 positioned over the insulator 250 and at least partly overlapping with a region between the conductor 242a and the conductor 242b; an insulator 244 positioned to cover the oxide 230, the conductor 242a, the conductor 242b, the insulator 250, and the conductor 260; the insulator 280 positioned over the insulator 244; and the insulator 274 positioned over the insulator 280.

Here, it is preferable that an opening 290 reaching the insulator 224 be formed in at least part of the insulator 244, and the insulator 280 be in contact with the insulator 224 through the opening 290.

Here, it is preferable that the insulator 222, the insulator 244, and the insulator 274 have a function of inhibiting diffusion of oxygen (e.g., at least one of an oxygen atom, an oxygen molecule, and the like) (that the insulator 222, the insulator 244, and the insulator 274 be less likely to transmit the above oxygen). For example, the insulator 222, the insulator 244, and the insulator 274 preferably have a lower oxygen permeability than the insulator 224 or the insulator 280.

The oxide 230 preferably includes an oxide 230a positioned over the insulator 224, an oxide 230b positioned over the oxide 230a, and an oxide 230c that is positioned over the oxide 230b, the conductor 242a, and the conductor 242b and is at least partly in contact with the oxide 230b.

The transistor 200 has, in the region where a channel is formed (hereinafter also referred to as a channel formation region) and its vicinity, a structure in which three layers of the oxide 230a, the oxide 230b, and the oxide 230c are stacked; however, the present invention is not limited thereto. For example, a structure may be employed in which a single-layer structure of the oxide 230b, a two-layer structure of the oxide 230b and the oxide 230a, a two-layer structure of the oxide 230b and the oxide 230c, or a stacked-layer structure of four or more layers is provided. Although the transistor 200 with a structure in which the conductor 260 has a stacked-layer structure of two layers is described, the present invention is not limited thereto. For example, the conductor 260 may have a single-layer structure or a stacked-layer structure of three or more layers.

Here, the conductor 260 functions as a gate electrode of the transistor and the conductor 242a and the conductor 242b function as a source electrode and a drain electrode. The conductor 260 preferably includes a region overlapping with the conductor 242a with the insulator 250 therebetween and a region overlapping with the conductor 242b with the insulator 250 therebetween. When the conductor 260 has such a shape, the conductor 260 can have a margin for alignment; thus, the conductor 260 can surely overlap with the region of the oxide 230 between the conductor 242a and the conductor 242b.

Note that as illustrated in FIG. 1, the conductor 260 preferably includes a conductor 260a and a conductor 260b positioned over the conductor 260a. Hereinafter, the conductor 242a and the conductor 242b are collectively referred to as a conductor 242, in some cases.

The transistor 200 preferably further includes an insulator 214 positioned over the substrate (not illustrated); an insulator 216 positioned over the insulator 214; a conductor 205 positioned to be embedded in the insulator 214 and the insulator 216; and an insulator 220 positioned over the insulator 216 and the conductor 205. Furthermore, the insulator 222 is preferably positioned over the insulator 220.

In the transistor 200, as the oxide 230 (the oxide 230a, the oxide 230b, and the oxide 230c), which includes a channel formation region, a metal oxide functioning as an oxide semiconductor (hereinafter also referred to as an oxide semiconductor) is preferably used.

The transistor 200 using an oxide semiconductor in a channel formation region has an extremely low leakage current in a non-conduction state; thus, a semiconductor device with low power consumption can be provided. An oxide semiconductor can be deposited by a sputtering method or the like, and thus can be used for the transistor 200 included in a highly integrated semiconductor device.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 230, an In—Ga oxide or an In—Zn oxide may be used.

Here, the oxide 230 might have increased carrier density to have reduced resistance when impurities such as hydrogen, nitrogen, and a metal element exist therein. Furthermore, the oxide 230 might have increased carrier density to have reduced resistance when the oxygen concentration thereof decreases.

A low-resistance region might be formed in part of the oxide 230 when the conductor 242 (the conductor 242a and the conductor 242b) that is provided over and in contact with the oxide 230 and functions as the source electrode and the drain electrode has a function of absorbing oxygen in the oxide 230 or a function of supplying an impurity such as hydrogen, nitrogen, or a metal element to the oxide 230.

Figure 2:
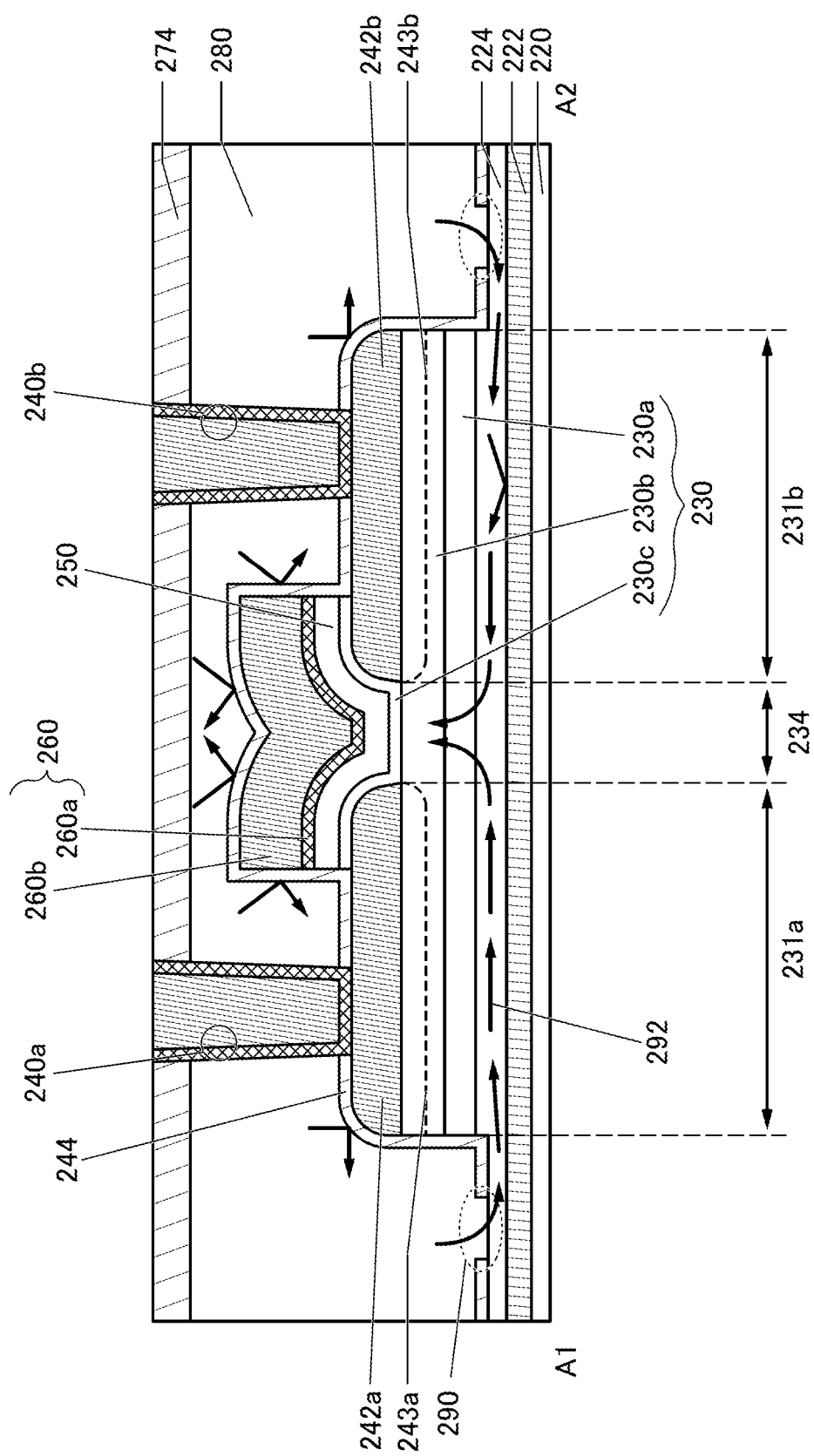
FIG. 2 A cross-sectional view of a semiconductor device of one embodiment of the present invention.

Here, FIG. 2 illustrates an enlarged view of part of FIG. 1(B). As illustrated in FIG. 2, the conductor 242 is provided over and in contact with the oxide 230, and a region 243 (a region 243a and a region 243b) is formed as a low-resistance region at and near the interface of the oxide 230 with the conductor 242. The oxide 230 includes a region 234 functioning as a channel formation region of the transistor 200 and a region 231 (a region 231a and a region 231b) including part of the region 243 and functioning as a source region or a drain region.

In the region 231 functioning as the source region or the drain region, particularly the region 243 has reduced resistance by having an increased carrier concentration due to a low oxygen concentration or contained impurities such as hydrogen, nitrogen, or a metal element. In other words, the region 231 has higher carrier density and lower resistance than the region 234. Furthermore, the region 234 functioning as the channel formation region is a high-resistance region with a low carrier density because it has a higher oxygen concentration or a lower impurity concentration than specifically the region 243 of the region 231.

Here, a transistor using an oxide semiconductor is likely to have its electrical characteristics changed when impurities and oxygen vacancies exist in a region of the oxide semiconductor where a channel is formed, which may affect the reliability. Moreover, if the region of the oxide semiconductor where a channel is formed includes oxygen vacancies, the transistor tends to have normally-on characteristics. Thus, oxygen vacancies in the region 234 where a channel is formed are preferably reduced as much as possible.

In order to inhibit a transistor from becoming normally on, an insulator including a region containing oxygen that is released by heating is provided in contact with the oxide 230, and the oxygen contained in the insulator may be diffused into the oxide 230 by heat treatment. For example, oxygen may be added to the insulator 280, and oxygen contained in the insulator 280 may be diffused by heat treatment. Thus, oxygen is supplied to the oxide 230 and the oxygen can reduce oxygen vacancies in the oxide 230, so that the transistor can be inhibited from becoming normally on.

On the other hand, when excess oxygen is supplied to the oxide 230, the structure of the excess oxygen in the oxide 230 might be changed by the stress such as a voltage or a high temperature. Thus, the transistor including the oxide 230 might have unstable electrical characteristics or lower reliability.

In this embodiment, as illustrated in FIG. 2, oxygen 292 is supplied through a diffusion path from the insulator 280 containing the oxygen 292 that is released by heating to the oxide 230 through the insulator 224. Accordingly, the amount of oxygen supplied to the oxide 230 is controlled to inhibit excessive supply of oxygen to the oxide 230.

As described above, since the insulator 244 is an insulator that is less likely to transmit oxygen, the oxygen 292 contained in the insulator 280 cannot directly enter the conductor 260, the insulator 250, and the oxide 230 through their top surfaces or side surfaces. Since the insulator 274 is also an insulator that is less likely to transmit oxygen, upward diffusion of the oxygen 292 contained in the insulator 280 is inhibited. Accordingly, as illustrated in FIG. 2, the oxygen 292 contained in the insulator 280 is supplied to the insulator 224 through the opening 290 of the insulator 244.

Furthermore, the oxygen 292 supplied to the insulator 224 is inhibited from being diffused downward by the insulator 222 which is less likely to transmit oxygen, and thus is being diffused into the oxide 230. In the above manner, the oxygen 292 is supplied to the region 234 functioning as the channel formation region of the oxide 230. Accordingly, oxygen vacancies in the oxide 230 can be reduced, so that the transistor can be inhibited from becoming normally on.

Note that, in the case where the region 243, which is a low-resistance region, contains a metal element, the region 243 preferably contains any one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum in addition to the metal element contained in the oxide 230.

Although the region 243 is formed near the interface of the oxide 230b with the conductor 242 in the thickness direction of the oxide 230b in FIG. 2, one embodiment of the present invention is not limited thereto. For example, the region 243 may have substantially the same thickness as the oxide 230b or may also be formed in the oxide 230a.

In the oxide 230, the boundaries between the regions are difficult to be clearly observed in some cases. The concentration of a metal element and an impurity element such as hydrogen and nitrogen, which is detected in each region, may be gradually changed (such a change is also referred to as gradation) not only between the regions but also in each region. That is, the region closer to the channel formation region preferably has a lower concentration of a metal element and an impurity element such as hydrogen and nitrogen.

To selectively reduce the resistance of the oxide 230, as the conductor 242, for example, a material that contains at least one of an impurity and metal elements that increase conductivity such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum is preferably used. Alternatively, the conductor 242 is formed using a material, a deposition method, or the like that injects impurities such as an element that forms oxygen vacancies or an element trapped by oxygen vacancies into the oxide 230. Examples of the element include hydrogen, boron, carbon, nitrogen, fluorine, phosphorus, sulfur, chlorine, and a rare gas element. Typical examples of the rare gas element are helium, neon, argon, krypton, and xenon.

An oxide semiconductor can be deposited by a sputtering method or the like, and thus can be used for a transistor included in a highly integrated semiconductor device. The transistor using an oxide semiconductor in a channel formation region has an extremely low leakage current (off-state current) in a non-conduction state; thus, a semiconductor device with low power consumption can be provided.

Accordingly, a semiconductor device including a transistor with a high on-state current can be provided. A semiconductor device including a transistor with a low off-state current can be provided. A semiconductor device that has reduced variation in electrical characteristics, stable electrical characteristics, and improved reliability can be provided.

The structure of the semiconductor device including the transistor 200 of one embodiment of the present invention is described in detail below.

The conductor 203 extends in the channel width direction as illustrated in FIG. 1(A) and FIG. 1(C) and functions as a wiring that applies a potential to the conductor 205. The conductor 203 is preferably provided to be embedded in the insulator 212.

The conductor 205 is positioned to overlap with the oxide 230 and the conductor 260. Moreover, the conductor 205 may be provided over and in contact with the conductor 203. Furthermore, the conductor 205 is preferably provided to be embedded in the insulator 214 and the insulator 216.

The conductor 260 sometimes functions as a first gate (also referred to as a top gate) electrode. The conductor 205 sometimes functions as a second gate (also referred to as a bottom gate) electrode. In that case, the $V_{th}$ of the transistor 200 can be controlled by changing a potential applied to the conductor 205 independently of a potential applied to the conductor 260. In particular, the $V_{th}$ of the transistor 200 can be higher than 0 V and the off-state current can be reduced by applying a negative potential to the conductor 205. Thus, a drain current when a potential applied to the conductor 260 is 0 V can be smaller in the case where a negative potential is applied to the conductor 205 than in the case where the negative potential is not applied to the conductor 205.

When the conductor 205 is provided over the conductor 203, the distance between the conductor 203 and the conductor 260 having functions of the first gate electrode and the wiring can be set as appropriate. That is, the insulator 214, the insulator 216, and the like are provided between the conductor 203 and the conductor 260, whereby the parasitic capacitance between the conductor 203 and the conductor 260 can be reduced, and the withstand voltage between the conductor 203 and the conductor 260 can be increased.

The reduction in the parasitic capacitance between the conductor 203 and the conductor 260 can improve the switching speed of the transistor 200, so that the transistor 200 can have high frequency characteristics. The increase in the withstand voltage between the conductor 203 and the conductor 260 can improve the reliability of the transistor 200. Therefore, the insulator 214 and the insulator 216 are preferably thick. Note that the extending direction of the conductor 203 is not limited thereto; for example, the conductor 203 may extend in the channel length direction of the transistor 200.

Note that as illustrated in FIG. 1(A), the conductor 205 is positioned to overlap with the oxide 230 and the conductor 260. The conductor 205 is preferably provided larger than the region 234 of the oxide 230. As illustrated in FIG. 1(C), it is particularly preferable that the conductor 205 extend to an outer region than an end portion of the region 234 of the oxide 230 that intersects with the channel width direction. That is, the conductor 205 and the conductor 260 preferably overlap with each other with the insulators therebetween on an outer side of the side surface of the oxide 230 in the channel width direction.

With the above structure, in the case where potentials are applied to the conductor 260 and the conductor 205, an electric field generated from the conductor 260 and an electric field generated from the conductor 205 are connected, so that the channel formation region formed in the oxide 230 can be covered.

That is, the channel formation region in the region 234 can be electrically surrounded by the electric field of the conductor 260 having a function of the first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

Note that in the conductor 205, a conductor 205a is formed in contact with an inner wall of an opening of the insulator 214 and the insulator 216, and a conductor 205b is formed on the inner side. Here, the top surfaces of the conductor 205a and the conductor 205b and the top surface of the insulator 216 can be substantially level with each other. Although the transistor 200 having a structure in which the conductor 205a and the conductor 205b are stacked is illustrated, the present invention is not limited thereto. The conductor 205 may be provided to have a single-layer structure or a stacked-layer structure of three or more layers, for example. In the case where a structure body has a stacked-layer structure, the layers may be distinguished by ordinal numbers given according to the formation order.

Here, for the conductor 205a or the conductor 203a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (or a conductive material through which the above impurities are less likely to pass). Alternatively, it is preferable to use a conductive material having a function of inhibiting diffusion of oxygen (e.g., at least one of an oxygen atom, an oxygen molecule, and the like) (or a conductive material through which the above oxygen is less likely to pass). Note that in this specification, a function of inhibiting diffusion of impurities or oxygen means a function of inhibiting diffusion of any one or all of the above impurities and the above oxygen.

When the conductor 205a or the conductor 203a has a function of inhibiting diffusion of oxygen, the conductivity of the conductor 205b or the conductor 203b can be inhibited from being lowered because of oxidation. As a conductive material having a function of inhibiting diffusion of oxygen, for example, tantalum, tantalum nitride, ruthenium, ruthenium oxide, or the like is preferably used. Thus, a single layer or a stacked layer of the above conductive material is used for the conductor 205a or the conductor 203a. Thus, impurities such as water and hydrogen can be inhibited from being diffused to the transistor 200 side through the conductor 203 and the conductor 205.

Moreover, a conductive material containing tungsten, copper, or aluminum as its main component is preferably used for the conductor 205b. Note that the conductor 205b is illustrated as a single layer but may have a stacked-layer structure, for example, a stacked layer of any of the above conductive materials and titanium or titanium nitride.

As the conductor 203b functioning as a wiring, a conductor having a higher conductivity than the conductor 205b is preferably used. For example, a conductive material containing copper or aluminum as its main component can be used. In addition, the conductor 203b may have a stacked-layer structure, for example, a stacked layer of any of the above conductive materials and titanium or titanium nitride.

It is particularly preferable to use copper for the conductor 203b. Copper is preferably used for a wiring and the like because of its small resistance. However, copper is easily diffused, and thus may deteriorate the electrical characteristics of the transistor 200 when diffused into the oxide 230. In view of the above, for example, a material through which copper is less likely to pass, such as aluminum oxide or hafnium oxide, is used for the insulator 214, whereby diffusion of copper can be inhibited.

Note that the conductor 205, the insulator 214, and the insulator 216 are not necessarily provided. In that case, part of the conductor 203 can function as the second gate electrode.

Each of the insulator 210 and the insulator 214 preferably functions as a barrier insulating film that inhibits impurities such as water or hydrogen from entering the transistor 200 from the substrate side. Accordingly, for the insulator 210 and the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (or an insulating material through which the above impurities are less likely to pass). Alternatively, it is preferable to use an insulating material having a function of inhibiting diffusion of oxygen (e.g., at least one of an oxygen atom, an oxygen molecule, and the like) (or an insulating material through which the above oxygen is less likely to pass).

For example, it is preferable that aluminum oxide or the like be used for the insulator 210 and that silicon nitride or the like be used for the insulator 214. Accordingly, impurities such as water and hydrogen can be inhibited from being diffused to the transistor 200 side from the substrate side of the insulator 210 and the insulator 214. Alternatively, oxygen contained in the insulator 224 or the like can be inhibited from being diffused to the substrate side of the insulator 210 and the insulator 214.

Furthermore, with the structure in which the conductor 205 is stacked over the conductor 203, the insulator 214 can be provided between the conductor 203 and the conductor 205. Here, even when a metal that is easily diffused, such as copper, is used for the conductor 203b, silicon nitride or the like provided as the insulator 214 can inhibit diffusion of the metal to a layer above the insulator 214.

The insulator 212, the insulator 216, the insulator 280, and the insulator 281 that function as interlayer films preferably have lower permittivity than the insulator 210 or the insulator 214. When a material with a low permittivity is used for an interlayer film, the parasitic capacitance generated between wirings can be reduced.

For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the insulator 212, the insulator 216, the insulator 280, and the insulator 281. Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

The insulator 220, the insulator 222, the insulator 224, and the insulator 250 each have a function of a gate insulator.

Here, it is preferable that oxygen be released from the insulator 224 in contact with the oxide 230 by heating. When such an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably $2.0 \times 10^{19}$ atoms/cm$^3$ or greater than or equal to $3.0 \times 10^{20}$ atoms/cm$^3$ in TDS (Thermal Desorption Spectroscopy) analysis. Note that the film surface temperature in the TDS analysis is preferably higher than or equal to 100° C. and lower than or equal to 700° C., or higher than or equal to 100° C. and lower than or equal to 400° C.

It is preferable that the insulator 222 have a function of inhibiting diffusion of oxygen (e.g., at least one of an oxygen atom, an oxygen molecule, and the like) (that the insulator 222 be less likely to transmit the above oxygen). For example, the insulator 222 preferably has a lower oxygen permeability than the insulator 224.

When the insulator 222 has a function of inhibiting diffusion of oxygen or impurities, oxygen contained in the oxide 230 is not diffused to the insulator 220 side, which is preferable. Furthermore, the conductor 205 can be inhibited from reacting with oxygen contained in the insulator 224 or the oxide 230.

It is particularly preferable to use an insulator containing an oxide of one or both of aluminum and hafnium, which is an insulating material having a function of inhibiting diffusion of impurities, oxygen, and the like (or an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and entry of impurities such as hydrogen from the periphery of the transistor 200 into the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

For example, a single layer or a stacked layer of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

It is preferable that the insulator 220 be thermally stable. For example, silicon oxide and silicon oxynitride, which are thermally stable, are preferable. In addition, combination of an insulator with a high-k material and silicon oxide or silicon oxynitride allows the insulator 220 to have a stacked-layer structure with thermal stability and a high relative permittivity.

Note that the insulator 220, the insulator 222, and the insulator 224 may each have a stacked-layer structure of two or more layers. In that case, without limitation to a stacked-layer structure formed of the same material, a stacked-layer structure formed of different materials may be employed. Alternatively, a structure in which the insulator 220 is not provided and only the insulator 222 and the insulator 224 are provided may be employed.

The oxide 230 includes the oxide 230a, the oxide 230b over the oxide 230a, and the oxide 230c over the oxide 230b. When the oxide 230a is provided under the oxide 230b, impurities can be inhibited from being diffused into the oxide 230b from the components formed below the oxide 230a. Moreover, when the oxide 230c is provided over the oxide 230b, impurities can be inhibited from being diffused into the oxide 230b from the components formed above the oxide 230c.

Note that the oxide 230 preferably has a stacked-layer structure of oxides which differ in the atomic ratio of metal elements. Specifically, the atomic proportion of the element M in constituent elements in the metal oxide used as the oxide 230a is preferably greater than the atomic proportion of the element M in constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

Although details are described later, when a weak Zn—O bond exists in the oxide 230, the stability of the transistor might be decreased. Therefore, it is preferable that the amount of Zn contained in the oxide 230, particularly in the oxide 230b be small. For example, the atomic ratio of Zn contained in the oxide 230b may be smaller than the atomic ratio of In contained in the oxide 230b.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; hence, the transistor 200 is stable with respect to high temperatures in the manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum is gradually varied at a junction region of the oxide 230a, the oxide 230b, and the oxide 230c. In other words, the energy level of the conduction band minimum at a junction region of each of the oxide 230a, the oxide 230b, and the oxide 230c is continuously varied or continuously connected. To obtain this, the densities of defect states in mixed layers formed at an interface between the oxide 230a and the oxide 230b and an interface between the oxide 230b and the oxide 230c are preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like is preferably used as the oxide 230a and the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current.

The oxide 230 includes the region 231 and the region 234. At least part of the region 231 includes a region in contact with the conductor 242.

When the transistor 200 is turned on, the region 231a or the region 231b functions as the source region or the drain region. At least part of the region 234 functions as a region where a channel is formed. In addition, a region functioning as the junction region may be provided between the region 231 and the region 234.

That is, through appropriate selection of the areas of the regions, a transistor having electrical characteristics necessary for a circuit design can be easily provided.

As the oxide 230, a metal oxide functioning as an oxide semiconductor is preferably used. For example, as a metal oxide to be the region 234, a metal oxide having a band gap of 2 eV or more, preferably 2.5 eV or more, is preferably used. With the use of a metal oxide having such a wide band gap, the off-state current of the transistor can be reduced.

A transistor using an oxide semiconductor has an extremely low off-state leakage current; thus, a semiconductor device with low power consumption can be provided. An oxide semiconductor can be deposited by a sputtering method or the like, and thus can be used for a transistor included in a highly integrated semiconductor device.

The conductor 242 (the conductor 242a and the conductor 242b) functioning as the source electrode and the drain electrode is provided over the oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the oxide 230, the oxygen concentration in the region 243 sometimes decreases. In addition, a metal compound layer that contains the metal contained in the conductor 242 and the component of the oxide 230 is sometimes formed in the region 243. In such a case, the region 243 has increased carrier density and the region 243 becomes a low-resistance region.

Here, the region between the conductor 242a and the conductor 242b is formed to overlap with the opening of the insulator 280. In this manner, the conductor 260 can be positioned between the conductor 242a and the conductor 242b in a self-aligned manner.

The insulator 250 functions as a gate insulator. The insulator 250 is preferably positioned in contact with the inner side (the top surface and the side surface) of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen contained in the insulator 250 is preferably lowered. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential that is applied during operation of the transistor can be reduced while the physical thickness of the gate insulator is kept. In addition, the equivalent oxide thickness (EOT) of an insulator functioning as the gate insulator can be reduced.

Specifically, a metal oxide containing one or more kinds selected from hafnium, aluminum, gallium, yttrium, zirconium, tungsten, titanium, tantalum, nickel, germanium, magnesium, and the like can be used.

It is particularly preferable to use an insulator containing an oxide of one or both of aluminum and hafnium such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by a thermal budget through the following process. Note that the metal oxide is not an essential component. Design is appropriately set in consideration of required transistor characteristics.

Although the conductor 260 functioning as the first gate electrode has a two-layer structure in FIG. 1, a single-layer structure or a stacked-layer structure of three or more layers may be employed.

For the conductor 260a, like the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. As the conductor 260 also functioning as a wiring, a conductor having high conductivity is preferably used. For example, a conductive material containing tungsten, copper, or aluminum as its main component can be used. In addition, the conductor 260b may have a stacked-layer structure, for example, a stacked-layer structure of any of the above conductive materials and titanium or titanium nitride.

In the case where the conductor 205 extends to an outer region than the end portion of the oxide 230 that intersects with the channel width direction as illustrated in FIG. 1(C), the conductor 260 preferably overlaps with the conductor 205 with the insulator 250 therebetween in the region. That is, a stacked-layer structure of the conductor 205, the insulator 250, and the conductor 260 is preferably formed outside the side surface of the oxide 230.

With the above structure, in the case where potentials are applied to the conductor 260 and the conductor 205, an electric field generated from the conductor 260 and an electric field generated from the conductor 205 are connected, so that the channel formation region formed in the oxide 230 can be covered.

That is, the channel formation region in the region 234 can be electrically surrounded by the electric field of the conductor 260 having a function of the first gate electrode and the electric field of the conductor 205 having a function of the second gate electrode.

The insulator 244 is preferably in contact with the side surface of the oxide 230, a side surface of the conductor 242, a side surface of the insulator 250, a top surface and a side surface of the conductor 260, and a top surface of the insulator 224. The opening 290 reaching the insulator 224 is formed in at least part of the insulator 244.

The opening 290 may be provided to have a slit-like shape extending in the channel width direction on the outside of both of the side surfaces of the transistor 200 as illustrated in FIG. 1(A). The slit may extend in the A3-A4 direction to be shared by a plurality of transistors arranged in the direction, or the opening 290 having a slit-like shape may be provided for each transistor. The shape of the opening 290 is not limited to a slit-like shape. One or more openings 290 having a circular shape, a rectangular shape, or a polygonal shape may be provided for each transistor. The opening 290 may be provided to surround the oxide 230. For example, a lattice-shape opening 290 may be provided. In that case, a structure in which one or more transistors 200 are surrounded by the lattice-shape opening 290 is preferable.

For example, it is preferable that the insulator 244 have a function of inhibiting diffusion of oxygen (e.g., at least one of an oxygen atom, an oxygen molecule, and the like) (that the insulator 244 be less likely to transmit the above oxygen). For example, the insulator 244 preferably has a lower oxygen permeability than the insulator 224. An insulator containing an oxide of one or both of aluminum and hafnium is preferably deposited as the insulator 244. Note that as the insulator containing an oxide of one or both of aluminum and hafnium, aluminum oxide, hafnium oxide, an oxide containing aluminum and hafnium (hafnium aluminate), or the like is preferably used. In particular, hafnium aluminate has higher heat resistance than a hafnium oxide film. Therefore, hafnium aluminate is preferable since it is less likely to be crystallized by a thermal budget through the following process.

The insulator 244 is preferably deposited by an ALD method. An ALD method is a deposition method having excellent step coverage, and thus can prevent formation of disconnection or the like in the insulator 244 due to unevenness of the formation surface.

With such an insulator 244, oxygen added to the insulator 280 can be inhibited from directly entering the conductor 260, the insulator 250, and the oxide 230, and the oxygen can be diffused into the insulator 224 through the opening 290. That is, the diffusion path of oxygen supplied to the oxide 230 can be limited to a diffusion path from the insulator 280 through the opening 290.

Here, the area of the opening 290 corresponds to the contact area between the insulator 224 and the insulator 280, and the larger the area of the opening 290 is, the larger the contact area between the insulator 244 and the insulator 280 is. That is, the path through which oxygen contained in the insulator 280 is diffused into the insulator 224 is widened. In order to supply more oxygen to the oxide 230, the area of the opening 290 may be increased, and in the case where the amount of oxygen supplied to the oxide 230 is desired to be limited, the area of the opening 290 may be reduced. Appropriate setting of the area of the opening 290 can control the amount of oxygen supplied to the oxide 230.

The insulator 280 is provided over the insulator 224, the oxide 230, the conductor 242, the insulator 250, and the conductor 260 with the insulator 244 therebetween. Furthermore, the insulator 280 is in contact with the insulator 224 through the opening 290 formed in the insulator 244. The insulator 280 preferably includes a region containing oxygen that is released by heating. For example, as the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which are thermally stable, are preferable. Materials such as silicon oxide, silicon oxynitride, and porous silicon oxide, in each of which a region containing oxygen that is released by heating can be easily formed, are particularly preferable.

As described above, the insulator 280 preferably includes a region containing oxygen that is released by heating. When the insulator 280 from which oxygen is released by heating is provided in contact with the insulator 224, oxygen in the insulator 280 can be efficiently supplied to the region 234 of the oxide 230 through the insulator 224. Note that the concentration of impurities such as water or hydrogen contained in the insulator 280 is preferably lowered.

A top surface of the insulator 280 may be planarized.

It is preferable that the insulator 274 have a function of inhibiting diffusion of oxygen (e.g., at least one of an oxygen atom, an oxygen molecule, and the like) (that the insulator 274 be less likely to transmit the above oxygen). For example, the insulator 274 preferably has a lower oxygen permeability than the insulator 224.

The insulator 274 is preferably provided in contact with the top surface of the insulator 280. When the insulator 274 is deposited in an oxygen-containing atmosphere by a sputtering method, a region containing oxygen that is released by heating can be provided in the insulator 280. Accordingly, oxygen can be supplied from the region to the oxide 230 through the insulator 224. Here, the insulator 274 having a function of inhibiting diffusion of oxygen can prevent oxygen contained in the insulator 280 from being diffused to the insulator 281 side, which is preferable.

For example, a metal oxide containing one or more kinds selected from hafnium, aluminum, gallium, yttrium, zirconium, tungsten, titanium, tantalum, nickel, germanium, magnesium, and the like can be used as the insulator 274. It is particularly preferable to use an insulator containing an oxide of one or both of aluminum and hafnium such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by a thermal budget through the following process.

In particular, aluminum oxide has a high barrier property, and even a thin film having a thickness of greater than or equal to 0.5 nm and less than or equal to 3.0 nm can inhibit diffusion of hydrogen and nitrogen. Accordingly, aluminum oxide deposited by a sputtering method can also function as a barrier film against impurities such as hydrogen. For example, when aluminum oxide deposited by a sputtering method is used for the insulator 274, the insulator 274 can supply oxygen to the insulator 280 and inhibit entry of impurities such as hydrogen from above the insulator 274 into the insulator 280 side.

The insulator 281 functioning as an interlayer film is preferably provided over the insulator 274. As in the insulator 224 or the like, the concentration of impurities such as water or hydrogen contained in the film of the insulator 281 is preferably lowered.

The conductor 240a and the conductor 240b are positioned in the openings formed in the insulator 281, the insulator 274, the insulator 280, and the insulator 244. The conductor 240a and the conductor 240b are positioned to face each other with the conductor 260 interposed therebetween. Note that the level of the top surfaces of the conductor 240a and the conductor 240b may be on the same surface as the top surface of the insulator 281.

The first conductor of the conductor 240a is formed in contact with the inner wall of the opening of the insulator 281, the insulator 274, the insulator 280, and the insulator 244. The conductor 242a is located on at least part of the bottom portion of the opening, and thus the conductor 240a is in contact with the conductor 242a. Similarly, the first conductor of the conductor 240b is formed in contact with the inner wall of the opening of the insulator 281, the insulator 274, the insulator 280, and the insulator 244. The conductor 242b is located on at least part of the bottom portion of the opening, and thus the conductor 240b is in contact with the conductor 242b.

Figure 3A:
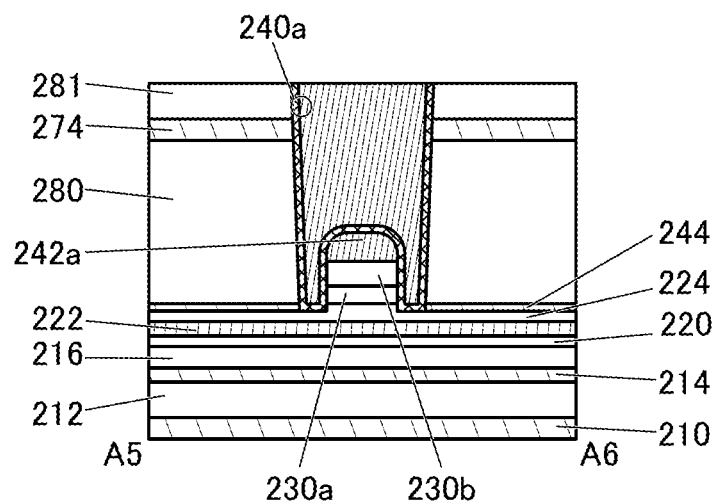
FIGS. 3A and 3B Cross-sectional views of a semiconductor device of one embodiment of the present invention.

Here, FIG. 3(A) illustrates a cross-sectional view of a portion indicated by a dashed-dotted line A5-A6 in FIG. 1(A), that is, the source region or the drain region of the transistor 200. As illustrated in FIG. 3, it is preferable that the conductor 240a (the conductor 240b) be in contact with at least the top surface and the side surface of the conductor 242a (the conductor 242b) and also in contact with the side surface of the oxide 230b and the side surface of the oxide 230a. It is particularly preferable that the conductor 240a (the conductor 240b) be in contact with one or both of the side surface of the oxide 230 on the A5 side and the side surface of the oxide 230 on the A6 side, which intersect with the channel width direction of the oxide 230. Alternatively, a structure may be employed in which the conductor 240a (the conductor 240b) is in contact with the side surface on the A1 side (the A2 side), which intersects with the channel length direction of the oxide 230. When the conductor 240a and the conductor 240b are in contact with not only the top surface and the side surface of the conductor 242a (the conductor 242b) but also the side surface of the oxide 230b and the side surface of the oxide 230a in this manner, the area of a portion where the conductor 240a (the conductor 240b) and the conductor 242a (the conductor 242b) are in contact with each other can be increased without an increase in the area of the top surface of the contact portion, so that the contact resistance between the conductor 240a (the conductor 240b) and the conductor 242a (the conductor 242b) can be reduced. Thus, miniaturization of the source electrode and the drain electrode of the transistor can be achieved and, in addition, the on-state current can be increased.

Figure 3B:
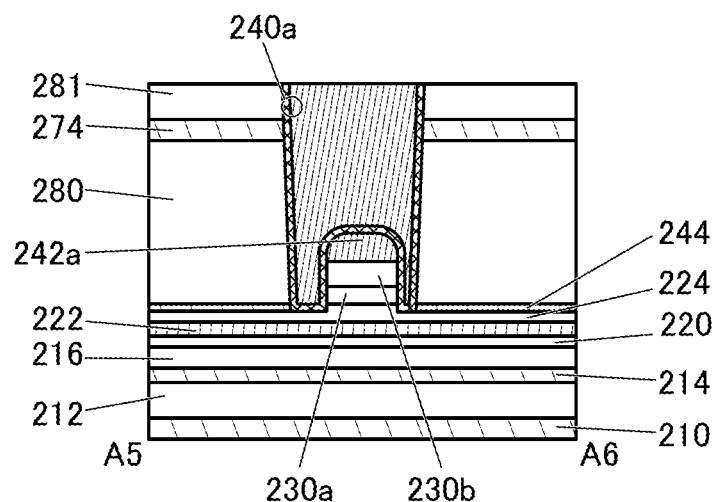

FIG. 3(B) illustrates an example of the case where a mask used in the lithography method for forming the opening exposing part of the conductor 242a (the conductor 242b) is misaligned in the A5 direction. The opening with a larger width than the widths of the conductor 242a (the conductor 242b), the oxide 230b, and the oxide 230a in the channel width direction can allow the conductor 240a (the conductor 240b) to be in contact with the top surface and side surface of the conductor 242a (the conductor 242b), the side surface of the oxide 230b, and the side surface of the oxide 230a even when misalignment occurs; thus, favorable contact is obtained.

For the conductor 240a and the conductor 240b, a conductive material containing tungsten, copper, or aluminum as its main component is preferably used. In addition, the conductor 240a and the conductor 240b may have a stacked-layer structure.

In the case where the conductor 240 has a stacked-layer structure, a conductive material having a function of inhibiting the passage of impurities such as water or hydrogen is preferably used for a conductor in contact with the oxide 230a, the oxide 230b, the conductor 242, the insulator 244, the insulator 280, the insulator 274, and the insulator 281, as in the conductor 205a or the like. For example, tantalum, tantalum nitride, titanium, titanium nitride, ruthenium, ruthenium oxide, or the like is preferably used. A single layer or a stacked layer of the conductive material having a function of inhibiting the passage of impurities such as water or hydrogen may be used. The use of the conductive material can prevent oxygen added to the insulator 280 from being absorbed by the conductor 240a and the conductor 240b. Moreover, impurities such as water or hydrogen can be inhibited from entering the oxide 230 through the conductor 240a and the conductor 240b from a layer above the insulator 281.

An insulator similar to the insulator 244 may be provided to cover the inner walls of the openings in which the conductor 240a and the conductor 240b are provided. In this manner, oxygen added to the insulator 280 can be prevented from being absorbed by the conductor 240a and the conductor 240b. In addition, impurities such as water or hydrogen can be inhibited from entering the oxide 230 through the conductor 240a and the conductor 240b from the insulator 280 or the like.

Although not illustrated, a conductor functioning as a wiring may be positioned in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride. Note that like the conductor 203 or the like, the conductor may be formed to be embedded in an opening provided in an insulator.

<Constituent Material for Semiconductor Device>

Constituent materials that can be used for the semiconductor device will be described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is formed over a non-flexible substrate and then the transistor is separated from the non-flexible substrate and transferred to the substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced, for example. That is, a durable semiconductor device can be provided.

For the substrate that is a flexible substrate, for example, a metal, an alloy, a resin, glass, or fiber thereof can be used. As the substrate, a sheet, a film, a foil or the like that contains a fiber may also be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (nylon, aramid, or the like), polyimide, polycarbonate, and acrylic. In particular, aramid is suitable for the substrate that is a flexible substrate because of its low coefficient of linear expansion.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. In contrast, when a material with a low relative permittivity is used for the insulator functioning as an interlayer film, the parasitic capacitance generated between wirings can be reduced. Accordingly, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure, which is thermally stable and has a low relative permittivity, can be obtained by combination with a resin, for example. Examples of the resin include polyester, polyolefin, polyamide (nylon, aramid, or the like), polyimide, polycarbonate, and acrylic. Furthermore, a stacked-layer structure, which is thermally stable and has a high relative permittivity, can be obtained by combination of silicon oxide and silicon oxynitride with an insulator having a high relative permittivity, for example.

In addition, when a transistor using an oxide semiconductor is surrounded by an insulator having a function of inhibiting the passage of oxygen and impurities such as hydrogen, the transistor can have stable electrical characteristics.

As the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one or more kinds selected from hafnium, aluminum, gallium, yttrium, zirconium, tungsten, titanium, tantalum, nickel, germanium, magnesium, and the like can be used as the insulator 274. Moreover, a nitride of silicon or a nitride of silicon containing oxygen, that is, silicon nitride, silicon nitride oxide, or the like can be used.

In particular, aluminum oxide has a high barrier property, and even a thin film having a thickness of greater than or equal to 0.5 nm and less than or equal to 3.0 nm can inhibit diffusion of hydrogen and nitrogen. Although hafnium oxide has a lower barrier property than aluminum oxide, the barrier property can be increased with an increase in the thickness. Therefore, the appropriate addition amount of hydrogen and nitrogen can be adjusted by adjustment of the thickness of hafnium oxide.

For example, the insulator 224 functioning as the gate insulator is preferably an insulator including a region containing oxygen that is released by heating. When a structure is employed in which silicon oxide or silicon oxynitride including a region containing oxygen that is released by heating is in contact with the oxide 230, oxygen vacancies included in the oxide 230 can be compensated for.

For example, an insulator containing an oxide of one or more kinds of aluminum, hafnium, and gallium can be used as the insulator 222, which functions as part of the gate insulator. In particular, as the insulator containing an oxide of one or both of aluminum and hafnium, aluminum oxide, hafnium oxide, an oxide containing aluminum and hafnium (hafnium aluminate), or the like is preferably used.

For example, silicon oxide or silicon oxynitride, which is thermally stable, is preferably used for the insulator 220. When the gate insulator has a stacked-layer structure of a thermally stable film and a film with a high relative permittivity, the equivalent oxide thickness (EOT) of the gate insulator can be reduced while the physical thickness thereof is kept.

With the above stacked-layer structure, on-state current can be increased without a reduction in the influence of the electric field from the gate electrode. Since the distance between the gate electrode and the region where a channel is formed is kept by the physical thickness of the gate insulator, leakage current between the gate electrode and the channel formation region can be inhibited.

The insulator 212, the insulator 216, the insulator 280, and the insulator 281 preferably include an insulator with a low relative permittivity. For example, the insulator 212, the insulator 216, the insulator 280, and the insulator 281 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 212, the insulator 216, the insulator 280, and the insulator 281 preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which are thermally stable, is combined with a resin, the stacked-layer structure can be thermally stable and have a low relative permittivity. Examples of the resin include polyester, polyolefin, polyamide (nylon, aramid, or the like), polyimide, polycarbonate, and acrylic.

As the insulator 210, the insulator 214, the insulator 244, and the insulator 274, an insulator having a function of inhibiting the passage of oxygen and impurities such as hydrogen may be used. For the insulator 210, the insulator 214, the insulator 244, and the insulator 274, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be trapped in some cases. Alternatively, hydrogen entering from an external insulator or the like can be trapped in some cases.

For the conductor 260, the conductor 203, the conductor 205, the conductor 242, and the conductor 240, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

<<Metal Oxide>>

As the oxide 230, a metal oxide functioning as an oxide semiconductor is preferably used. A metal oxide that can be used as the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Structure of Metal Oxide]

Oxide semiconductors (metal oxides) are classified into a single-crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as a grain boundary) is difficult to observe even near distortion in the CAAC-OS. That is, formation of a crystal grain boundary is inhibited due to the distortion of lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (oxygen vacancies (also referred to as $V_O$) or the like). Thus, a metal oxide including a CAAC-OS is physically stable. Therefore, the metal oxide including a CAAC-OS is resistant to heat and has high reliability.

Here, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) in the neighborhood of 31° in some cases. This peak is assigned to the (009) plane of the $InGaZnO_4$ crystal, which indicates that crystals in the CAAC-OS have c-axis alignment, and that the c-axes face in a direction substantially perpendicular to the formation surface or the top surface.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) appears in some cases. This diffraction pattern includes spots derived from the (009) plane of the $InGaZnO_4$ crystal. Thus, the electron diffraction also indicates that crystals included in the CAAC-OS have c-axis alignment, and that the c-axes face in a direction substantially perpendicular to the formation surface or the top surface. Meanwhile, a ring-like diffraction pattern is shown when an electron beam with a probe diameter of 300 nm is incident on the same sample in a direction perpendicular to the sample surface. Thus, the electron diffraction also indicates that the a-axes and b-axes of the crystals included in the CAAC-OS do not have regular alignment.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that an indium-gallium-zinc oxide (hereinafter, IGZO) that is a kind of a metal oxide containing indium, gallium, and zinc has a stable structure in some cases by being formed of the above-described nanocrystals. In particular, crystals of IGZO tend not to grow in the air and thus, a stable structure is obtained in some cases when IGZO is formed of smaller crystals (e.g., the above-described nanocrystals) rather than larger crystals (here, several-millimeter crystals or several-centimeter crystals).

The a-like OS is a metal oxide having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor (a metal oxide) can have various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Composition of Metal Oxide]

The composition of a CAC (Cloud-Aligned Composite)-OS that can be used for a transistor disclosed in one embodiment of the present invention will be described below.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a semiconductor layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers flow also in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Transistor Including Metal Oxide]

Next, the case where the above metal oxide is used for a channel formation region of a transistor will be described.

Note that when the above metal oxide is used for a channel formation region of a transistor, the transistor having high field-effect mobility can be achieved. In addition, the transistor having high reliability can be achieved.

Here, an example of the hypothesis about electric conduction of a metal oxide is described.

Electric conduction in a solid is inhibited by a scattering source called a scattering center. For example, it is known that in the case of single crystal silicon, lattice scattering and ionized impurity scattering are main scattering centers. In other words, in the elemental state with few lattice defects and impurities, the carrier mobility is high because there is no factor that inhibits the electric conduction in the solid.

The above presumably applies to a metal oxide. For example, it is probable that a metal oxide containing less oxygen than that in the stoichiometric composition has many oxygen vacancies. Atoms existing around the oxygen vacancies are located in places shifted from those in the elemental state. This distortion due to the oxygen vacancies might become a scattering center.

Furthermore, excess oxygen exists in a metal oxide containing less oxygen than that in the stoichiometric composition, for example. Excess oxygen existing in a liberated state in the metal oxide becomes $O^-$ or $O^{2-}$ by receiving an electron. Excess oxygen that has become $O^-$ or $O^{2-}$ might be a scattering center.

According to the above, it is probable that in the case where the metal oxide has an elemental state containing oxygen in the stoichiometric composition, the carrier mobility is high.

Since crystals of an indium-gallium-zinc oxide (hereinafter, IGZO) that is a kind of a metal oxide containing indium, gallium, and zinc tend not to grow particularly in the air and thus, a stable structure is obtained in some cases when IGZO is formed of smaller crystals (e.g., the above-described nanocrystals) rather than larger crystals (here, several-millimeter crystals or several-centimeter crystal). This is probably because connection of small crystals, rather than formation of large crystals, leads to a reduction in distortion energy.

Note that in a region where small crystals are connected to each other, defects are formed in some cases to reduce the distortion energy of the region. Thus, when the distortion energy is reduced without formation of a defect in the region, the carrier mobility can be increased.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to disappear and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the concentration of impurities in the metal oxide. In addition, in order to reduce the concentration of impurities in the metal oxide, the impurity concentration in an adjacent film is also preferably reduced. Examples of impurities include hydrogen, nitrogen, an alkali metal, an alkaline earth metal, iron, nickel, and silicon.

As a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing cost is increased, and moreover, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity.

Thus, the thin film of CAAC-IGZO or the thin film of nc-IGZO is preferably used for a semiconductor of a transistor.

Non-Patent Document 6 shows that a transistor using a metal oxide has an extremely low leakage current in a non-conduction state; specifically, the off-state current per micrometer in the channel width of the transistor is of the order of yA/μm ($10^{-24}$ A/μm). For example, a low-power-consumption CPU utilizing a characteristic of a low leakage current of the transistor using a metal oxide is disclosed (see Non-Patent Document 7).

Furthermore, application of a transistor using a metal oxide to a display device utilizing the characteristic of a low leakage current of the transistor has been reported (see Non-Patent Document 8). In the display device, a displayed image is changed several tens of times per second. The number of times an image is changed per second is called a refresh rate. The refresh rate is also referred to as driving frequency. Such high-speed screen change that is hard to be recognized by human eyes is considered as a cause of eyestrain. Thus, it has been proposed that the refresh rate of the display device be lowered to reduce the number of image rewriting operations. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI that utilize the characteristic of a low leakage current of the transistor have been studied.

[Impurities]

Here, the influence of each impurity in the metal oxide will be described.

When silicon or carbon that is a Group 14 element is contained in the metal oxide, defect states are formed in the metal oxide. Thus, the concentration of silicon or carbon in the metal oxide and the concentration of silicon or carbon near an interface with the metal oxide (the concentration measured by secondary ion mass spectrometry (SIMS) are set to lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Furthermore, when containing nitrogen, the metal oxide easily becomes n-type by generation of electrons serving as carriers and an increase in carrier density. As a result, a transistor using a metal oxide containing nitrogen for its channel formation region is likely to have normally-on characteristics. Thus, nitrogen in the channel formation region of the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics.

Therefore, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used for a channel formation region of a transistor, stable electrical characteristics can be given.

[Effect of Vacuum Baking]

Here, a weak Zn—O bond in the metal oxide is described and an example of a method for reducing the number of oxygen atoms and zinc atoms which form the bond will be described.

In a transistor using a metal oxide, oxygen vacancies are given as an example of a defect which leads to poor electrical characteristics of the transistor. For example, the threshold voltage of a transistor using a metal oxide which includes oxygen vacancies tends to shift in the negative direction, and thus the transistor tends to have normally-on characteristics. This is because a donor caused by oxygen vacancies in the metal oxide is generated and the carrier concentration increases. The transistor having normally-on characteristics causes various problems where a malfunction is likely to occur when the transistor is in operation and power consumption is increased when the transistor is not in operation, for example.

Furthermore, there are problems where a thermal budget in the step of forming the connection wiring in fabricating a module causes degradation of the electrical characteristics of the transistor, such as variation in the threshold voltage and an increase in parasitic resistance, and an increase in variation in the electrical characteristics due to such degradation of the electrical characteristics. Such problems directly lead to a decrease in the manufacturing yield, and thus considering countermeasures is important. Furthermore, the electrical characteristics are also degraded through a stress test, which can evaluate a change in transistor characteristics by long-term use (a change over time) in a short time. The degradation of the electrical characteristics is presumably caused by oxygen vacancies in the metal oxide due to high temperature treatment performed in the process of a thermal budget or electrical stress applied during the stress test.

In the metal oxide, there is an oxygen atom which weakly bonds to a metal atom and thus is likely to form an oxygen vacancy. In particular, in the case where the metal oxide is an In—Ga—Zn oxide, a zinc atom and an oxygen atom are likely to form a weak bond (also referred to as a weak Zn—O bond). Here, the weak Zn—O bond means a bond generated between a zinc atom and an oxygen atom, which is weak enough to be broken by high temperature treatment performed in the process of a thermal budget or electrical stress applied during the stress test. When the weak Zn—O bond exists in the metal oxide, the bond is broken by a thermal budget or current stress, so that an oxygen vacancy is formed. The formation of the oxygen vacancy decreases the stability of the transistor such as resistance to a thermal budget or resistance to a stress test.

The bond generated between an oxygen atom bonded to two or more zinc atoms and the zinc atoms is the weak Zn—O bond in some cases. A zinc atom bonds to an oxygen atom more weakly than a gallium atom does. Thus, an oxygen atom bonded to two or more zinc atoms is likely to form a vacancy. That is, the bond generated between a zinc atom and an oxygen atom is presumably weaker than the bond between an oxygen atom and other metal.

It is supposed that the weak Zn—O bond is likely to be formed when impurities exist in the metal oxide. Examples of the impurities in the metal oxide include a water molecule and hydrogen. When a water molecule or hydrogen exists in the metal oxide, a hydrogen atom bonds to an oxygen atom in the metal oxide (also referred to as an OH bond) in some cases. In the case where the In—Ga—Zn oxide is a single crystal, an oxygen atom in the metal oxide is bonded to four metal atoms in the metal oxide. However, an oxygen atom bonded to the hydrogen atom is bonded to two or three metal atoms in some cases. When the number of metal atoms bonded to the oxygen atom is decreased, the oxygen atom is likely to form a vacancy. Note that when a zinc atom is bonded to an oxygen atom which forms an OH bond, the bond between the oxygen atom and the zinc atom is presumably weak.

The weak Zn—O bond is sometimes formed in a distortion existing in a region where a plurality of nanocrystals are connected. Although the shape of nanocrystals is basically a hexagon, a pentagonal lattice arrangement, a heptagonal lattice arrangement, or the like is included in the distortion. It is supposed that the weak Zn—O bond is formed in the distortion because the bond distances between atoms are not uniform therein.

It is also supposed that the weak Zn—O bond is likely to be formed in the case where the metal oxide has low crystallinity. In the case where the metal oxide has high crystallinity, a zinc atom in the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom easily forms a vacancy. That is, the bond generated between a zinc atom and an oxygen atom is presumably weaker than the bond generated in a single crystal.

The number of oxygen atoms and zinc atoms which form the weak Zn—O bonds is reduced, whereby formation of oxygen vacancies due to the thermal budget or the current stress can be inhibited, leading to an improvement in the stability of a transistor. Note that in the case where only the number of oxygen atoms which form the weak Zn—O bonds is reduced and the number of zinc atoms which form the weak Zn—O bonds is not reduced, a weak Zn—O bond is formed again in some cases when an oxygen atom is supplied to the vicinity of the zinc atom. Therefore, it is preferable to reduce the number of zinc atoms and oxygen atoms which form the weak Zn—O bonds.

As a method for reducing the number of oxygen atoms and zinc atoms which form the weak Zn—O bonds, a method in which vacuum baking is performed after the deposition of a metal oxide can be given. The vacuum baking refers to heat treatment performed under a vacuum atmosphere. A vacuum atmosphere is kept by evacuation with a turbo-molecular pump or the like. The pressure in the treatment chamber is preferably lower than or equal to $1 \times 10^{-2}$ Pa, preferably lower than or equal to $1 \times 10^{-3}$ Pa. The substrate temperature in the heat treatment is higher than or equal to 300° C., preferably higher than or equal to 400° C.

Performing the vacuum baking can reduce the number of oxygen atoms and zinc atoms which form the weak Zn—O bonds. Furthermore, since the metal oxide is heated by the vacuum baking, atoms in the metal oxide are rearranged after the number of oxygen atoms and zinc atoms which form the weak Zn—O bonds is reduced. As a result, the number of oxygen atoms each bonded to four metal atoms is increased. Accordingly, the number of oxygen atoms and zinc atoms which form the weak Zn—O bonds can be reduced, and a weak Zn—O bond can be inhibited from being formed again.

Furthermore, when impurities exist in the metal oxide, performing the vacuum baking can release water molecules or hydrogen in the metal oxide, so that the number of OH bonds can be reduced. When the number of OH bonds in the metal oxide is reduced, the proportion of the oxygen atoms each bonded to four metal atoms is increased. Furthermore, atoms in the metal oxide are rearranged when water molecules or hydrogen is released, so that the number of the oxygen atoms each bonded to four metal atoms is increased. Thus, a weak Zn—O bond can be inhibited from being formed again.

As described above, performing the vacuum baking after the deposition of the metal oxide can reduce the number of oxygen atoms and zinc atoms which form the weak Zn—O bonds. Thus, the stability of the transistor can be improved through the step. Furthermore, an improvement in the stability of the transistor increases the degree of freedom for selecting materials and formation methods.

<Method for Manufacturing Semiconductor Device>

Next, a method for manufacturing a semiconductor device including the transistor 200 of the present invention will be described with reference to FIG. 4 to FIG. 14. In FIG. 4 to FIG. 14, (A) of each drawing is a top view. Moreover, (B) of each drawing is a cross-sectional view corresponding to a portion indicated by a dashed-dotted line A1-A2 in (A), and is also a cross-sectional view in the channel length direction of the transistor 200. Furthermore, (C) of each drawing is a cross-sectional view corresponding to a portion indicated by a dashed-dotted line A3-A4 in (A), and is also a cross-sectional view in the channel width direction of the transistor 200. Note that for simplification of the drawing, some components are not illustrated in the top view in (A) of each drawing.

First, a substrate (not illustrated) is prepared, and the insulator 210 is deposited over the substrate. The insulator 210 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (transistor, capacitor, or the like), or the like included in a semiconductor device might be charged up by receiving charges from plasma. In that case, accumulated charges might break the wiring, electrode, element, or the like included in the semiconductor device. By contrast, such plasma damage is not caused in the case of using a thermal CVD method that does not use plasma, and thus the yield of a semiconductor device can be increased. In addition, a thermal CVD method does not cause plasma damage during deposition, so that a film with few defects can be obtained.

An ALD method is also a deposition method which enables less plasma damage to an object. An ALD method also does not cause plasma damage during deposition, so that a film with few defects can be obtained. Note that a precursor used in an ALD method sometimes contains impurities such as carbon. Thus, a film provided by an ALD method contains impurities such as carbon in a larger amount than a film provided by another deposition method, in some cases. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that are less likely to be influenced by the shape of an object and thus have favorable step coverage. In particular, an ALD method has excellent step coverage and excellent thickness uniformity, and thus is suitable for the case of covering a surface of an opening portion with a high aspect ratio, for example. On the other hand, an ALD method has a relatively low deposition rate, and thus is preferably used in combination with another deposition method with a high deposition rate such as a CVD method, in some cases.

A CVD method and an ALD method enable control of composition of a film to be obtained with a flow rate ratio of the source gases. For example, a CVD method and an ALD method enable deposition of a film with any composition depending on the flow rate ratio of the source gases. For another example, a CVD method and an ALD method enable deposition of a film whose composition is continuously changed, by changing the flow rate ratio of the source gases during the deposition. In the case of depositing while changing the flow rate ratio of the source gases, as compared with the case of depositing with the use of a plurality of deposition chambers, time taken for the deposition can be shortened because time taken for transfer and pressure adjustment is not required. Thus, productivity of semiconductor devices can be improved in some cases.

In this embodiment, for the insulator 210, aluminum oxide is deposited by a sputtering method. The insulator 210 may have a multilayer structure. For example, a structure may be employed in which aluminum oxide is deposited by a sputtering method and another aluminum oxide is deposited over the aluminum oxide by an ALD method. Alternatively, a structure may be employed in which aluminum oxide is deposited by an ALD method and another aluminum oxide is deposited over the aluminum oxide by a sputtering method.

Then, the insulator 212 is deposited over the insulator 210. The insulator 212 can be deposited by a sputtering method, a CVD method, an MBE method, a PLD method, an ALD method, or the like. In this embodiment, for the insulator 212, silicon oxide is deposited by a CVD method.

Then, an opening reaching the insulator 210 is formed in the insulator 212. Examples of the opening include a groove and a slit. In addition, a region where the opening is formed may be referred to as an opening portion. A wet etching method may be employed for the formation of the opening; however, a dry etching method is preferable for microfabrication. In addition, as the insulator 210, an insulator functioning as an etching stopper film when forming the opening by etching the insulator 212 is preferably selected. For example, in the case where a silicon oxide film is used as the insulator 212 in which the opening is to be formed, it is preferable to use a silicon nitride film, an aluminum oxide film, or a hafnium oxide film as the insulator 210, which is an insulating film functioning as an etching stopper film.

After the formation of the opening, a conductive film to be the conductor 203a is deposited. The conductive film preferably includes a conductor that has a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 203a can be deposited by a sputtering method, a CVD method, an MBE method, a PLD method, an ALD method, or the like.

In this embodiment, as the conductive film to be the conductor 203a, tantalum nitride or a film of tantalum nitride and titanium nitride stacked thereover is deposited by a sputtering method. With the use of such a metal nitride as the conductor 203a, even when a metal that is easy to diffuse, such as copper, is used for the conductor 203b described later, the metal can be inhibited from being diffused outward through the conductor 203a.

Next, a conductive film to be the conductor 203b is deposited over the conductive film to be the conductor 203a. The conductive film can be deposited by a sputtering method, a CVD method, an MBE method, a PLD method, an ALD method, or the like. In this embodiment, for the conductive film to be the conductor 203b, a low-resistance conductive material such as copper is deposited.

Next, CMP treatment is performed to remove part of the conductive film to be the conductor 203a and the conductive film to be the conductor 203b, so that the insulator 212 is exposed. As a result, the conductive film to be the conductor 203a and the conductive film to be the conductor 203b remain only in the opening portion. Thus, the conductor 203 including the conductor 203a and the conductor 203b, which has a planar top surface, can be formed (see FIG. 4). Note that the insulator 212 is partly removed by the CMP treatment in some cases.

Next, the insulator 214 is deposited over the insulator 212 and the conductor 203. The insulator 214 can be deposited by a sputtering method, a CVD method, an MBE method, a PLD method, an ALD method, or the like. In this embodiment, for the insulator 214, silicon nitride is deposited by a CVD method. As described here, an insulator through which copper is less likely to pass, such as silicon nitride, is used as the insulator 214; accordingly, even when a metal that is easy to diffuse, such as copper, is used for the conductor 203b and the like, the metal can be inhibited from being diffused into layers above the insulator 214.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide is deposited by a CVD method.

Next, an opening reaching the conductor 203 is formed in the insulator 214 and the insulator 216. A wet etching method may be employed for the formation of the opening; however, a dry etching method is preferable for microfabrication.

After the formation of the opening, a conductive film to be the conductor 205a is deposited. The conductive film preferably includes a conductive material that has a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, for the conductive film to be the conductor 205a, tantalum nitride is deposited by a sputtering method.

Next, a conductive film to be the conductor 205b is deposited over the conductive film to be the conductor 205a. The conductive film can be deposited by a sputtering method, a CVD method, an MBE method, a PLD method, an ALD method, or the like.

In this embodiment, for the conductive film to be the conductor 205b, titanium nitride is deposited by a CVD method and tungsten is deposited by a CVD method over the titanium nitride.

Next, CMP treatment is performed to remove part of the conductive film to be the conductor 205a and the conductive film to be the conductor 205b, so that the insulator 216 is exposed. As a result, the conductive films to be the conductor 205a and the conductor 205b remain only in the opening portion. Thus, the conductor 205 including the conductor 205a and the conductor 205b, which has a planar top surface, can be formed (see FIG. 4). Note that the insulator 216 is partly removed by the CMP treatment in some cases.

Next, the insulator 220 is deposited over the insulator 216 and the conductor 205. The insulator 220 can be deposited by a sputtering method, a CVD method, an MBE method, a PLD method, an ALD method, or the like. In this embodiment, for the insulator 220, silicon oxide is deposited by a CVD method.

Next, the insulator 222 is deposited over the insulator 220. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, the insulator 224 is deposited over the insulator 222. The insulator 224 can be deposited by a sputtering method, a CVD method, an MBE method, a PLD method, an ALD method, or the like. In this embodiment, for the insulator 224, silicon oxide is deposited by a CVD method.

Sequentially, heat treatment is preferably performed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere or an atmosphere containing an oxidizing gas at 10 ppm or more, 1% or more, or 10% or more. Moreover, the heat treatment may be performed under a reduced pressure. Alternatively, the heat treatment may be performed in such a manner that heat treatment is performed in a nitrogen or inert gas atmosphere, and then another heat treatment is performed in an atmosphere containing an oxidizing gas at 10 ppm or more, 1% or more, or 10% or more in order to compensate for released oxygen.

In this embodiment, as the heat treatment, treatment is performed in a nitrogen atmosphere at 400° C. for one hour after deposition of the insulator 224. By the above heat treatment, impurities such as hydrogen and water contained in the insulator 224 can be removed, for example.

This heat treatment can also be performed after the deposition of the insulator 220 and after the deposition of the insulator 222. Although the conditions for the above-described heat treatment can be used for the heat treatment, the heat treatment after the deposition of the insulator 220 is preferably performed in a nitrogen-containing atmosphere.

Here, in order to form a region containing oxygen that is released by heating in the insulator 224, oxygen may be supplied to the insulator 224 by one or more methods selected from an ion injection method, an ion doping method, plasma treatment, and a plasma immersion ion implantation method. In that case, the use of an ion implantation method by which an ionized source gas is subjected to mass separation and then added is preferable because oxygen can be supplied to the insulator 224 with high controllability.

Note that instead of the above-described method, plasma treatment containing oxygen may be performed under a reduced pressure. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment is not necessarily performed.

Figure 4A:
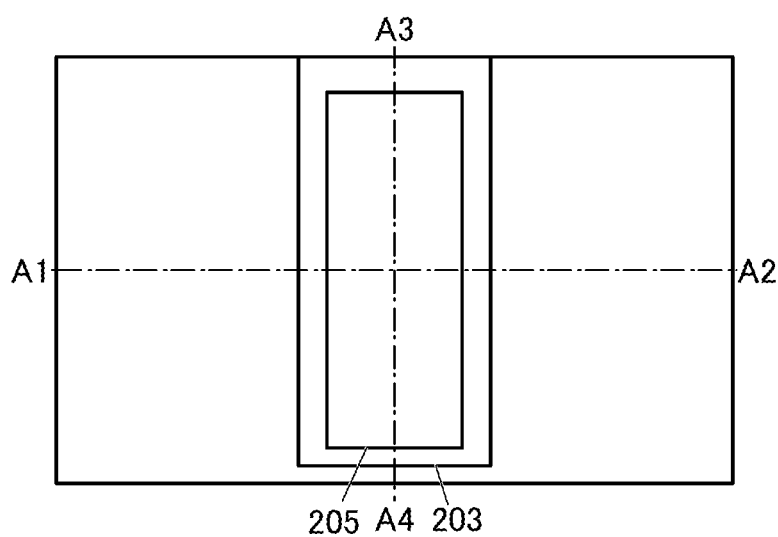
FIGS. 4A to 4C A top view and cross-sectional views illustrating a method for manufacturing a semiconductor device of one embodiment of the present invention.
Figure 4C:
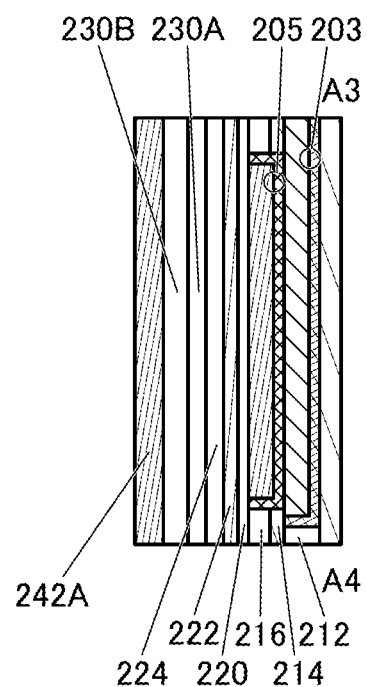
Figure 4B:
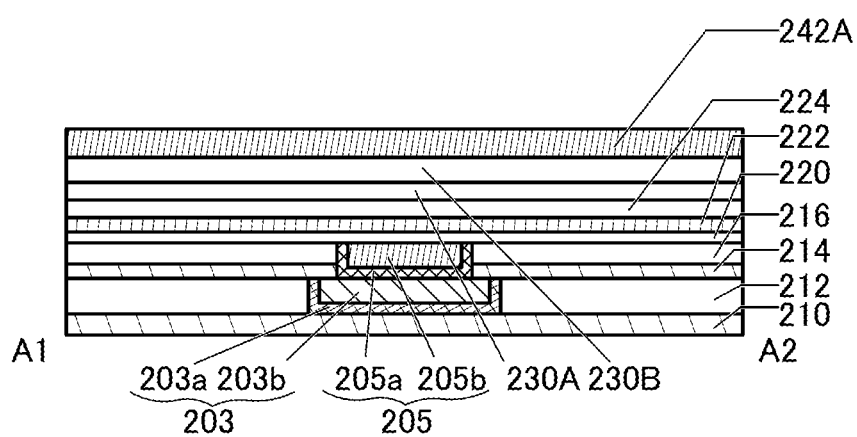

Next, an oxide film 230A to be the oxide 230a and an oxide film 230B to be the oxide 230b are deposited in this order over the insulator 224 (see FIG. 4). Note that the oxide films are preferably deposited successively without exposure to an air atmosphere. By the deposition without exposure to the air, impurities or moisture from the air atmosphere can be prevented from being attached to the top surfaces of the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

The oxide film 230A and the oxide film 230B are preferably deposited by a sputtering method, and oxygen or a mixed gas of oxygen and a rare gas is used as a sputtering gas. By increasing the proportion of oxygen contained in the sputtering gas, the amount of oxygen in the oxide film to be deposited can be increased and the crystallinity of the oxide film can be improved. In addition, when deposition is performed while the substrate is heated, the crystallinity of the oxide film can be improved.

In addition, in the case where the oxide film 230A and the oxide film 230B are deposited by a sputtering method, the above-described metal oxide target can be used. However, in the case where the metal oxide is deposited with a sputtering apparatus, for example, a film having an atomic ratio deviated from the atomic ratio of the target is formed. In particular, [Zn] in the film might be smaller than [Zn] in the target depending on the substrate temperature in deposition.

Moreover, increasing the purity of a sputtering gas is preferable. For example, as an oxygen gas or a rare gas used as a sputtering gas, a gas that is highly purified to have a dew point of −60° C. or lower, and preferably −100° C. or lower is used. When the highly purified sputtering gas is used for deposition, entry of moisture or the like into the oxide 230 can be prevented as much as possible.

Furthermore, in the case where the oxide film 230A and the oxide film 230B are deposited by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of about $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

In particular, when the oxide film 230A is deposited, part of oxygen contained in the sputtering gas is supplied to the insulator 224 in some cases. Therefore, the proportion of oxygen contained in the sputtering gas for the oxide film 230A is preferably 70% or higher, further preferably 80% or higher, and still further preferably 100%.

In the case where the oxide film 230B is formed by a sputtering method, when the proportion of oxygen contained in the sputtering gas is 10% or higher, and preferably 30% or higher during the deposition, the oxide film 230B can be the above-described CAAC-OS film.

In this embodiment, the oxide film 230A is deposited by a sputtering method using a target with In:Ga:Zn=1:1:0.5 [atomic ratio]. The oxide film 230B is deposited by a sputtering method using a target with In:Ga:Zn=4:2:4.1 [atomic ratio]. Note that each of the oxide films is preferably formed to have characteristics required for the oxide 230 by appropriate selection of deposition conditions and an atomic ratio.

Next, heat treatment may be performed. For the heat treatment, the conditions for the above-described heat treatment can be used. Through the heat treatment, impurities such as water and hydrogen contained in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Then, a conductive film 242A is deposited over the oxide film 230B. For the conductive film 242A, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Note that a conductive film 240A can be formed by a sputtering method, a CVD method, an MBE method, a PLD method, an ALD method, or the like.

Figure 5A:
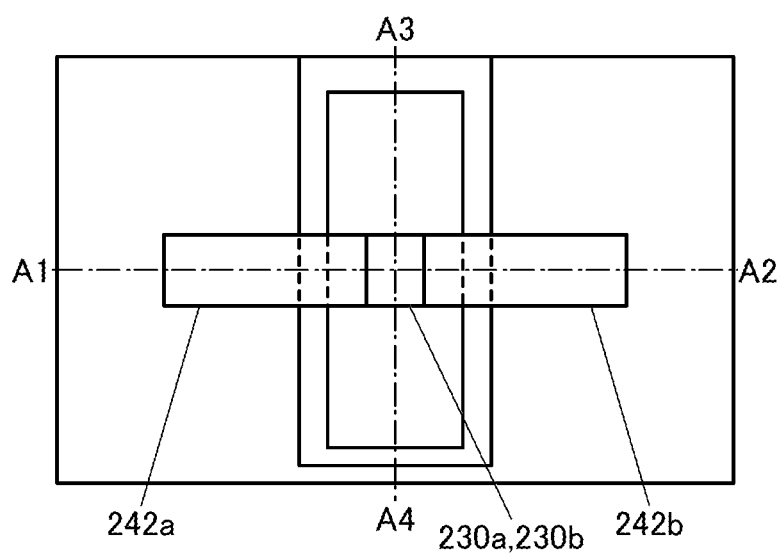
FIGS. 5A to 5C A top view and cross-sectional views illustrating a method for manufacturing a semiconductor device of one embodiment of the present invention.
Figure 5C:
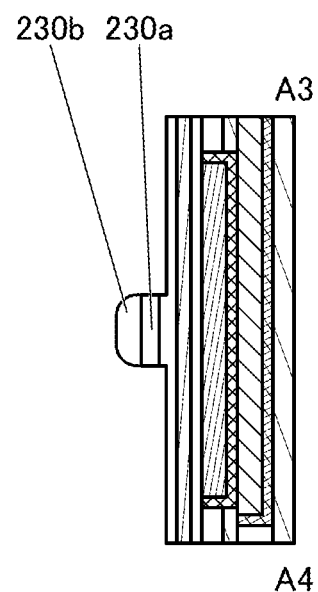
Figure 5B:
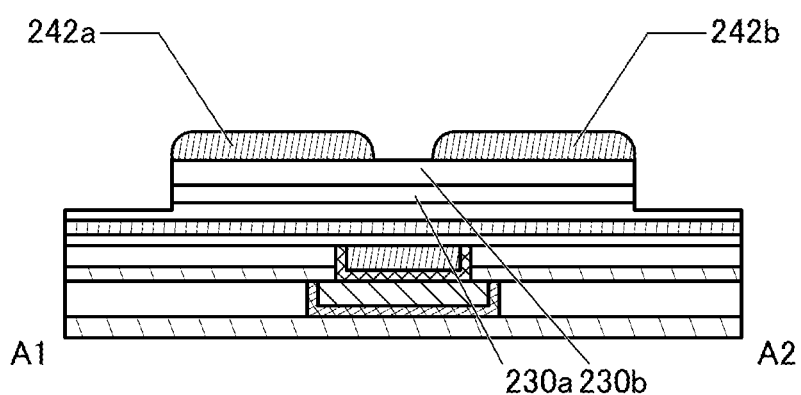

Next, part of the oxide film 230A, part of the oxide film 230B, and part of the conductive film 242A are selectively removed, so that the oxide 230a, the oxide 230b, the conductor 242a, and the conductor 242b are formed (see FIG. 5). Note that the oxide film 230A, the oxide film 230B, and the conductive film 242A can be selectively removed by a dry etching method, a wet etching method, or the like. A dry etching method is suitable for microfabrication. Note that the insulator 224 is partly removed by the processing in some cases.

In the lithography method, first, a resist is exposed to light through a mask. Next, a region exposed to light is removed or left using a developing solution, so that a resist mask is formed. Then, etching treatment through the resist mask is performed, so that the conductor, the semiconductor, the insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. Furthermore, an electron beam or an ion beam may be used instead of the above-described light. Note that the above mask for the exposure of the resist to light is unnecessary in the case of using an electron beam or an ion beam because direct writing is performed on the resist. Note that the resist mask can be removed by, for example, performing dry etching treatment such as ashing, performing wet etching treatment, performing wet etching treatment after dry etching treatment, or performing dry etching treatment after wet etching treatment.

A hard mask formed of an insulator or a conductor may be used instead of the resist mask. In the case where a hard mask is used, a hard mask with a desired shape can be formed by forming an insulating film or a conductive film to be the hard mask material over the constituent material, forming a resist mask thereover, and then etching the hard mask material. The constituent materials may be etched after removal of the resist mask or without removal of the resist mask. In the latter case, the resist mask sometimes disappears during the etching. The hard mask may be removed by etching after the constituent materials are etched. The hard mask does not need to be removed in the case where the hard mask material does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency power sources with the same frequency are applied to the parallel plate type electrodes. Alternatively, a structure may be employed in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Here, the oxide 230a and the oxide 230b are formed to overlap with the conductor 205 at least partly. It is preferable that side surfaces of the oxide 230a and the oxide 230b be substantially perpendicular to a top surface of the insulator 222. When the side surfaces of the oxide 230a and the oxide 230b are substantially perpendicular to the top surface of the insulator 222, the plurality of transistors 200 can be provided in a smaller area and at a higher density. Note that a structure may be employed in which an angle formed by the side surfaces of the oxide 230a and the oxide 230b and the top surface of the insulator 222 is an acute angle. In that case, the angle formed by the side surfaces of the oxide 230a and the oxide 230b and the top surface of the insulator 222 is preferably larger.

There is a curved surface between the side surfaces of the oxide 230a, the oxide 230b, and the conductor 242 and a top surface of the conductor 242. That is, an end portion of the side surface and an end portion of the top surface are preferably curved (hereinafter also referred to as a rounded shape). The radius of curvature of the curved surface at an end portion of the oxide 230b is greater than or equal to 3 nm and less than or equal to 10 nm, preferably greater than or equal to 5 nm and less than or equal to 6 nm, for example. When the end portions are not angular, the coverage with films deposited in a later step is improved.

Note that the oxide film 230A, the oxide film 230B, and the conductive film 242A may be processed into island shapes first, and then the conductive film 242A may be divided into the conductor 242a and the conductor 242b. Alternatively, the conductive film 242A may be divided to correspond to the conductor 242a and the conductor 242b first, and then the oxide film 230A, the oxide film 230B, and the conductive film 242A may be processed into island shapes.

In some cases, treatment such as dry etching described above makes impurities due to an etching gas or the like to attach to the side surface or to be diffused into the oxide 230a, the oxide 230b, and the like. Examples of the impurities include fluorine and chlorine.

In order to remove the above impurities or the like, cleaning is preferably performed. Examples of the cleaning method include wet cleaning using a cleaning solution, plasma treatment using plasma, and cleaning by heat treatment, and any of these cleanings may be performed in appropriate combination.

As the wet cleaning, cleaning treatment may be performed using an aqueous solution obtained by diluting an oxalic acid, a phosphoric acid, hydrogen peroxide water, a hydrofluoric acid, or the like with pure water or carbonated water. Alternatively, ultrasonic cleaning using pure water or carbonated water may be performed. In this embodiment, the ultrasonic cleaning using pure water or carbonated water is performed.

Next, heat treatment may be performed. For the heat treatment, the conditions for the above-described heat treatment can be used. Note that in the case where the heat treatment might cause oxidation of the conductor 242, the heat treatment is preferably performed in an atmosphere containing no oxygen. In the case where the conductor 242 contains an oxidation-resistant material, the heat treatment may be performed in an oxygen-containing atmosphere.

Through the heat treatment, impurities such as hydrogen and water contained in the oxide 230a and the oxide 230b can be removed. Furthermore, damages that have been caused in the oxide 230a or the oxide 230b by the dry etching in the above processing can be recovered. In the case where the heat treatment is performed in an oxygen-containing atmosphere, oxygen can be added to the oxide 230a and the oxide 230b.

By the heat treatment, the metal element is diffused from the conductor 242 into the oxide 230; thus, the metal element can be added to the oxide 230. Moreover, oxygen in the oxide 230 near the interface with the conductor 242 may be absorbed by the conductor 242. As a result, the oxide 230 near the interface with the conductor 242 becomes a metal compound and the resistance thereof is reduced. Note that at this time, part of the oxide 230 may be alloyed with the metal element. When part of the oxide 230 is alloyed with the metal element, the metal element added to the oxide 230 becomes relatively stable; therefore, a highly reliable semiconductor device can be provided. Note that in FIG. 6(B), the region 243a and the region 243b are shown by dotted lines as examples of the above-described low-resistance region of the oxide 230.

The region 243a and the region 243b are provided to spread in the depth direction and the horizontal direction in the oxide 230b near the conductor 242 in the shown example; however, the present invention is not limited thereto. In the depth direction, the region 243a and the region 243b may be formed in the whole oxide 230b or may be formed in the oxide 230a. The region 243a and the region 243b are formed in the horizontal direction in the regions spreading in the horizontal direction from the conductor 242 (the region 231 illustrated in FIG. 2) in the shown example; however, the present invention is not limited thereto. The region 243a and the region 243b may be formed only in the region (the region 231) overlapping with the conductor 242 or may also be formed in the region (part of the region 234) overlapping with part of the conductor 260 formed in a later step.

In the case where hydrogen in the oxide 230 is diffused into the region 231 illustrated in FIG. 2 and enters an oxygen vacancy in the region 231, the hydrogen becomes relatively stable. Hydrogen in an oxygen vacancy in the region 234 is released from the oxygen vacancy by heat treatment at higher than or equal to 250° C. and diffused into the region 231, enters an oxygen vacancy in the region 231, and becomes relatively stable. Thus, by the heat treatment, the resistance of the region 231 is further reduced, and the region 234 is highly purified (reduction of impurities such as water and hydrogen) and the resistance of the region 234 is further increased.

Alternatively, the heat treatment may be performed in such a manner that heat treatment is performed in a nitrogen or inert gas atmosphere, and then another heat treatment is performed in an atmosphere containing an oxidizing gas at 10 ppm or more, 1% or more, or 10% or more. The heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C.

Figure 6A:
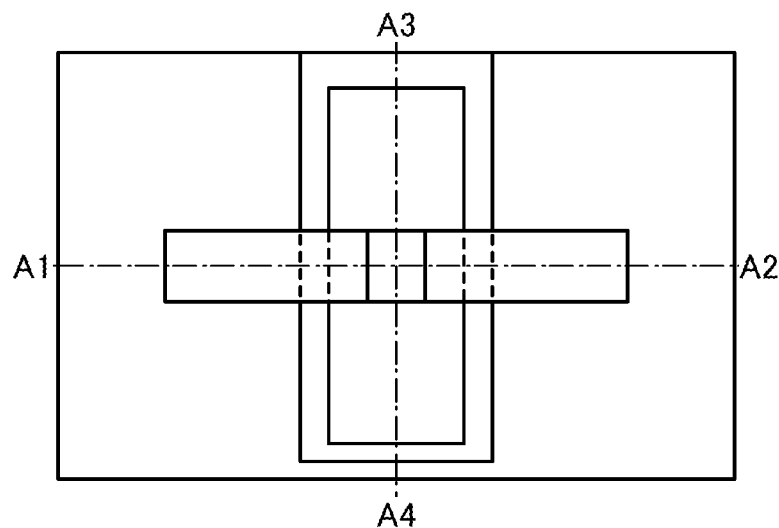
FIGS. 6A to 6C A top view and cross-sectional views illustrating a method for manufacturing a semiconductor device of one embodiment of the present invention.
Figure 6C:
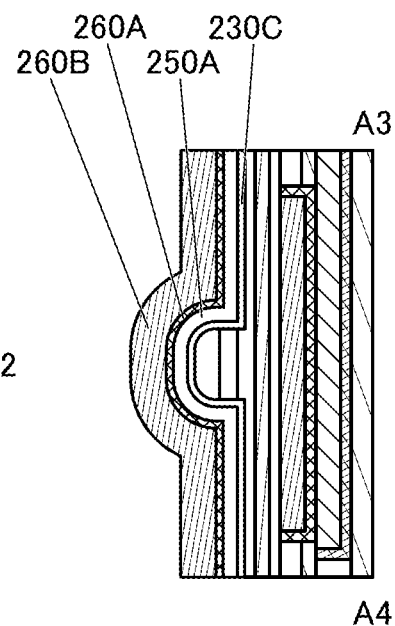
Figure 6B:
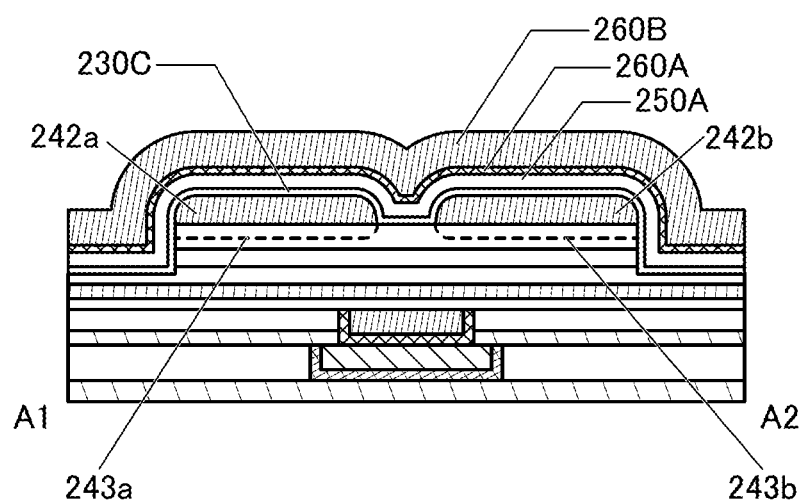

Then, the oxide film 230C to be the oxide 230c is deposited over the insulator 224, the oxide 230a, the oxide 230b, and the conductor 242 (see FIG. 6).

The oxide film 230C can be deposited by a sputtering method, a CVD method, an MBE method, a PLD method, an ALD method, or the like. The oxide film 230C may be deposited by a method similar to that for the oxide film 230A or the oxide film 230B in accordance with characteristics required for the oxide 230c. Note that as for the oxide film 230A, the proportion of oxygen contained in the sputtering gas for the oxide film 230C is higher than or equal to 70%, preferably higher than or equal to 80%, and further preferably 100%. In this embodiment, the oxide film 230C is deposited by a sputtering method using a target with In:Ga:Zn=4:2:4.1 [atomic ratio].

Then, an insulating film 250A is deposited over the oxide film 230C (see FIG. 6).

The insulating film 250A can be deposited by a sputtering method, a CVD method, an MBE method, a PLD method, an ALD method, or the like. Silicon oxynitride is preferably deposited by a CVD method as the insulating film 250A. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Before the insulating film 250A is formed, heat treatment is preferably performed in the deposition apparatus for the insulating film 250A. Here, as the heat treatment, the above-described vacuum baking is preferably performed. Performing the heat treatment in such a manner can remove zinc atoms and oxygen atoms which form the weak Zn—O bonds in the oxide 230, so that the reliability of the transistor 200 can be improved. In addition, successive deposition in the same deposition apparatus without exposure to the outside air after the heat treatment enables the insulating film 250A to cover the oxide 230 without entry of impurities such as water. Furthermore, heat treatment and deposition treatment are performed in different chambers of a multi-chamber deposition apparatus, so that the insulating film 250A can be deposited without being influenced by impurities such as water or zinc released by the heat treatment.

Furthermore, heat treatment may be performed after the deposition of the insulating film 250A. For the heat treatment, the conditions for the above-described heat treatment can be used. The heat treatment can reduce the moisture concentration and the hydrogen concentration in the insulating film 250A.

Next, a conductive film 260A and a conductive film 260B are sequentially deposited (see FIG. 6). The conductive film 260A and the conductive film 260B can be deposited by a sputtering method, a CVD method, an MBE method, a PLD method, an ALD method, or the like. Titanium nitride may be deposited for the conductive film 260A and tungsten may be deposited for the conductive film 260B, for example.

As the conductive film 260A, a metal nitride is preferably formed by a CVD method or a sputtering method. With the use of a metal nitride for the conductive film 260A, the conductivity of the conductive film 260B can be prevented from being lowered because of oxidation due to oxygen contained in the insulating film 250A.

Furthermore, when a low-resistance metal film is stacked as the conductive film 260B, a transistor with a low driving voltage can be provided.

Subsequently, heat treatment can be performed. For the heat treatment, the conditions for the above-described heat treatment can be used. Note that the heat treatment is not necessarily performed in some cases. This heat treatment sometimes forms a low-resistance region in the oxide 230b.

Figure 7A:
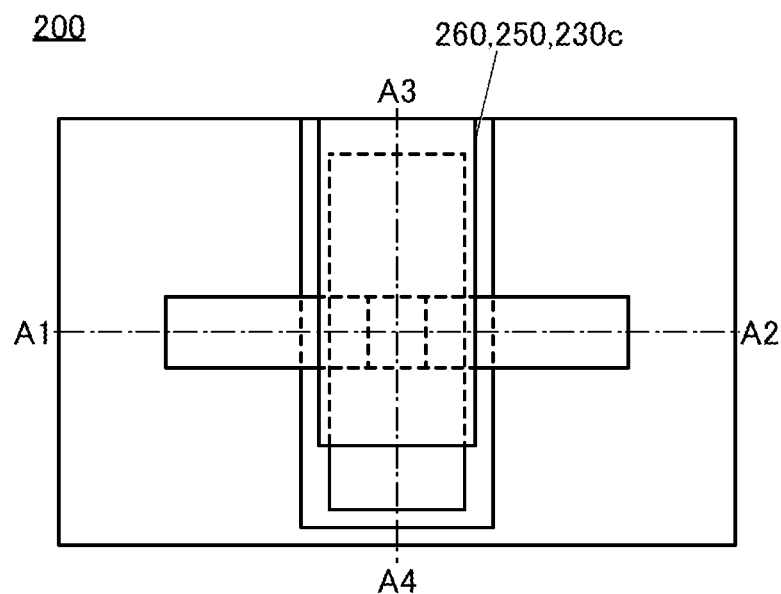
FIGS. 7A to 7C A top view and cross-sectional views illustrating a method for manufacturing a semiconductor device of one embodiment of the present invention.
Figure 7C:
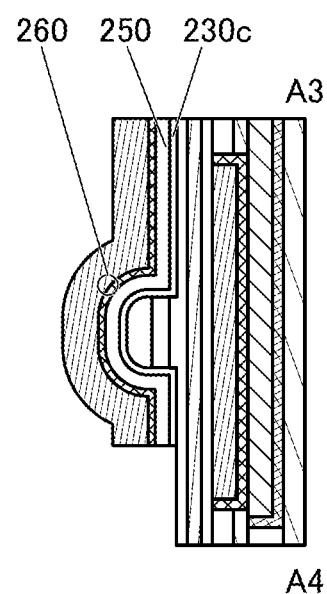
Figure 7B:
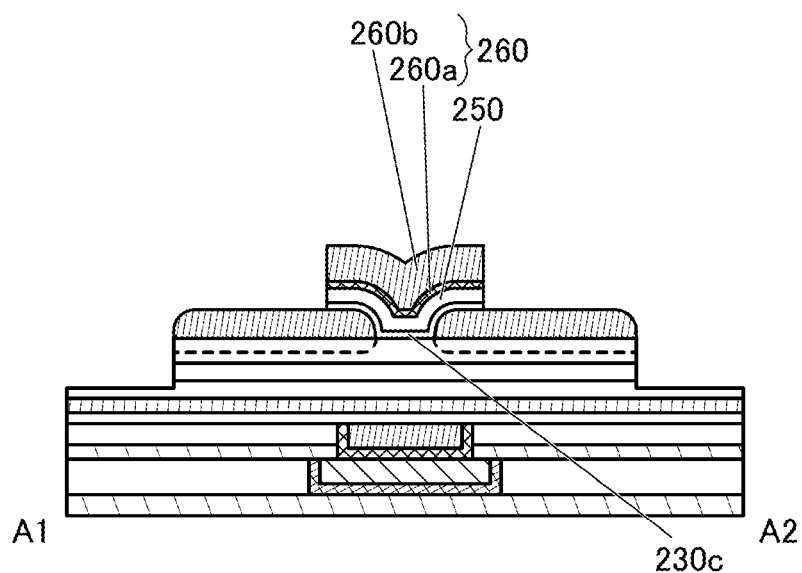

Next, part of the oxide film 230C, part of the insulating film 250A, part of the conductive film 260A, and part of the conductive film 260B are selectively removed by a photolithography method, so that the oxide 230c, the insulator 250, the conductor 260a, and the conductor 260b are formed (see FIG. 7). The oxide film 230C, the insulating film 250A, the conductive film 260A, and the conductive film 260B can be etched by a dry etching method or a wet etching method. A dry etching method is suitable for microfabrication.

In this manner, the oxide film 230C, the insulating film 250A, the conductive film 260A, and the conductive film 260B are etched at a time, whereby the manufacturing process of the transistor 200 can be simplified. In that case, end portions of the oxide 230c, the insulator 250, the conductor 260a, and the conductor 260b may be substantially aligned with each other in a top view.

Note that this embodiment is not limited to that. For example, the conductive film 260A and the conductive film 260B may be etched to form the conductor 260a and the conductor 260b, and then the oxide film 230C and the insulating film 250A may be etched to form the oxide 230c and the insulator 250. In that case, a shape can be obtained in which the end portions of the oxide 230c and the insulator 250 can be located outside the end portions of the conductor 260a and the conductor 260b in a top view.

Figure 8A:
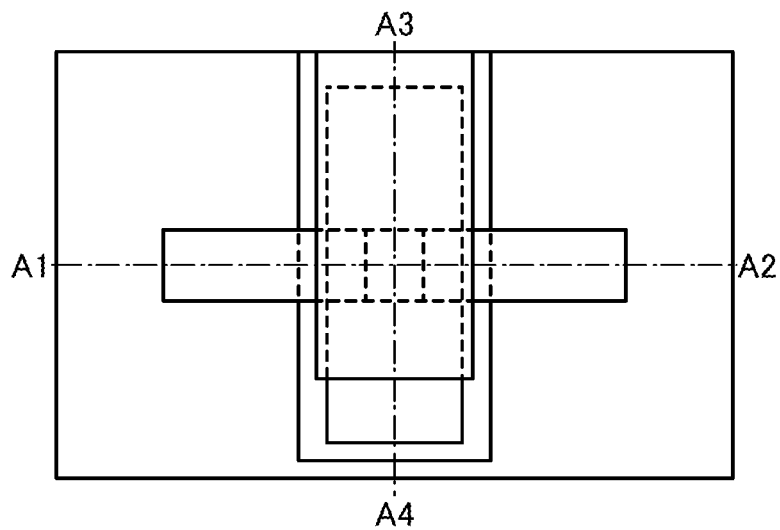
FIGS. 8A to 8C A top view and cross-sectional views illustrating a method for manufacturing a semiconductor device of one embodiment of the present invention.
Figure 8C:
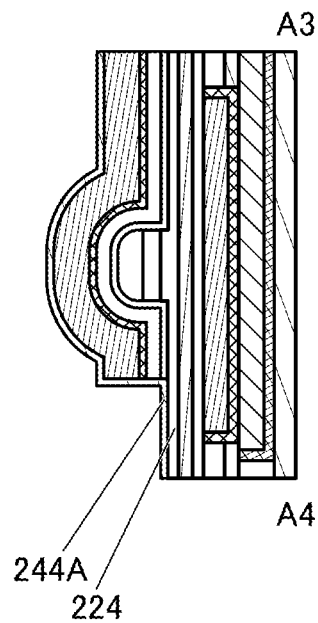
Figure 8B:
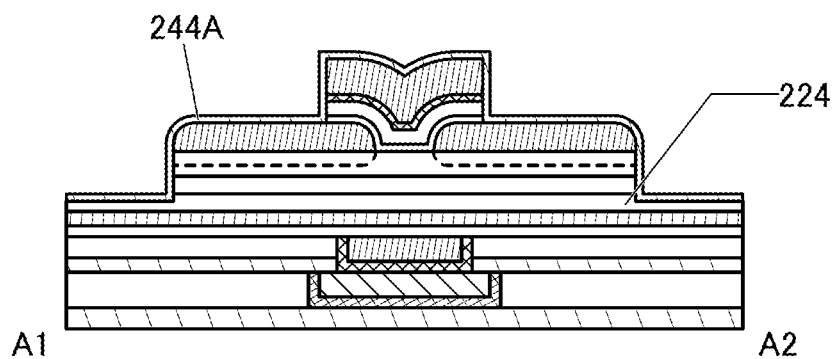

Next, an insulating film 244A to be the insulator 244 is deposited to cover the insulator 224, the oxide 230, the conductor 242, the insulator 250, and the conductor 260 (see FIG. 8). The insulating film 244A can be deposited by a sputtering method, a CVD method, an MBE method, a PLD method, an ALD method, or the like. The insulating film 244A is preferably deposited by an ALD method. An ALD method is a deposition method having excellent step coverage, and thus can prevent formation of disconnection or the like in the insulating film 244A due to unevenness of the formation surface.

The insulating film 244A preferably functions as an insulating barrier, and an insulator containing an oxide of one or both of aluminum and hafnium is preferably deposited. Note that as the insulator containing an oxide of one or both of aluminum and hafnium, aluminum oxide, hafnium oxide, an oxide containing aluminum and hafnium (hafnium aluminate), or the like is preferably used. The insulating film 244A having a barrier property can inhibit entry of oxygen from above the insulating film 244A into the conductor 260, the insulator 250, and the oxide 230.

Figure 9A:
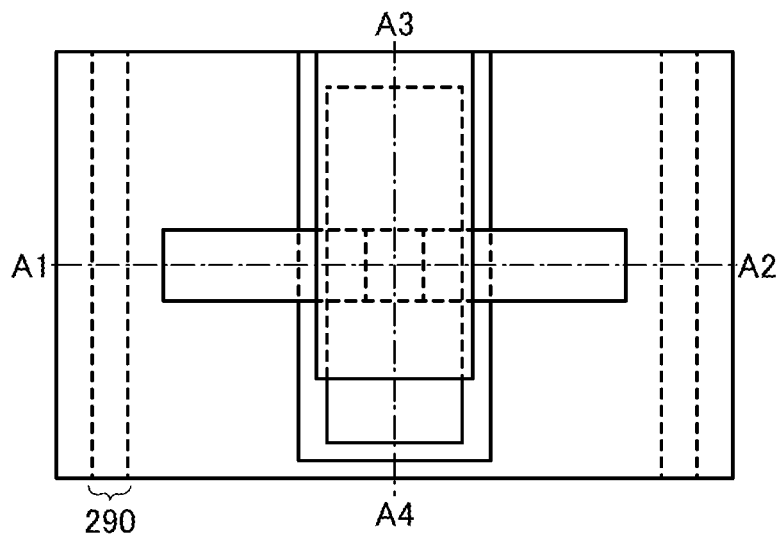
FIGS. 9A to 9C A top view and cross-sectional views illustrating a method for manufacturing a semiconductor device of one embodiment of the present invention.
Figure 9C:
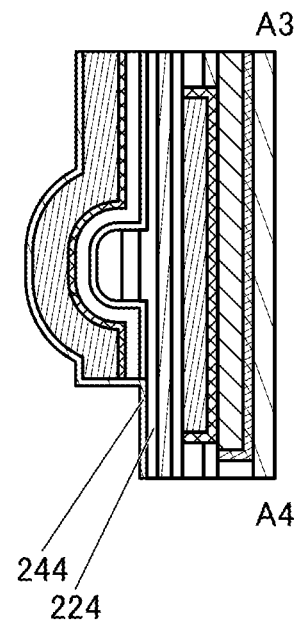
Figure 9B:
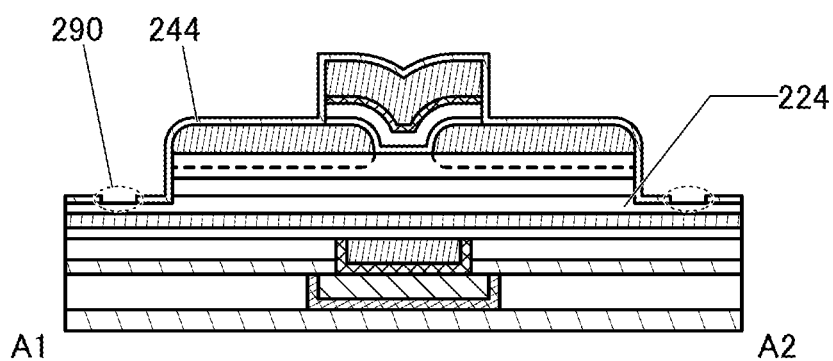

Next, part of the insulating film 244A is selectively removed by a photolithography method, so that the insulator 244 including the opening 290 is formed (see FIG. 9). The insulating film 244A can be etched by either a dry etching method or a wet etching method. A dry etching method is suitable for microfabrication.

Figure 10A:
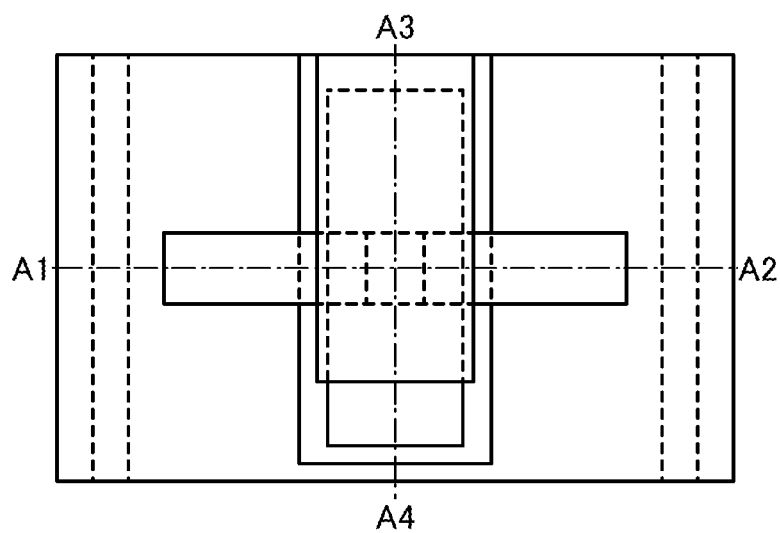
FIGS. 10A to 10C A top view and cross-sectional views illustrating a method for manufacturing a semiconductor device of one embodiment of the present invention.
Figure 10C:
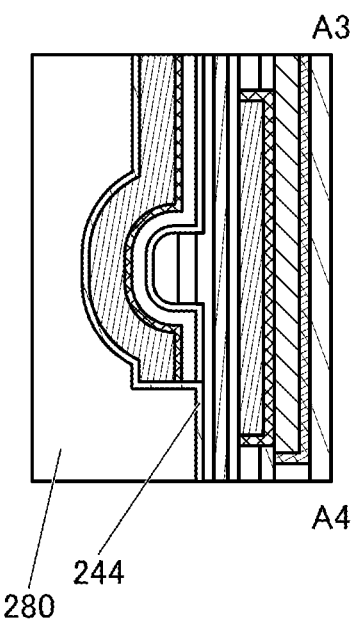
Figure 10B:
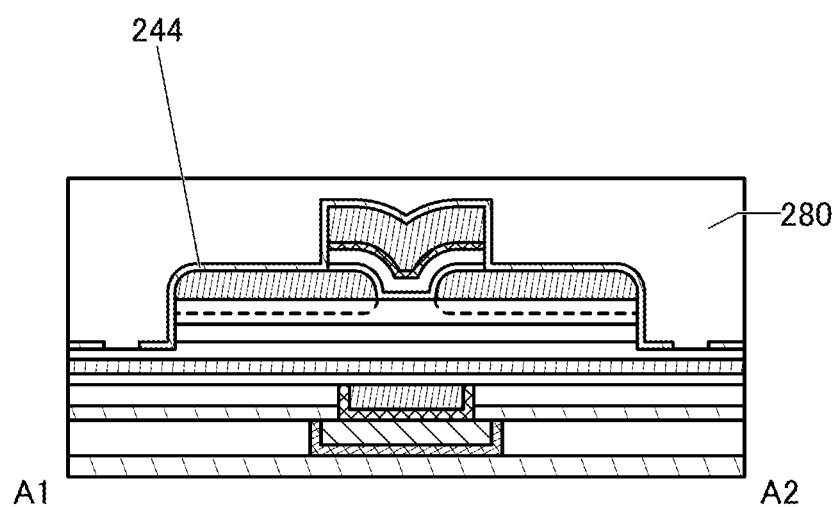

Then, the insulator 280 is deposited over the insulator 244 (see FIG. 10). Here, the insulator 280 is in contact with the insulator 224 through the opening 290. The insulator 280 preferably includes an insulator with a low relative permittivity. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably included. In particular, silicon oxide, silicon oxynitride, silicon nitride oxide, and porous silicon oxide are preferably used for the insulator 280 because a region containing oxygen that is released by heating can be easily formed in the insulator 280 in a later step. In addition, silicon oxide and silicon oxynitride, which are thermally stable, are preferable. The insulator 280 can be deposited by a sputtering method, a CVD method, an MBE method, a PLD method, an ALD method, or the like. Alternatively, a spin coating method, a dipping method, a droplet discharging method (such as an ink-jet method), a printing method (such as screen printing or offset printing), a doctor knife method, a roll coater method, a curtain coater method, or the like can be employed. In this embodiment, for the insulator 280, silicon oxide is deposited by a CVD method.

Note that the insulator 280 is preferably formed to have a planar top surface. For example, the insulator 280 may have a planar top surface right after the deposition. Alternatively, for example, the insulator 280 may have a planar top surface by removing the insulator or the like from the top surface after the deposition so that the top surface becomes parallel to a reference surface such as a rear surface of the substrate. Such treatment is referred to as planarization treatment. Examples of the planarization treatment include CMP treatment and dry etching treatment. In this embodiment, CMP treatment is used as the planarization treatment. Note that the insulator 280 does not necessarily have a planar top surface.

Figure 11A:
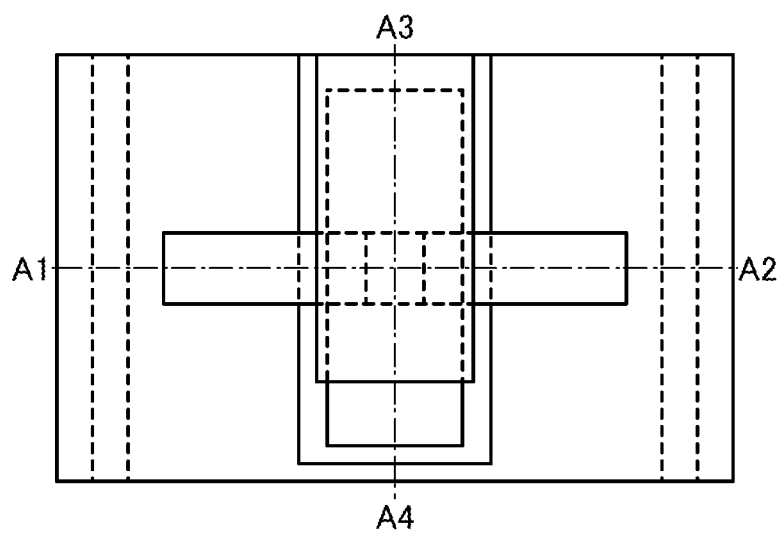
FIGS. 11A to 11C A top view and cross-sectional views illustrating a method for manufacturing a semiconductor device of one embodiment of the present invention.
Figure 11C:
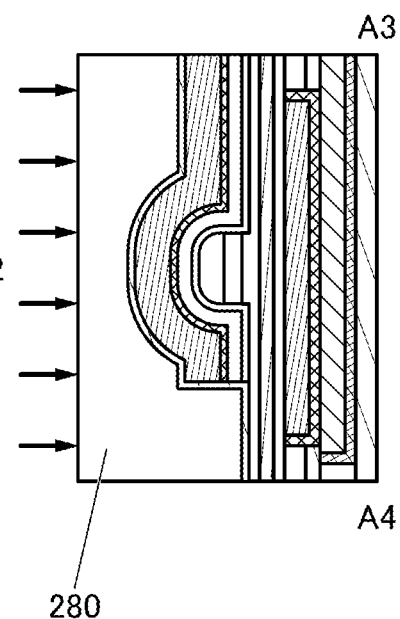
Figure 11B:
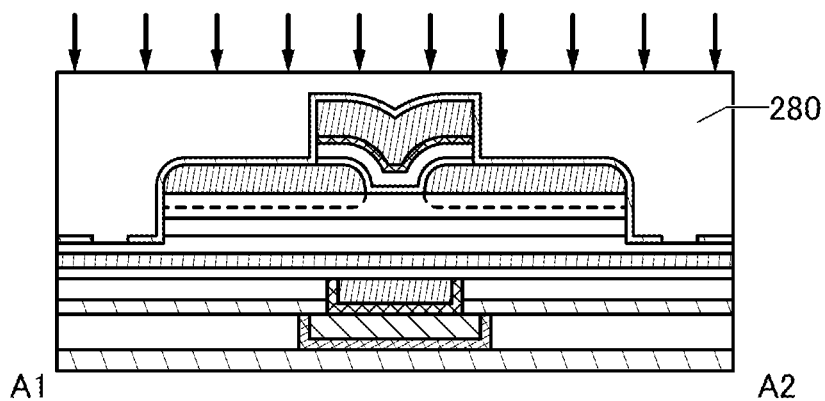

Next, oxygen may be added to the insulator 280 (see FIG. 11). As a method for adding oxygen, one or more methods selected from an ion injection method, an ion doping method, a plasma treatment method, and a plasma immersion ion implantation method can be employed. In that case, the use of an ion implantation method by which an ionized source gas is subjected to mass separation and then added is preferable because oxygen can be added to the insulator 280 with high controllability.

Note that the addition of oxygen to the insulator 280 may be performed after the formation of the insulator 274. Oxygen can be added to the insulator 274 through the insulator 274.

Next, the insulator 274 is deposited over the insulator 280 (see FIG. 12). The insulator 274 is preferably deposited in an oxygen-containing atmosphere by a sputtering method. For the insulator 274, an insulating material that is less likely to transmit impurities such as water or hydrogen is preferably used. For the insulator 274, an oxide of one or both of aluminum and hafnium having a barrier property is preferably used, for example. In this embodiment, as the insulator 274, an aluminum oxide film is deposited in an oxygen-containing atmosphere by a sputtering method.

The insulator 274 is deposited in an oxygen-containing atmosphere by a sputtering method, whereby oxygen may be introduced into the insulator 280 during the deposition. Although oxygen is added as an oxygen radical here, for example, the state of oxygen at the time of being added is not limited thereto. Oxygen may be added in the state of an oxygen atom, an oxygen ion, or the like. Heat treatment in a later step can diffuse oxygen so that oxygen can be supplied to the oxide 230 effectively. In the case where sufficient oxygen can be introduced into the insulator 280 during the deposition of the insulator 274 by a sputtering method, the step illustrated in FIG. 11 may be omitted.

Note that in the case where oxygen is added to the insulator 280 by the above-described ion implantation method or the like as illustrated in FIG. 11, it is not necessary to add oxygen to the insulator 280 during the deposition or after the deposition of the insulator 274. In that case, when aluminum oxide is formed by a sputtering method as the insulator 274, oxygen is not added to the deposition gas and only argon may be used. Furthermore, with the use of a target containing oxygen and aluminum as a sputtering target, the insulator 274 including aluminum oxide is formed.

Note that at the time of the deposition of the insulator 274, substrate heating is preferably performed. The substrate heating is preferably performed at higher than 100° C. and lower than or equal to 300° C. Further preferably, the substrate heating is performed at higher than or equal to 120° C. and lower than or equal to 250° C. When the substrate temperature is higher than 100° C., water in the oxide 230 can be removed. Furthermore, surface adsorbed water can be prevented from being attached to the formed film. Moreover, when the insulator 274 is deposited while the substrate heating is performed in this manner, oxygen can be diffused into the insulator 224 and the oxide 230 from the insulator 280 during the deposition.

When the transistor 200 is interposed between the insulator 274 and the insulator 222, a large amount of oxygen can be contained in the insulator 280, the insulator 224, and the oxide 230 without outward diffusion of oxygen. Moreover, impurities such as water or hydrogen can be prevented from entering from above the insulator 274 and from below the insulator 222; thus, the impurity concentrations in the insulator 280, the insulator 224, and the oxide 230 can be lowered.

Sequentially, heat treatment is performed. The heat treatment is performed at higher than or equal to 250° C. and lower than or equal to 650° C., and preferably higher than or equal to 300° C. and lower than or equal to 500° C. The heat treatment is performed in an oxygen atmosphere. Alternatively, the heat treatment is performed in an inert gas atmosphere or an atmosphere containing an oxidizing gas at 10 ppm or more, 1% or more, or 10% or more. Here, as the inert gas, for example, a nitrogen gas or a rare gas can be used. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for released oxygen. In this embodiment, the heat treatment is performed at 400° C. in an oxygen gas atmosphere for one hour.

Figure 13:
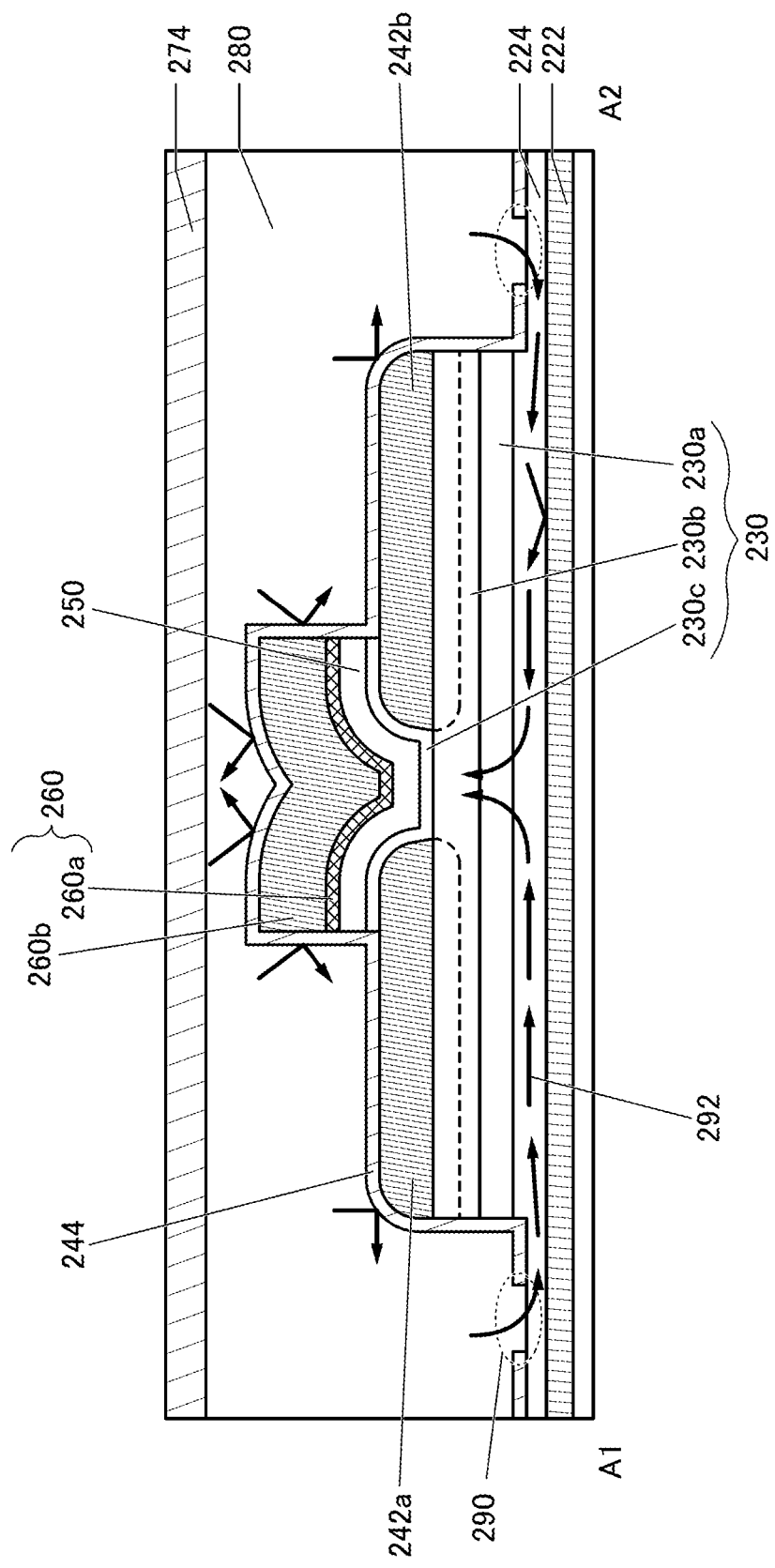
FIG. 13 A cross-sectional view illustrating a method for manufacturing a semiconductor device of one embodiment of the present invention.
Figure 14A:
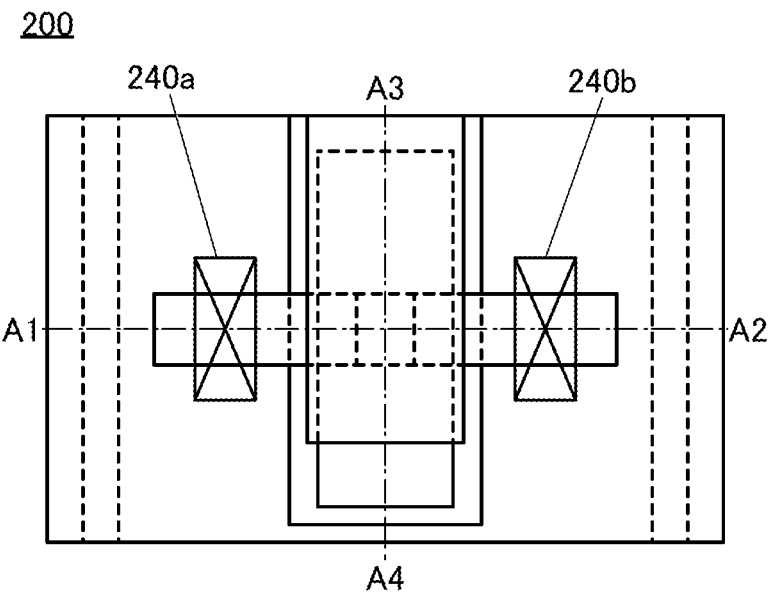
FIGS. 14A to 14C A top view and cross-sectional views illustrating a method for manufacturing a semiconductor device of one embodiment of the present invention.
Figure 14C:
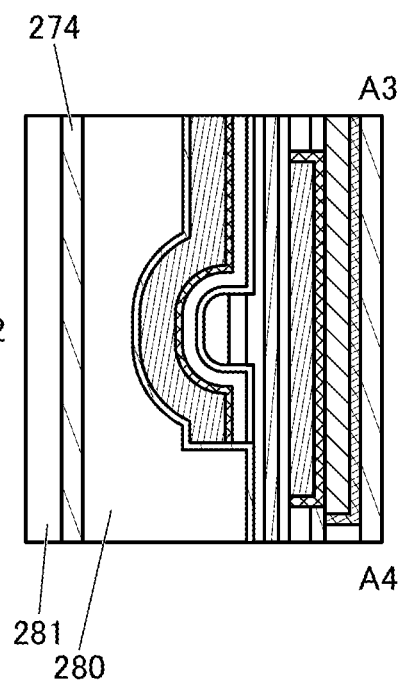
Figure 14B:
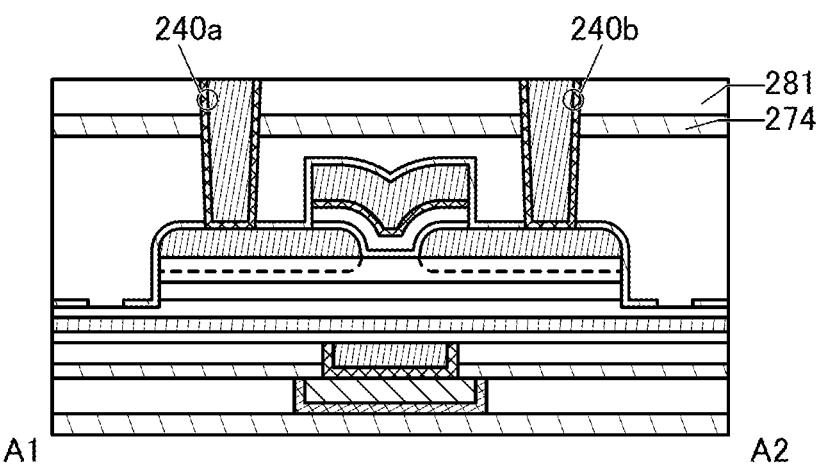

As described above, the insulator 244 is provided to cover the conductor 260, the insulator 250, and the oxide 230 in this embodiment. Therefore, as illustrated in FIG. 13, the oxygen 292 added to the insulator 280 by the heat treatment does not directly enter the conductor 260, the insulator 250, and the oxide 230, but is diffused into the insulator 224 through the opening 290. The oxygen 292 contained in the insulator 224 is supplied to the oxide 230 without being diffused downward owing to the insulator 222. Thus, the oxygen 292 is supplied to the oxide 230, in particular, the channel formation region, whereby oxygen vacancies can be reduced. Here, the insulator 222 and the insulator 274 can prevent oxygen from being diffused over and under the transistor 200, and thus oxygen can be supplied to the oxide 230 effectively.

Next, the insulator 281 is deposited over the insulator 274. The insulator 281 can be deposited by a sputtering method, a CVD method, an MBE method, a PLD method, an ALD method, or the like. Alternatively, a spin coating method, a dipping method, a droplet discharging method (such as an ink-jet method), a printing method (such as screen printing or offset printing), a doctor knife method, a roll coater method, a curtain coater method, or the like can be employed. In this embodiment, for the insulator 281, silicon nitride oxide is used.

Next, the insulator 281 is partly removed. Note that the insulator 281 is preferably formed to have a planar top surface. For example, the insulator 281 may have a planar top surface right after the deposition. Alternatively, for example, the insulator 281 may have planarity by removing the insulator and the like from the top surface after the deposition so that the top surface becomes parallel to a reference surface such as a rear surface of the substrate. Such treatment is referred to as planarization treatment. Examples of the planarization treatment include CMP treatment and dry etching treatment. In this embodiment, CMP treatment is used as the planarization treatment. Note that the insulator 281 does not necessarily have a planar top surface.

Next, openings reaching the conductor 242 are formed in the insulator 281, the insulator 274, the insulator 280, and the insulator 244. The openings are formed by a lithography method. Note that in order that the conductor 240a and the conductor 240b are provided in contact with the side surface of the conductor 242, the openings may be formed so that the side surface of the oxide 230 is exposed in the openings reaching the oxide 230.

Next, a conductive film to be the first conductor of the conductor 240 and the second conductor of the conductor 240 is deposited. The conductive film can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having planar top surfaces can be formed (see FIG. 14). Note that the insulator 281 is partly removed by the CMP treatment in some cases.

Through the above process, the semiconductor device including the transistor 200 can be formed. As illustrated in FIG. 4 to FIG. 14, with the use of the method for manufacturing the semiconductor device described in this embodiment, the transistor 200 having favorable electrical characteristics and reliability can be formed.

Modification Example of Semiconductor Device

An example of a semiconductor device including the transistor 200 of one embodiment of the present invention which is different from the semiconductor device described in <Structure example of semiconductor device> above will be described below with reference to FIG. 15 to FIG. 20.

In FIG. 15 to FIG. 20, (A) of each drawing is a top view. Moreover, (B) of each drawing is a cross-sectional view corresponding to a portion indicated by a dashed-dotted line A1-A2 in (A), and is also a cross-sectional view in the channel length direction of the transistor 200. Furthermore, (C) of each drawing is a cross-sectional view corresponding to a portion indicated by a dashed-dotted line A3-A4 in (A), and is also a cross-sectional view in the channel width direction of the transistor 200. Note that for simplification of the drawing, some components are not illustrated in the top view in (A) of each drawing.

Note that in the semiconductor device illustrated in FIG. 15 to FIG. 20, components having the same functions as the components in the semiconductor device described in <Structure example of semiconductor device> (see FIG. 1) are denoted by the same reference numerals. Note that in this section, the materials described in detail in <Structure example of semiconductor device> can be used as the constituent materials for the transistor 200.

Figure 15A:
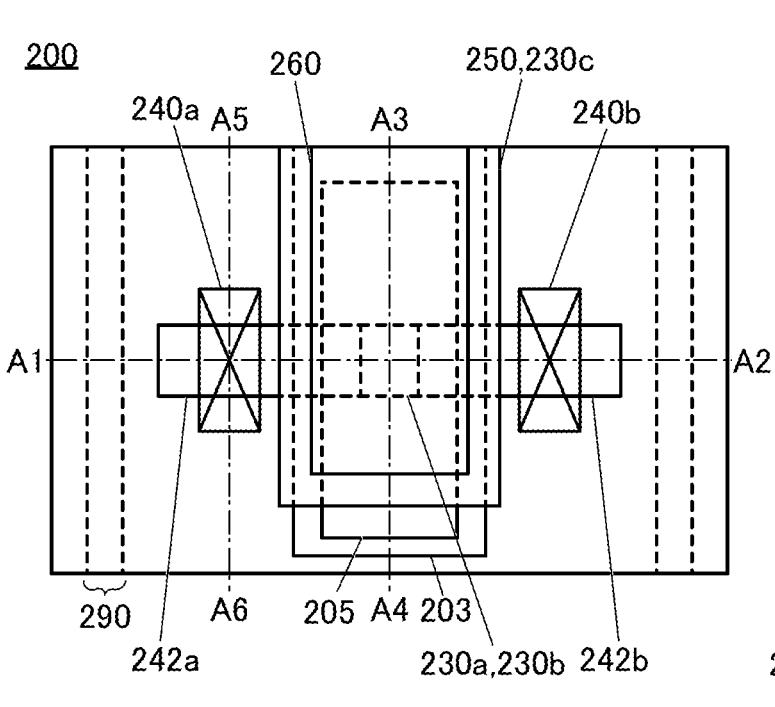
FIGS. 15A to 15C A top view and cross-sectional views of a semiconductor device of one embodiment of the present invention.
Figure 15C:
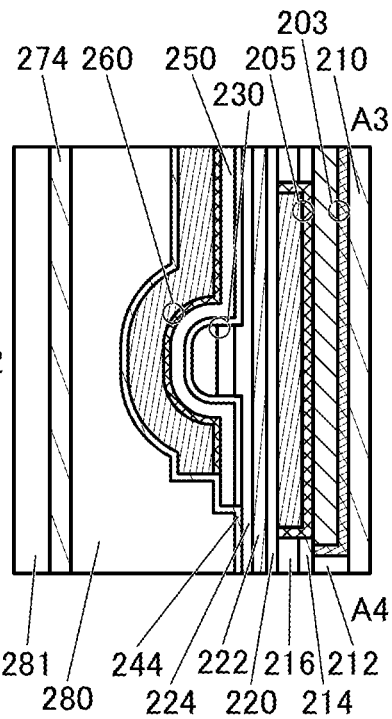
Figure 15B:
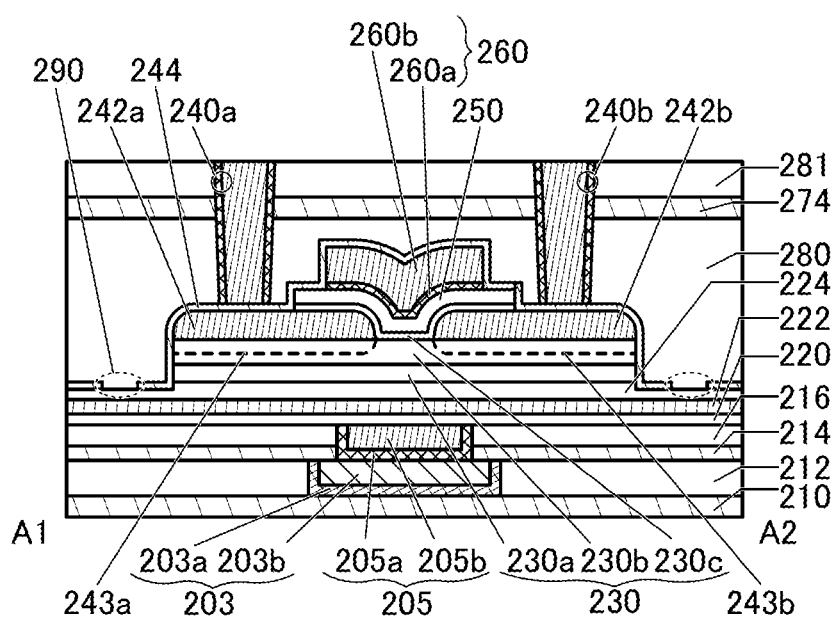

The transistor 200 illustrated in FIG. 15 is different from the transistor 200 illustrated in FIG. 1 in that, in a top view, the end portions of the oxide 230c and the insulator 250 are located outside the end portions of the conductor 260a and the conductor 260b. In order to obtain such a structure, in the step illustrated in FIG. 7, the conductive film 260A and the conductive film 260B may be etched to form the conductor 260a and the conductor 260b, and then the oxide film 230C and the insulating film 250A may be etched to form the oxide 230c and the insulator 250.

The transistor 200 illustrated in FIG. 16 is different from the transistor 200 illustrated in FIG. 1 in that an insulator 254a is positioned between the insulator 224, the oxide 230, and the conductor 242a and the insulator 250 and the insulator 244, and an insulator 254b is positioned between the insulator 224, the oxide 230, and the conductor 242b and the insulator 250 and the insulator 244. As each of the insulator 254a and the insulator 254b, an insulator having a lower oxygen permeability than the insulator 224 is used. For example, an insulator having a function of inhibiting the passage of oxygen and impurities such as hydrogen, which can be used as the insulator 244, is used as each of the insulator 254a and the insulator 254b. With the use of such an insulator 254a and such an insulator 254b, oxidation of a surface of the conductor 242a that is in contact with the insulator 254a and a surface of the conductor 242b that is in contact with the insulator 254b can be inhibited.

The insulator 254a and the insulator 254b can be deposited by a sputtering method, a CVD method, an MBE method, a PLD method, an ALD method, or the like. For example, aluminum oxide may be deposited by a sputtering method and aluminum oxide may be deposited thereover by an ALD method. By performing deposition in such a manner, even in the case where cracks, pinholes, or the like are formed in the aluminum oxide deposited by a sputtering method, the aluminum oxide deposited by an ALD method can be formed with good coverage to fill the cracks, the pinholes, or the like.

The side surface of the insulator 254a or the insulator 254b is preferably aligned with an edge of the opening 290 of the insulator 244. Note that without being limited thereto, the side surface of the insulator 254a or the insulator 254b may be covered with the insulator 244, or the end portion of the insulator 254a or the insulator 254b may be exposed from the opening 290 of the insulator 244.

Figure 17A:
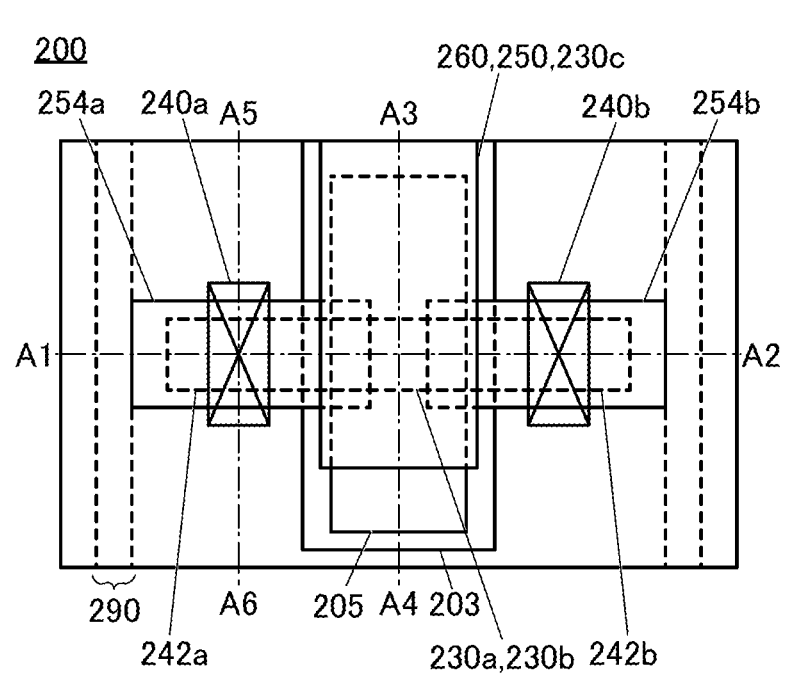
FIGS. 17A to 17C A top view and cross-sectional views of a semiconductor device of one embodiment of the present invention.
Figure 17C:
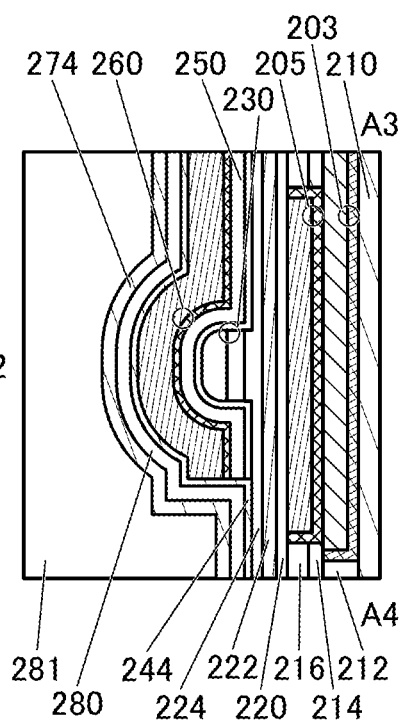
Figure 17B:
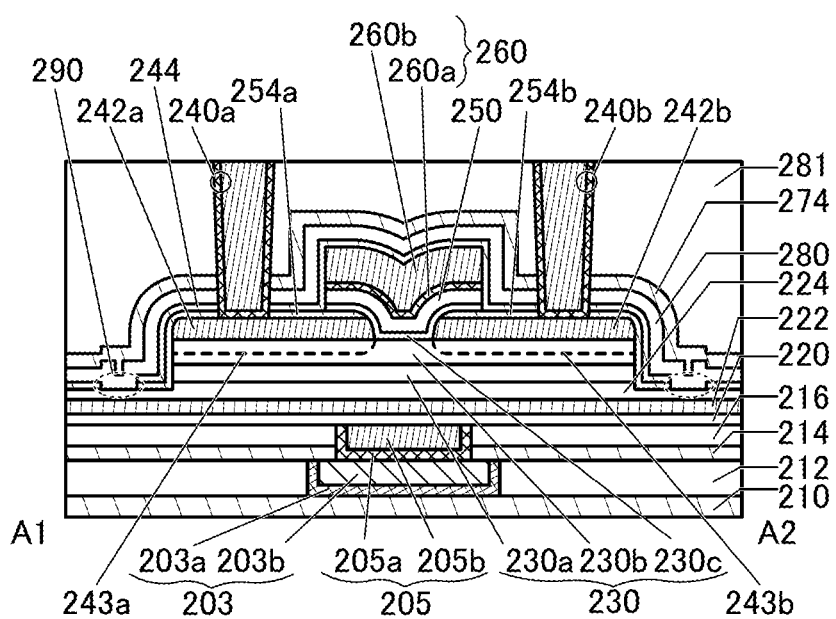

The transistor 200 illustrated in FIG. 17 is different from the transistor 200 illustrated in FIG. 16 in that the insulator 280 is thin and its top surface is not planarized. In other words, the shape of the structure body below the insulator 280 is reflected by the top surface shape of the insulator 280. When the insulator 280 is thin as described above, the amount of oxygen that can be added to the insulator 280 can be reduced and the amount of oxygen supplied from the insulator 280 to the insulator 224 can be adjusted.

Figure 18A:
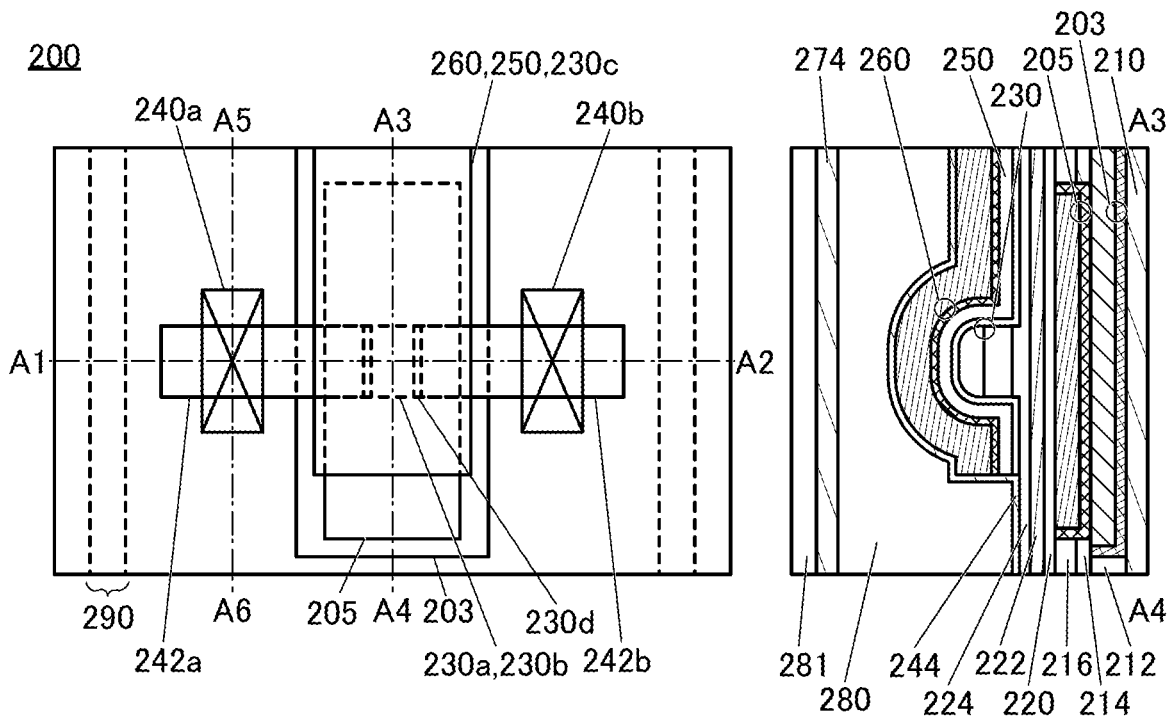
FIGS. 18A to 18C A top view and cross-sectional views of a semiconductor device of one embodiment of the present invention.
Figure 18C:
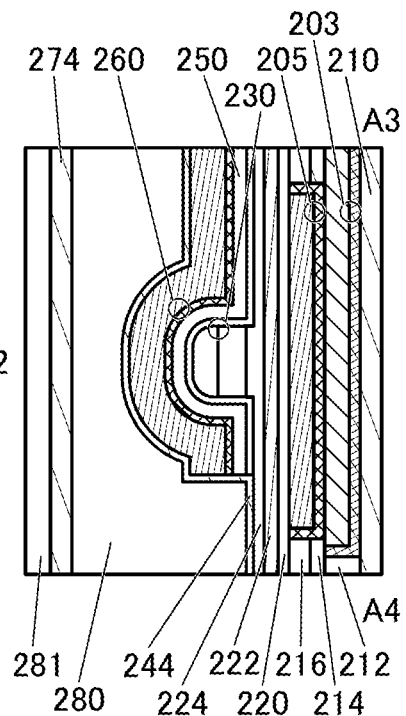
Figure 18B:
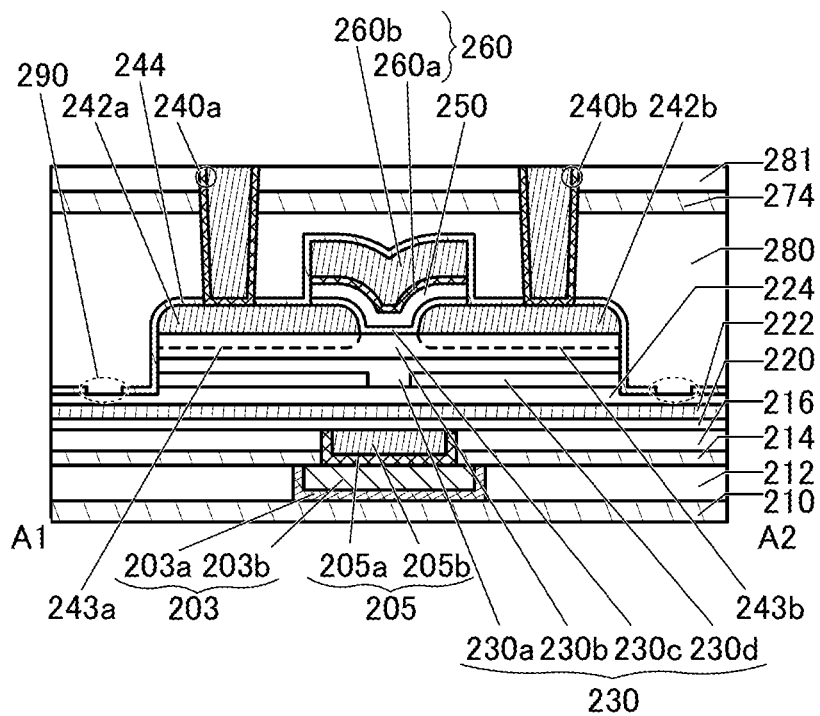

The transistor 200 illustrated in FIG. 18 is different from the transistor 200 illustrated in FIG. 1 in that an oxide 230d including, in at least part thereof, a region where the insulator 224 is exposed is positioned over the insulator 224 and the oxide 230a positioned over the oxide 230d is in contact with the insulator 224 via the region. The oxide 230d is a metal oxide, and an insulator having a lower oxygen permeability than the oxide 230a is used. For example, the atomic ratio of the element M (e.g., Ga) contained in the oxide 230d is preferably larger than the atomic ratio of the element M contained in the oxide 230a. For example, when a metal oxide having an atomic ratio of [In]:[Ga]:[Zn]=1:1:0.5 is used as the oxide 230a, a metal oxide having an atomic ratio of [In]:[Ga]:[Zn]=1:3:4 is used as the oxide 230d.

The region where the insulator 224 is exposed of the oxide 230d is formed to overlap with the channel formation region of the oxide 230b. As illustrated in FIG. 18(A), a shape in which the oxide 230d is divided into a source side and a drain side by the region may be employed. The region may be provided in an opening-like shape in the oxide 230d.

Figure 19:
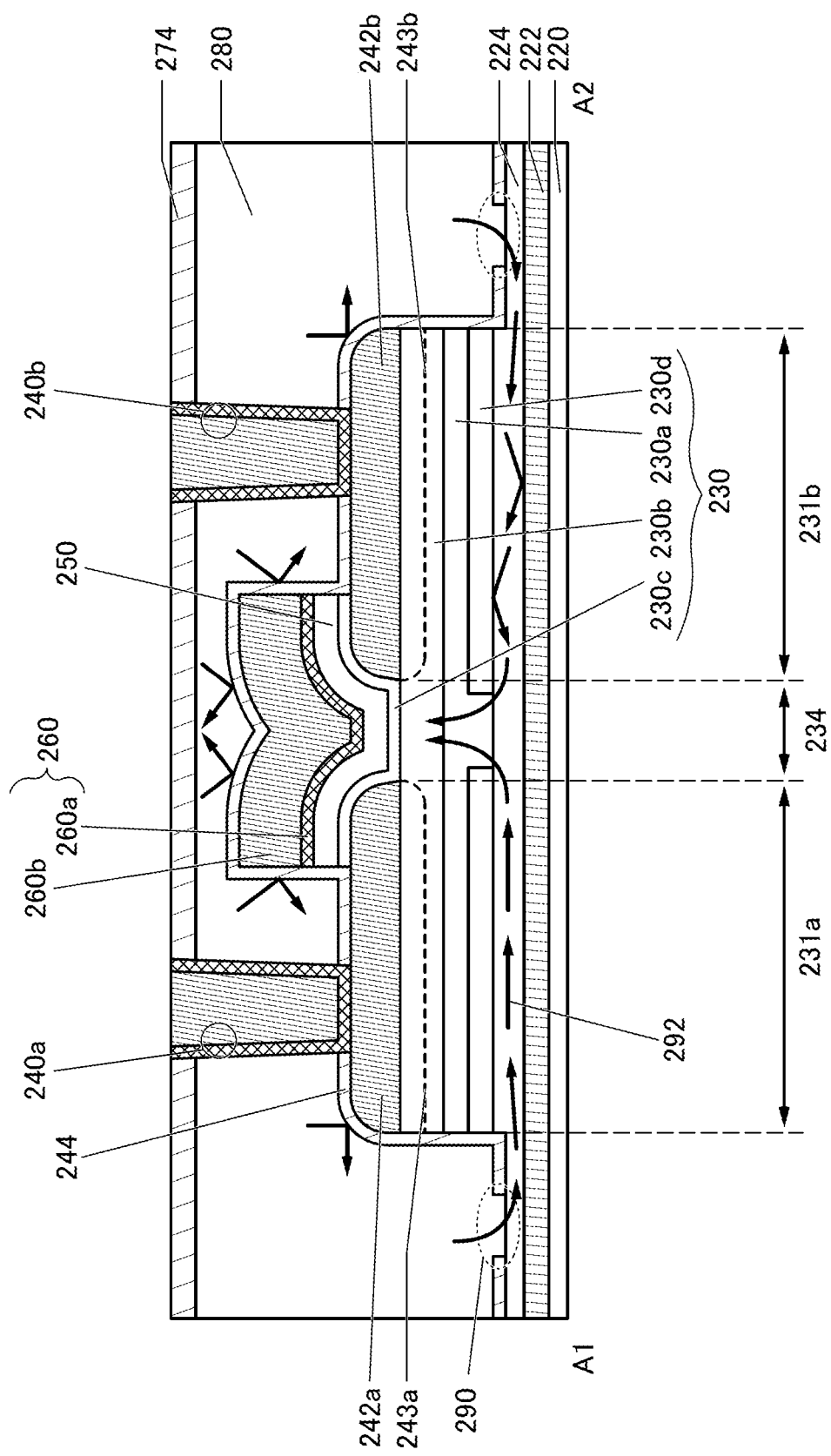
FIG. 19 A cross-sectional view of a semiconductor device of one embodiment of the present invention.

With such a structure, as illustrated in FIG. 19, when the oxygen 292 is diffused, the oxygen 292 is not diffused from the insulator 224 into the oxide 230 in the region overlapping with the oxide 230d, and the oxygen 292 can be diffused from a region not overlapping with the oxide 230d, that is, from below the channel formation region into the oxide 230. Thus, oxygen can be effectively supplied to the channel formation region of the oxide 230.

Figure 20A:
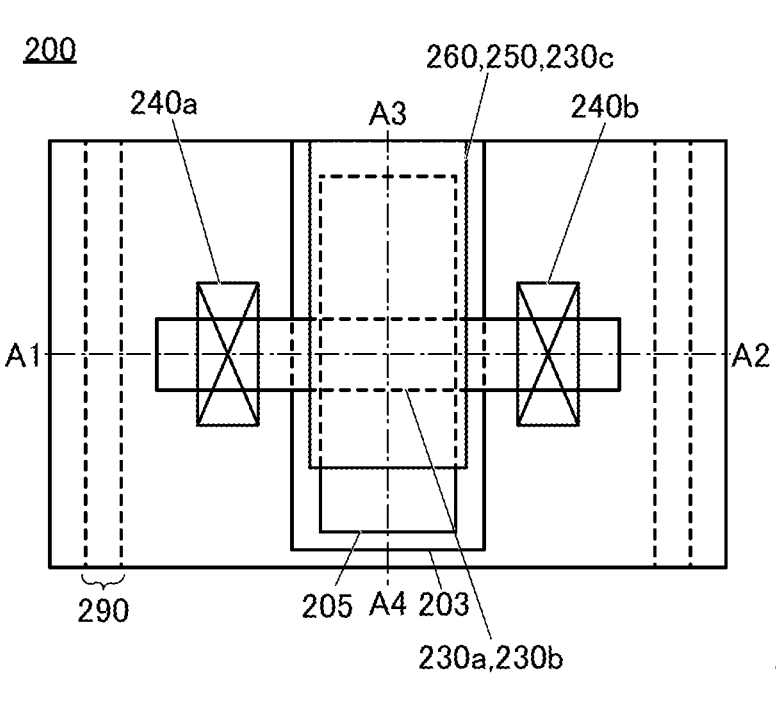
FIGS. 20A to 20C A top view and cross-sectional views of a semiconductor device of one embodiment of the present invention.
Figure 20C:
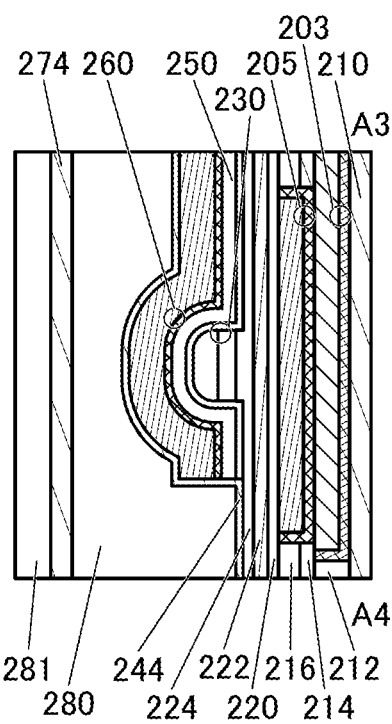
Figure 20B:
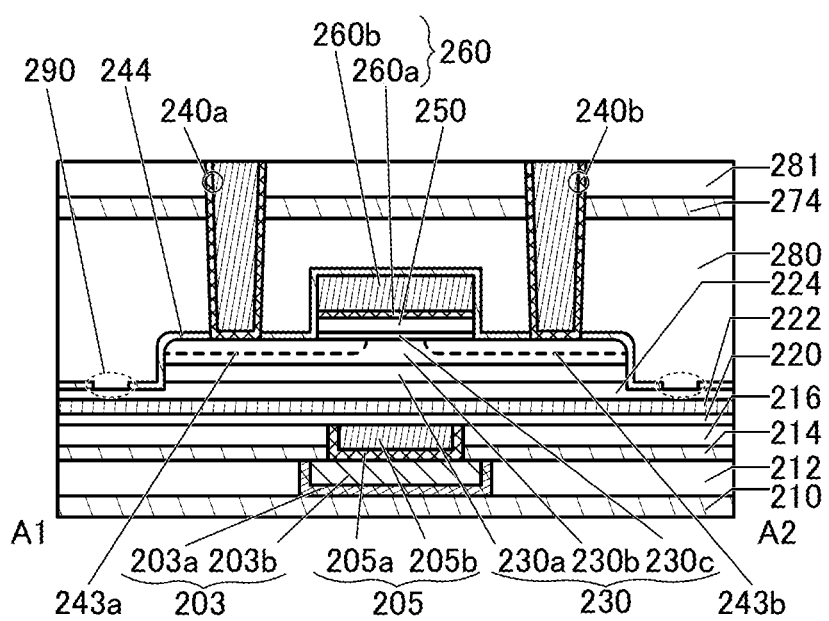

The transistor 200 illustrated in FIG. 20 is different from the transistor 200 illustrated in FIG. 1 in that the conductor 242 is not provided. In the transistor 200 illustrated in FIG. 20, the region 243 may be formed by adding as a dopant an element that can increase the carrier density of the oxide 230 and reduce the resistance thereof.

As the dopant, an element that forms an oxygen vacancy, an element that is bonded to an oxygen vacancy, or the like is used. Typical examples of the element include boron and phosphorus. Moreover, hydrogen, carbon, nitrogen, fluorine, sulfur, chlorine, titanium, a rare gas element, or the like may be used. Typical examples of a rare gas element include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above, boron and phosphorus are preferable as a dopant. In the case where boron or phosphorus is used as a dopant, manufacturing line apparatuses for amorphous silicon or low-temperature polysilicon can be used; thus, capital investment can be reduced. The concentration of the element is measured by SIMS or the like.

In particular, an element that easily forms an oxide is preferably used as an element to be added to the region 243. Typical examples of the element include boron, phosphorus, aluminum, and magnesium. The element added to the region 243 can deprive oxygen in the oxide 230 to form an oxide. As a result, many oxygen vacancies are generated in the region 243. When the oxygen vacancies and hydrogen in the oxide 230 are bonded to each other, carriers are generated, and accordingly, a region with extremely low resistance is formed. The element added to the region 243 exists in the state of a stable oxide in the region 243; thus, even when treatment that requires a high temperature is performed in a later step, the element is not easily released from the region 243. That is, the use of an element that easily forms an oxide as an element to be added to the region 243 enables formation of a region whose resistance is not easily increased even through a high-temperature process, in the oxide 230.

The formation of the region 243 functioning as the source region or the drain region in the oxide 230 enables the conductor 240 functioning as a plug to be connected to the region 243 without providing a source electrode and a drain electrode that are formed of metal.

In the case where the region 243 is formed by addition of a dopant, for example, a mask such as a resist mask or a hard mask is provided in a position to be the channel formation region of the transistor 200 and addition of a dopant is performed. In that case, the region 243 containing the element can be formed in a region of the oxide 230 that does not overlap with the mask.

As a method for adding a dopant, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, donor, acceptor, impurity, element, or the like.

By adding an element that forms an oxygen vacancy to the region 243 and performing heat treatment, hydrogen contained in the region 234 functioning as a channel formation region can be trapped by an oxygen vacancy included in the region 243, in some cases. Thus, the transistor 200 can have stable electrical characteristics and increased reliability.

According to one embodiment of the present invention, a semiconductor device with favorable reliability can be provided. According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with a low off-state current can be provided. According to one embodiment of the present invention, a semiconductor device with a high on-state current can be provided. According to one embodiment of the present invention, a semiconductor device with reduced power consumption can be provided. According to one embodiment of the present invention, a semiconductor device with high productivity can be provided.

The structure, composition, method, and the like described above in this embodiment can be used in appropriate combination with the structures, compositions, methods, and the like described in the other embodiments and an example.

Embodiment 2

In this embodiment, one mode of a semiconductor device that functions as a memory device and is different from one in the above embodiment is described with reference to FIG. 21 to FIG. 24.

<Memory Device 1>

Figure 21A:
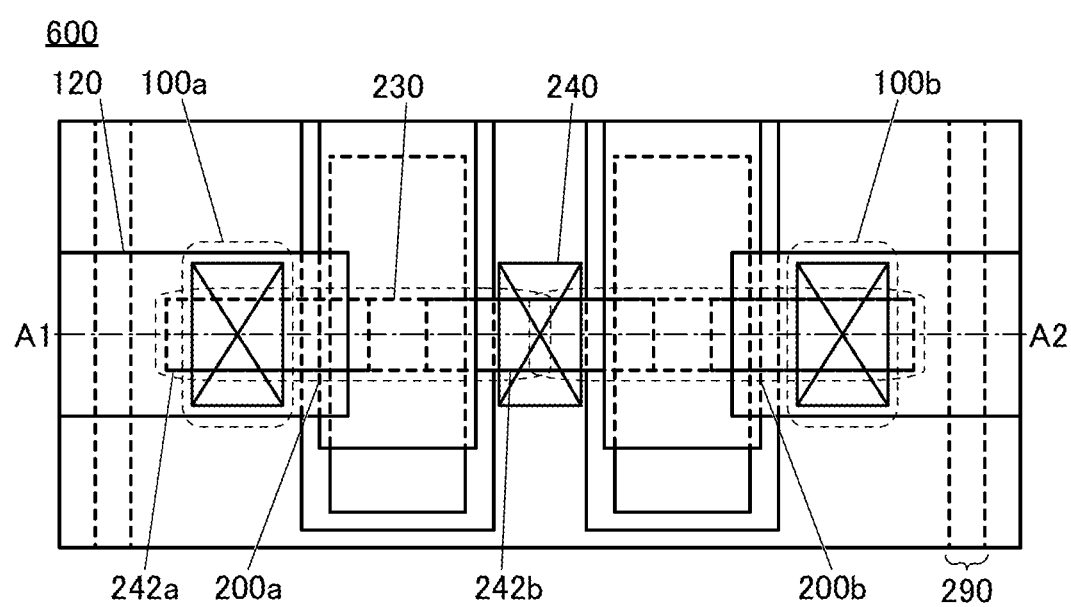
FIGS. 21A and 21B A top view and a cross-sectional view of a semiconductor device of one embodiment of the present invention.
Figure 21B:
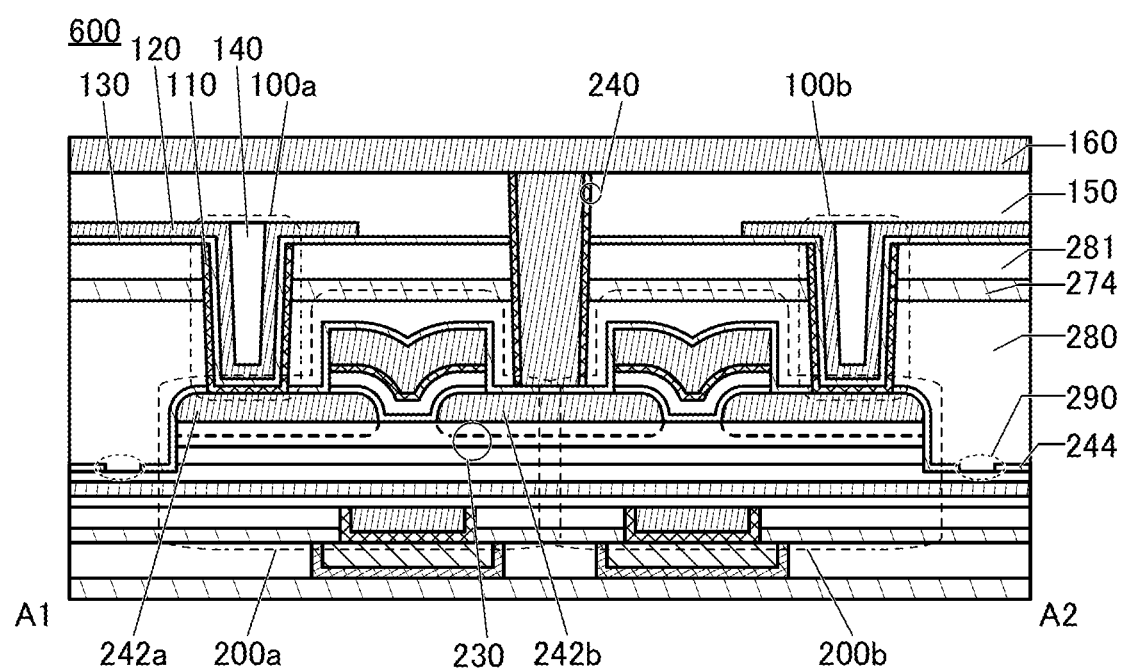

FIGS. 21(A) and 21(B) illustrate a cell 600 included in a memory device. The cell 600 includes a transistor 200a, a transistor 200b, a capacitor 100a, and a capacitor 100b. FIG. 21(A) is a top view of the cell 600. FIG. 21(B) is a cross-sectional view of a portion indicated by a dashed-dotted line A1-A2 in FIG. 21(A). Note that for simplification of the drawing, some components are not illustrated in the top view in FIG. 21(A).

The cell 600 includes the transistor 200a and the transistor 200b, includes the capacitor 100a overlapping with the transistor 200a, and includes the capacitor 100b overlapping with the transistor 200b. In the cell 600, the transistor 200a is positioned to be axisymmetric to the transistor 200b and the capacitor 100a is positioned to be axisymmetric to the capacitor 100b, in some cases. It is thus preferable that the transistor 200a and the transistor 200b have similar structures and the capacitor 100a and the capacitor 100b have similar structures.

An insulator 130 is provided over the insulator 281 over the transistor 200a and the transistor 200b, and an insulator 150 is provided over the insulator 130. Here, an insulator that can be used as the insulator 281 can be used as the insulator 150.

Furthermore, a conductor 160 is provided over the insulator 150. The conductor 240 is provided to be embedded in an opening formed in the insulator 280, the insulator 274, the insulator 281, the insulator 130, and the insulator 150. A bottom surface of the conductor 240 is in contact with the conductor 242b and the top surface of the conductor 240 is in contact with the conductor 160.

The transistor 200 described in the above embodiment can be used as the transistor 200a and the transistor 200b. Accordingly, the above description for the transistor 200 can be referred to for the structures of the transistor 200a and the transistor 200b. In FIGS. 21(A) and 21(B), reference numerals for the components of the transistor 200a and the transistor 200b are omitted. Note that the transistor 200a and the transistor 200b illustrated in FIGS. 21(A) and 21(B) are examples and the structures are not limited thereto; an appropriate transistor is used in accordance with a circuit configuration or a driving method.

Both the transistor 200a and the transistor 200b include the oxide 230, and one of a source and a drain of the transistor 200a and one of a source and a drain of the transistor 200b are both in contact with the conductor 242b. Thus, the one of the source and the drain of the transistor 200a and the one of the source and the drain of the transistor 200b are electrically connected to the conductor 240 through the conductor 242b. In this manner, the transistor 200a and the transistor 200b share a contact portion, which reduces the number of plugs and contact holes. Sharing a wiring electrically connected to one of the source and the drain can further reduce the area occupied by the memory cell array.

[Capacitor 100a and Capacitor 100b]

As illustrated in FIGS. 21(A) and 21(B), the capacitor 100a is provided in a region overlapping with the transistor 200a. In a similar manner, the capacitor 100b is provided in a region overlapping with the transistor 200b. Note that the capacitor 100b includes the components corresponding to the components of the capacitor 100a. The structure of the capacitor 100a is described in detail below, and unless otherwise specified, the description for the capacitor 100a can be referred to for the capacitor 100b.

The capacitor 100a includes a conductor 110, the insulator 130, and a conductor 120 over the insulator 130. Here, as the conductor 110 and the conductor 120, a conductor that can be used as the conductor 203, the conductor 205, the conductor 260, or the like can be used.

The capacitor 100a is formed in an opening of the insulator 244, the insulator 280, the insulator 274, and the insulator 281. At a bottom surface and a side surface of the opening, the conductor 110 functioning as a lower electrode and the conductor 120 functioning as an upper electrode face each other with the insulator 130 functioning as a dielectric interposed therebetween. Here, the conductor 110 of the capacitor 100a is formed in contact with the conductor 242a of the transistor 200a.

In particular, with the deeper opening of the insulator 280, the insulator 274, and the insulator 281, the capacitor 100a can have increased electrostatic capacitance without change in its projected area. Therefore, the capacitor 100a preferably has a cylinder shape (the side surface area is larger than the bottom surface area).

The above structure allows the electrostatic capacitance per unit area of the capacitor 100a to be high, which promotes miniaturization or higher integration of the semiconductor device. The electrostatic capacitance value of the capacitor 100a can be appropriately set by the thicknesses of the insulator 280, the insulator 274, and the insulator 281. Accordingly, a semiconductor device with high design flexibility can be provided.

An insulator having a high permittivity is preferably used as the insulator 130. For example, an insulator containing an oxide of one or both of aluminum and hafnium can be used. As the insulator containing an oxide of one or both of aluminum and hafnium, aluminum oxide, hafnium oxide, an oxide containing aluminum and hafnium (hafnium aluminate), or the like is preferably used.

The insulator 130 may have a stacked-layer structure; for example, a stacked-layer structure including two or more layers selected from silicon oxide, silicon oxynitride, silicon nitride oxide, silicon nitride, aluminum oxide, hafnium oxide, an oxide containing aluminum and hafnium (hafnium aluminate), and the like may be employed. For example, hafnium oxide, aluminum oxide, and hafnium oxide are preferably deposited in this order by an ALD method to obtain a stacked-layer structure. The thickness of each of the hafnium oxide and the aluminum oxide is greater than or equal to 0.5 nm and less than or equal to 5 nm. With such a stacked-layer structure, the capacitor 100a can have a large capacitance value and a low leakage current.

The conductor 110 or the conductor 120 may have a stacked-layer structure. For example, the conductor 110 or the conductor 120 may have a stacked-layer structure of a conductive material containing titanium, titanium nitride, tantalum, or tantalum nitride as its main component and a conductive material containing tungsten, copper, or aluminum as its main component. The conductor 110 or the conductor 120 may have a single-layer structure or a stacked-layer structure of three or more layers.

Furthermore, in the opening in which the capacitor 100a is formed, an insulator 140 is preferably formed inside the conductor 120. Here, an insulator that can be used as the insulator 281 can be used as the insulator 140. In addition, a top surface of the insulator 140 is preferably substantially aligned with a top surface of the conductor 120. However, the structure is not limited thereto; for example, the conductor 120 with a larger thickness may fill the opening, or the insulator 150 may be deposited in a state where an opening is formed inside the conductor 120 so as to fill the opening.

[Structure of Cell Array]

Next, an example of a cell array in which the above-described cells are arranged in a matrix is described with reference to FIG. 22 to FIG. 24.

Figure 22:
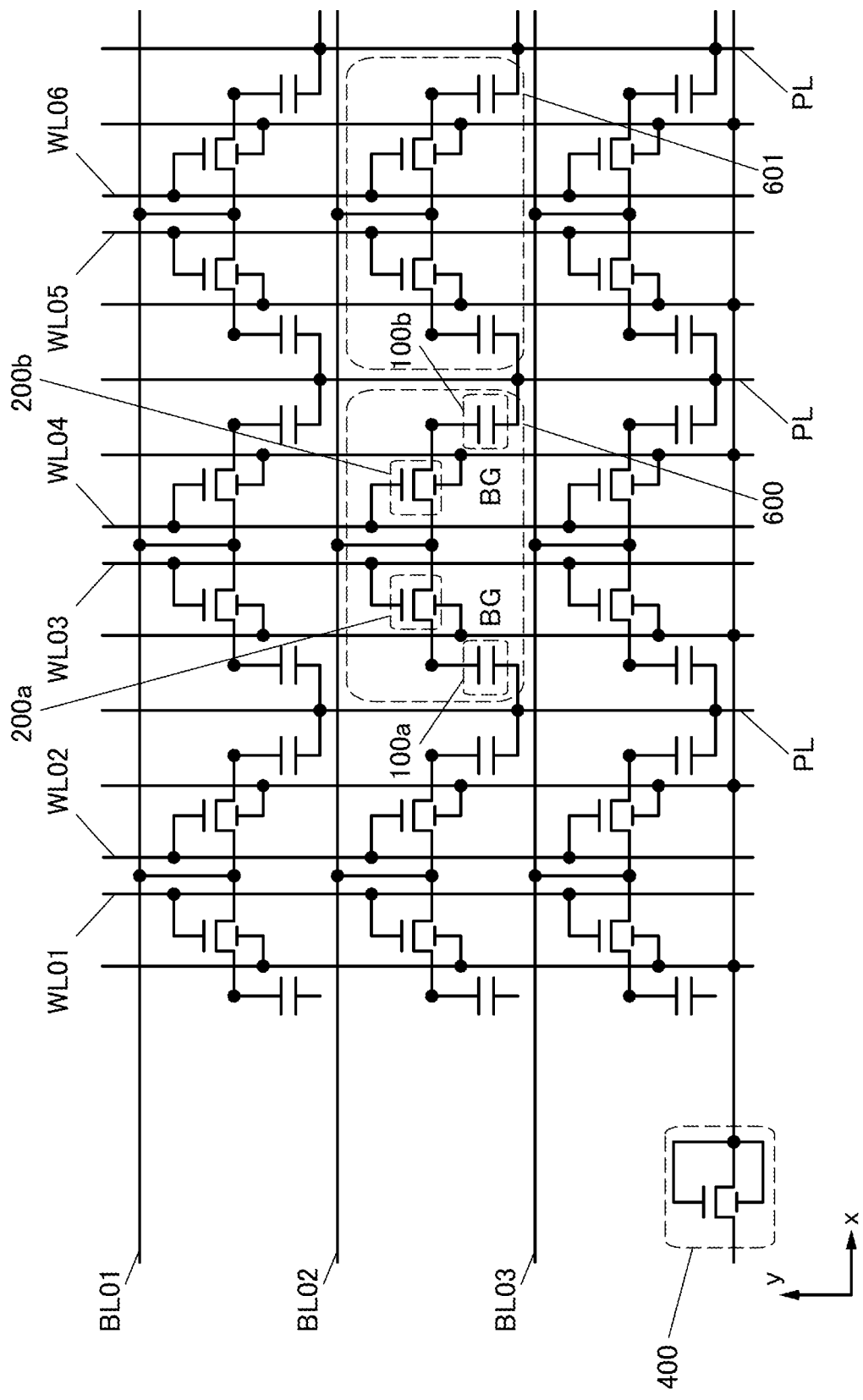
FIG. 22 A circuit diagram of a memory device of one embodiment of the present invention.

FIG. 22 is a circuit diagram showing one mode in which the cells illustrated in FIG. 21 are arranged in a matrix. FIG. 23 is a schematic view illustrating a cross-sectional structure of the cell 600 in the circuit diagram illustrated in FIG. 22, a cell 601 adjacent to the cell 600, and their vicinities. FIG. 24 is a schematic view illustrating a layout of a wiring WL and a wiring BL in the circuit diagram illustrated in FIG. 22 and the oxide 230. In FIG. 22 to FIG. 24, the extending direction of the wiring BL is the x-direction, the extending direction of the wiring WL is the y-direction, and the direction perpendicular to the x-y plane is the z-direction. Note that although FIG. 22 and FIG. 24 illustrate an example in which the cells are arranged in a 3×3 matrix, this embodiment is not limited thereto and the number and arrangement of the memory cells, the wirings, or the like included in the cell array are set as appropriate. Note that for simplification of the drawing, some components illustrated in FIG. 22 are not illustrated in the schematic view in FIG. 24.

As illustrated in FIG. 22, one of the source and the drain of each of the transistor 200a and the transistor 200b which are included in the cell is electrically connected to the common wiring BL (BL01, BL02, and BL03). Furthermore, the wiring BL is also electrically connected to one of the source and the drain of each of the transistor 200a and the transistor 200b included in each of the cells 600 arranged in the x-direction. A first gate of the transistor 200a and a first gate of the transistor 200b which are included in the cell 600 are electrically connected to different wirings WL (WL01 to WL06). Furthermore, these wirings WL are electrically connected to the first gates of the transistors 200a and the first gates of the transistors 200b which are included in the cells 600 arranged in the y-direction.

Furthermore, one electrode of the capacitor 100a and one electrode of the capacitor 100b in the cell 600 are electrically connected to wirings PL. For example, the wirings PL are formed to extend in the y-direction.

In addition, the transistor 200a and the transistor 200b which are included in the cell 600 may each be provided with a second gate BG. The threshold voltage of the transistor can be controlled by a potential applied to the BG. The BG is connected to a transistor 400 and the potential applied to the BG can be controlled by the transistor 400.

Figure 23:
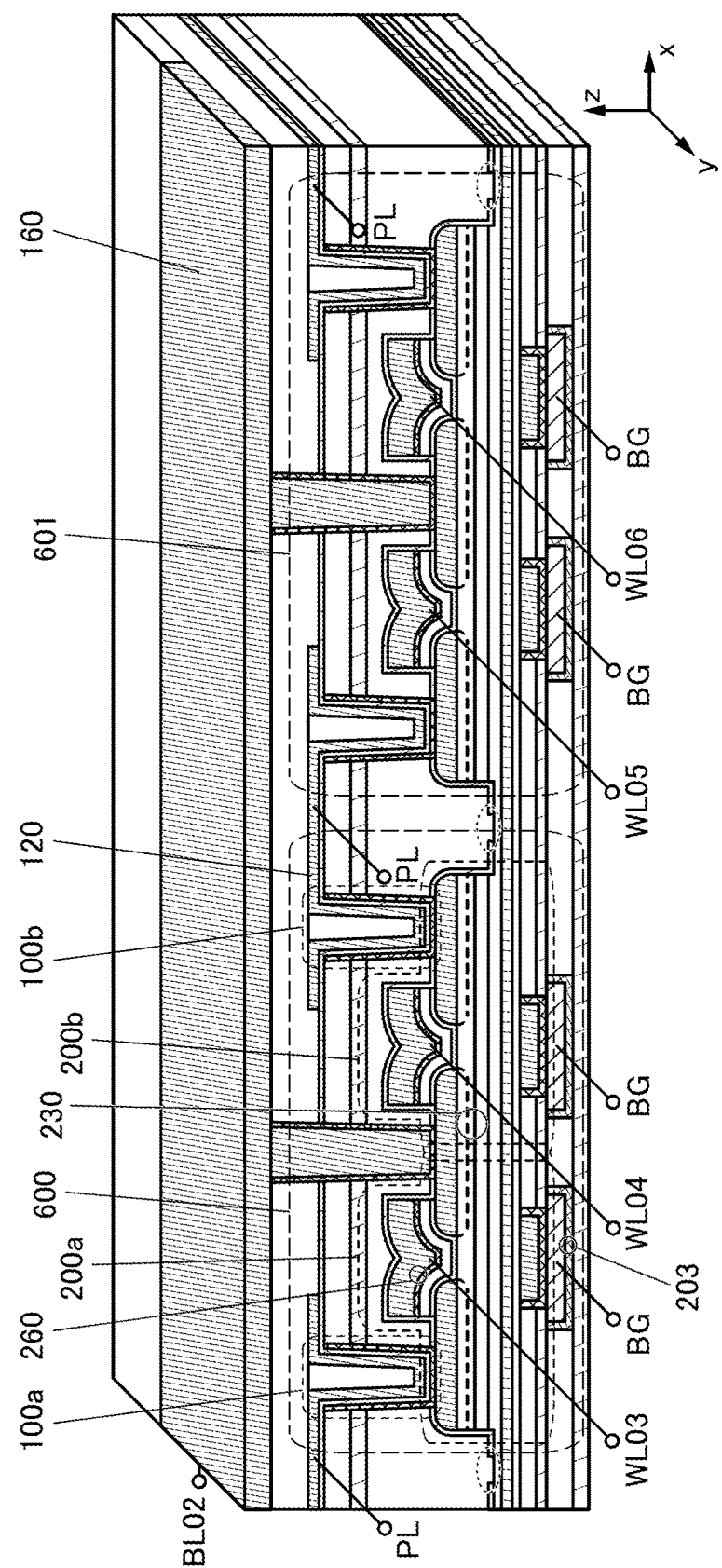
FIG. 23 A schematic view of a memory device of one embodiment of the present invention.

For example, as illustrated in FIG. 23, the conductor 160 extends in the x-direction to function as the wiring BL, the conductor 260 extends in the y-direction to function as the wiring WL, and the conductor 120 extends in the y-direction to function as the wiring PL. In addition, the conductor 203 may extend in the y-direction to function as a wiring connected to the BG.

As illustrated in FIG. 23, it is preferable that the conductor 120 functioning as the one electrode of the capacitor 100b in the cell 600 also function as the one electrode of a capacitor 100a in the cell 601. Furthermore, the conductor 120 functioning as the one electrode of the capacitor 100a in the cell 600 also functions as one electrode of a capacitor in the adjacent cell on the left side of the cell 600, although not illustrated. The cell on the right side of the cell 601 has a similar structure. Thus, a cell array can be formed. With this structure of the cell array, the space between the adjacent cells can be reduced; thus, the projected area of the cell array can be reduced and high integration can be achieved.

Figure 24:
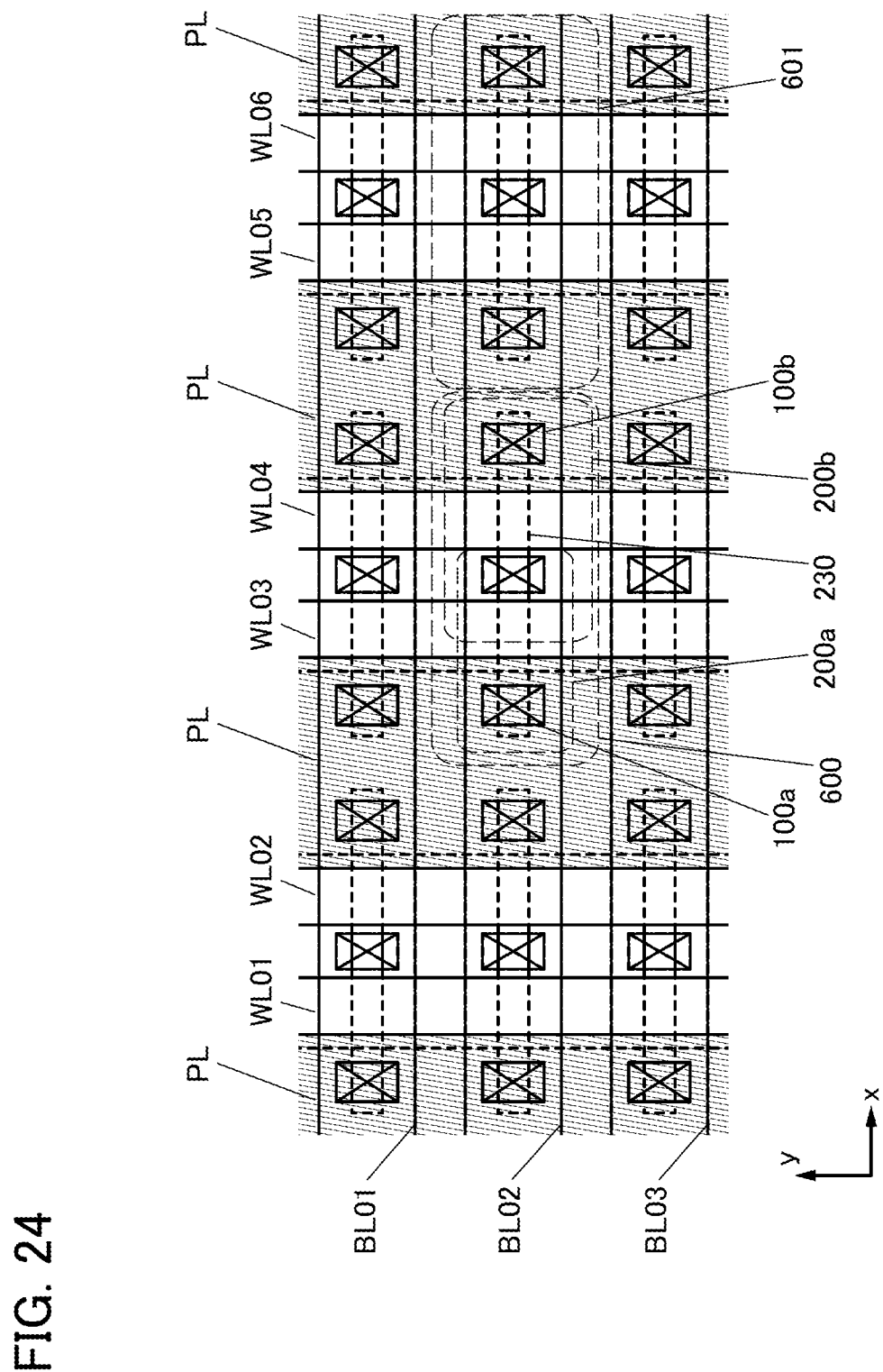
FIG. 24 A schematic view of a memory device of one embodiment of the present invention.

As illustrated in FIG. 24, the oxides 230 and the wirings WL are arranged in a matrix; thus, the semiconductor device of the circuit diagram illustrated in FIG. 22 can be formed. Here, the wirings BL are preferably provided in a layer different from the wirings WL and the oxides 230. Specifically, when the capacitor 100a and the capacitor 100b are provided below the wirings BL, a layout in which the long side direction of the oxide 230 and the wiring BL can be substantially parallel to each other can be achieved. Accordingly, the layout of the cell can be simplified, the design flexibility is increased, and the process cost can be reduced.

Although the oxides 230 and the wirings WL are provided such that the long sides of the oxides 230 are substantially perpendicular to the extending direction of the wirings WL in FIG. 24, the layout is not limited thereto. For example, a layout may be employed in which the long sides of the oxides 230 are positioned not perpendicular to the extending direction of the wirings WL and the long sides of the oxides 230 are inclined with respect to the extending direction of the wirings WL. The oxide 230 and the wiring WL are provided so that an angle between the long side of the oxide 230 and the wiring WL is preferably more than or equal to 20° and less than or equal to 70°, further preferably more than or equal to 30° and less than or equal to 60°.

Furthermore, stacked cell arrays may be used instead of the single-layer cell array. By stacking a plurality of cell arrays, the cells can be integrated without an increase in the area occupied by the cell arrays. That is, a 3D cell array can be formed.

As described above, according to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with a low off-state current can be provided. According to one embodiment of the present invention, a semiconductor device with a high on-state current can be provided. According to one embodiment of the present invention, a semiconductor device with favorable reliability can be provided. According to one embodiment of the present invention, a semiconductor device with reduced power consumption can be provided. According to one embodiment of the present invention, a semiconductor device with high productivity can be provided.

The structure, method, and the like described above in this embodiment can be used in appropriate combination with the structures, methods, and the like described in the other embodiments.

Embodiment 3

In this embodiment, one mode of a semiconductor device that functions as a memory device and is different from one in the above embodiment is described with reference to FIG. 25 to FIG. 27.

<Memory Device 2>

Figure 25:
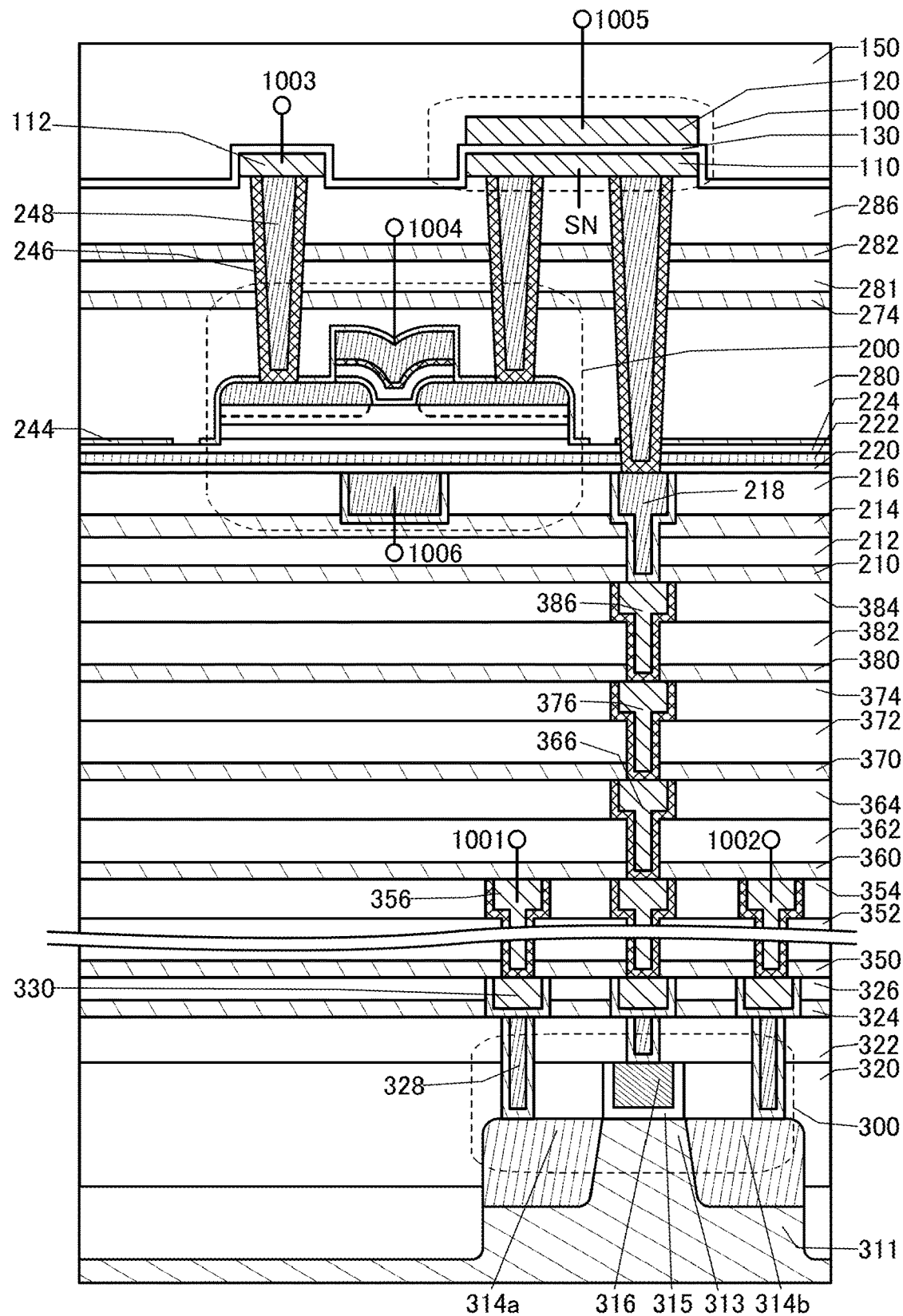
FIG. 25 A cross-sectional view illustrating a structure of a memory device of one embodiment of the present invention.
Figure 26:
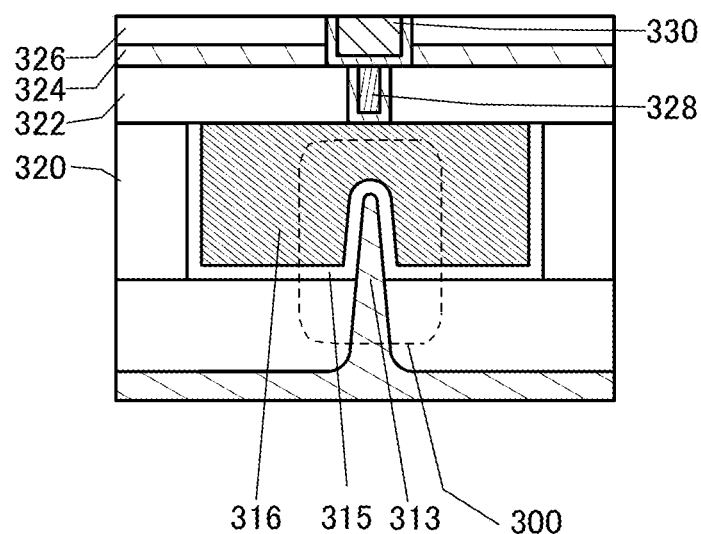
FIG. 26 A cross-sectional view illustrating a structure of a memory device of one embodiment of the present invention.
Figure 27:
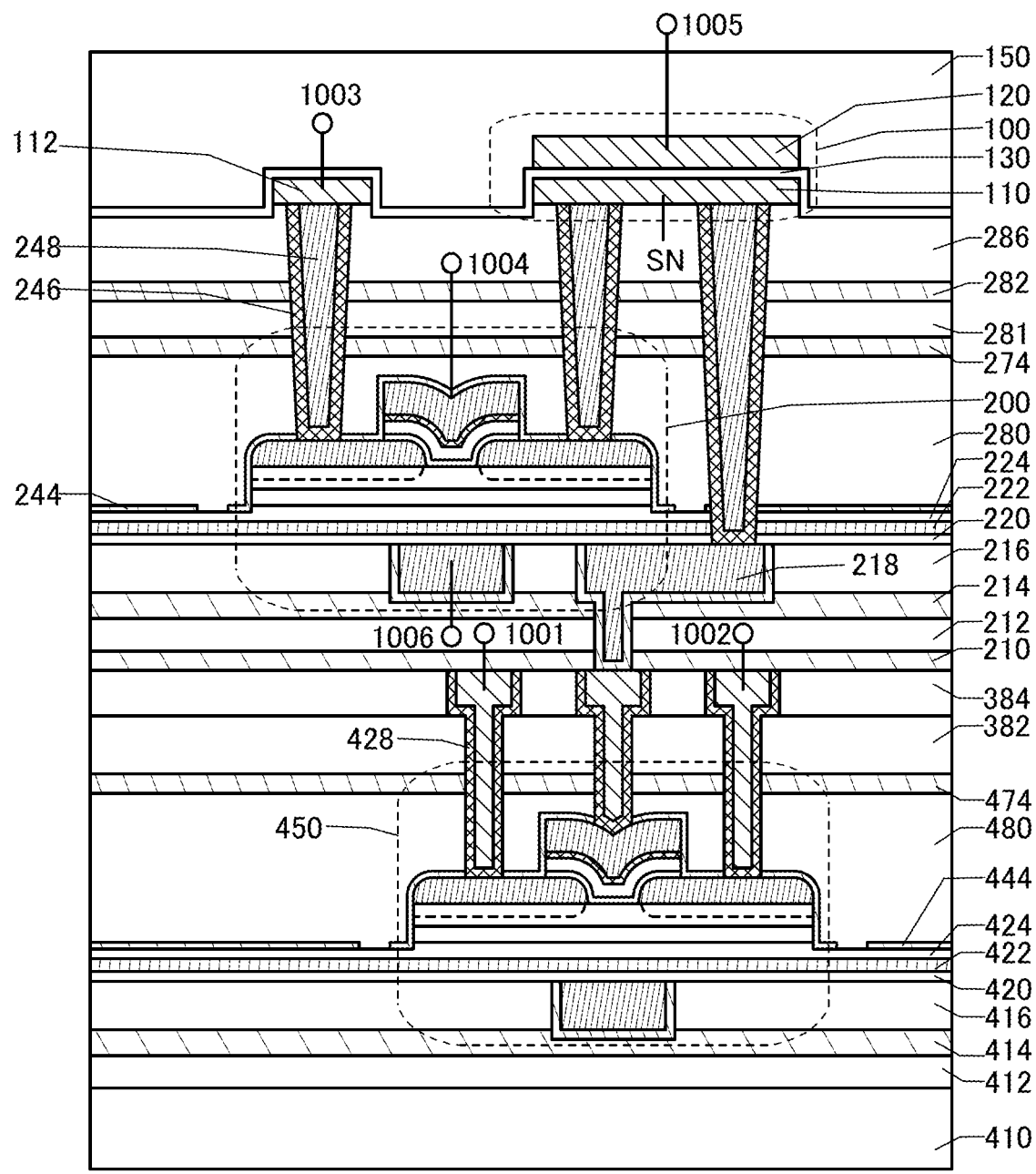
FIG. 27 A cross-sectional view illustrating a structure of a memory device of one embodiment of the present invention.

A memory device illustrated in FIG. 25 and FIG. 26 includes a transistor 300, the transistor 200, and a capacitor 100. FIG. 25 is a cross-sectional view of the transistor 200 and the transistor 300 in the channel length direction. FIG. 26 illustrates a cross-sectional view of the vicinity of the transistor 300 in the channel width direction of the transistor 300.

The transistor 200 is a transistor whose channel is formed in a semiconductor layer including an oxide semiconductor. Since the off-state current of the transistor 200 is low, a memory device including the transistor 200 can retain stored contents for a long time. In other words, refresh operation is not required or the frequency of the refresh operation is extremely low, which leads to a sufficient reduction in power consumption of the memory device.

In the memory device illustrated in FIG. 25 and FIG. 26, a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to a top gate of the transistor 200, and a wiring 1006 is electrically connected to a bottom gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The memory device illustrated in FIG. 25 and FIG. 26 has a feature that the potential of the gate of the transistor 300 can be retained and thus enables writing, retaining, and reading of data as follows.

Writing and retaining of data are described. First, the potential of the wiring 1004 is set to a potential at which the transistor 200 is brought into a conduction state, so that the transistor 200 is brought into a conduction state. Accordingly, the potential of the wiring 1003 is supplied to a node SN where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 1004 is set to a potential at which the transistor 200 is brought into a non-conduction state, so that the transistor 200 is brought into a non-conduction state. Thus, the charge is retained in the node SN (retaining).

In the case where the off-state current of the transistor 200 is low, the charge of the node SN is retained for a long time.

Next, reading of data is described. An appropriate potential (reading potential) is supplied to the wiring 1005 while a predetermined potential (constant potential) is supplied to the wiring 1001, whereby the potential of the wiring 1002 varies depending on the amount of charge retained in the node SN. This is because in the case of using an n-channel transistor as the transistor 300, an apparent threshold voltage $V_{th\_H}$ at the time when a high-level charge is supplied to the gate of the transistor 300 is lower than an apparent threshold voltage $V_{th\_L}$ at the time when a low-level charge is supplied to the gate of the transistor 300. Here, an apparent threshold voltage refers to the potential of the wiring 1005 which is needed to bring the transistor 300 into a conduction state. Thus, the potential of the wiring 1005 is set to a potential $V_0$ which is between $V_{th\_H}$ and $V_{th\_L}$, whereby the charge supplied to the node SN can be determined. For example, in the case where a high-level charge is supplied to the node SN in writing and the potential of the wiring 1005 is $V_0$ ($>V_{th\_H}$), the transistor 300 is brought into a conduction state. Meanwhile, in the case where a low-level charge is supplied to the node SN, the transistor 300 remains in a non-conduction state even when the potential of the wiring 1005 is $V_0$ ($<V_{th\_L}$). Thus, the data retained in the node SN can be read by determining the potential of the wiring 1002.

[0406]

Note that in the case where memory cells are arranged in an array, data of a desired memory cell needs to be read at the time of reading. For example, in the case where a memory cell array has a NOR-type structure, only data of a desired memory cell can be read by bringing the transistors 300 of memory cells from which data is not read into a non-conduction state. In that case, a potential at which the transistor 300 is brought into a non-conduction state regardless of the charge supplied to the node SN, that is, a potential lower than $V_{th\_H}$ is supplied to the wiring 1005 connected to the memory cells from which data is not read. Alternatively, in the case where a memory cell array has a NAND-type structure, for example, only data of a desired memory cell can be read by bringing the transistors 300 of memory cells from which data is not read into a conduction state. In that case, a potential at which the transistor 300 is brought into a conduction state regardless of the charge supplied to the node SN, that is, a potential higher than $V_{th\_L}$ is supplied to the wiring 1005 connected to the memory cells from which data is not read.

<Structure of Memory Device 2>

The memory device of one embodiment of the present invention includes the transistor 300, the transistor 200, and the capacitor 100 as illustrated in FIG. 25. The transistor 200 is provided above the transistor 300, and the capacitor 100 is provided above the transistor 300 and the transistor 200.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 26, a top surface and a side surface in the channel width direction of the semiconductor region 313 of the transistor 300 are covered with the conductor 316 with the insulator 315 therebetween. The effective channel width is increased in the FIN-type transistor 300, whereby the on-state characteristics of the transistor 300 can be improved. In addition, since contribution of the electric field of the gate electrode can be increased, the off-state characteristics of the transistor 300 can be improved.

The transistor 300 is of either a p-channel type or an n-channel type.

It is preferable that a region of the semiconductor region 313 where a channel is formed, a region in the vicinity thereof, the low-resistance region 314a and the low-resistance region 314b that function as the source region and drain region, and the like contain a semiconductor such as a silicon-based semiconductor, further preferably single crystal silicon. Alternatively, a material containing Ge (germanium), SiGe (silicon germanium), GaAs (gallium arsenide), GaAlAs (gallium aluminum arsenide), or the like may be contained. Silicon whose effective mass is adjusted by applying stress to the crystal lattice and thereby changing the lattice spacing may be contained. Alternatively, the transistor 300 may be an HEMT (High Electron Mobility Transistor) with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on a material of the conductor, the $V_{th}$ of the transistor can be adjusted by changing the material of the conductor. Specifically, it is preferable to use a material such as titanium nitride or tantalum nitride for the conductor. Furthermore, in order to ensure the conductivity and embeddability, it is preferable to use a stacked layer of metal materials such as tungsten and aluminum for the conductor. It is particularly preferable to use tungsten in terms of heat resistance.

Note that the transistor 300 illustrated in FIG. 25 is an example and the structure is not limited thereto; an appropriate transistor is used in accordance with a circuit configuration or a driving method.

An insulator 320, an insulator 322, an insulator 324, and an insulator 326 are stacked sequentially to cover the transistor 300.

For the insulator 320, the insulator 322, the insulator 324, and the insulator 326, for example, silicon oxide, silicon oxynitride, silicon nitride oxide, silicon nitride, aluminum oxide, aluminum oxynitride, aluminum nitride oxide, or aluminum nitride may be used.

The insulator 322 may have a function of a planarization film for eliminating a level difference caused by the transistor 300 or the like underlying the insulator 322. For example, a top surface of the insulator 322 may be planarized by planarization treatment using a chemical mechanical polishing (CMP) method or the like to improve planarity.

For the insulator 324, it is preferable to use a film having a barrier property that prevents hydrogen or impurities from being diffused from the substrate 311, the transistor 300, or the like into a region where the transistor 200 is provided.

For the film having a barrier property against hydrogen, silicon nitride formed by a CVD method can be used, for example. Here, the diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm², preferably less than or equal to $5 \times 10^{15}$ atoms/cm², in the TDS analysis at a film surface temperature of 50° C. to 500° C., for example.

Note that the permittivity of the insulator 326 is preferably lower than that of the insulator 324. For example, the relative permittivity of the insulator 326 is preferably lower than 4, further preferably lower than 3. Furthermore, for example, the relative permittivity of the insulator 326 is preferably 0.7 times or less, further preferably 0.6 times or less the relative permittivity of the insulator 324. When a material with a low permittivity is used for an interlayer film, the parasitic capacitance generated between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 have a function of a plug or a wiring. A plurality of conductors having a function of plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material for each of plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 25, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring. Note that the conductor 356 can be provided using a material similar to those for the conductor 328 and the conductor 330.

Note that for the insulator 350, like the insulator 324, an insulator having a barrier property against hydrogen is preferably used, for example. Furthermore, the conductor 356 preferably contains a conductor having a barrier property against hydrogen. In particular, the conductor having a barrier property against hydrogen is preferably formed in an opening portion of the insulator 350 having a barrier property against hydrogen. In such a structure, the transistor 300 and the transistor 200 can be separated by a barrier layer, so that the diffusion of hydrogen from the transistor 300 to the transistor 200 can be inhibited.

Note that as the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is ensured. In that case, the tantalum nitride layer having a barrier property against hydrogen preferably has a structure in which the tantalum nitride layer is in contact with the insulator 350 having a barrier property against hydrogen.

A wiring layer may be provided over the insulator 354 and the conductor 356. For example, in FIG. 25, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for the insulator 360, like the insulator 324, an insulator having a barrier property against hydrogen is preferably used, for example. Furthermore, the conductor 366 preferably contains a conductor having a barrier property against hydrogen. In particular, the conductor having a barrier property against hydrogen is preferably formed in an opening portion of the insulator 360 having a barrier property against hydrogen. In such a structure, the transistor 300 and the transistor 200 can be separated by a barrier layer, so that the diffusion of hydrogen from the transistor 300 to the transistor 200 can be inhibited.

A wiring layer may be provided over the insulator 364 and the conductor 366. For example, in FIG. 25, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for the insulator 370, like the insulator 324, an insulator having a barrier property against hydrogen is preferably used, for example. Furthermore, the conductor 376 preferably contains a conductor having a barrier property against hydrogen. In particular, the conductor having a barrier property against hydrogen is preferably formed in an opening portion of the insulator 370 having a barrier property against hydrogen. In such a structure, the transistor 300 and the transistor 200 can be separated by a barrier layer, so that the diffusion of hydrogen from the transistor 300 to the transistor 200 can be inhibited.

A wiring layer may be provided over the insulator 374 and the conductor 376. For example, in FIG. 25, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for the insulator 380, like the insulator 324, an insulator having a barrier property against hydrogen is preferably used, for example. Furthermore, the conductor 386 preferably contains a conductor having a barrier property against hydrogen. In particular, the conductor having a barrier property against hydrogen is preferably formed in an opening portion of the insulator 380 having a barrier property against hydrogen. In such a structure, the transistor 300 and the transistor 200 can be separated by a barrier layer, so that the diffusion of hydrogen from the transistor 300 to the transistor 200 can be inhibited.

Although the wiring layer including the conductor 356, the wiring layer including the conductor 366, the wiring layer including the conductor 376, and the wiring layer including the conductor 386 are described above, the memory device of this embodiment is not limited thereto. Three or less wiring layers which are similar to the wiring layer including the conductor 356 may be provided, or five or more wiring layers which are similar to the wiring layer including the conductor 356 may be provided.

The insulator 210, the insulator 212, the insulator 214, and the insulator 216 are stacked sequentially over the insulator 384. A substance having a barrier property against oxygen or hydrogen is preferably used for one of the insulator 210, the insulator 212, the insulator 214, and the insulator 216.

For example, for the insulator 210 and the insulator 214, it is preferable to use a film having a barrier property that prevents hydrogen or impurities from being diffused from the substrate 311, a region where the transistor 300 is provided, or the like into a region where the transistor 200 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which a small amount of hydrogen is released.

Furthermore, for the film having a barrier property against hydrogen, for example, for the insulator 210 and the insulator 214, a metal oxide such as aluminum oxide, hafnium oxide, or tantalum oxide is preferably used.

In particular, aluminum oxide has an excellent blocking effect that prevents the passage of both oxygen and impurities such as hydrogen and moisture which cause a change in electrical characteristics of the transistor. Accordingly, the use of aluminum oxide can prevent the entry of impurities such as hydrogen and moisture into the transistor 200 in and after a manufacturing process of the transistor. In addition, release of oxygen from the oxide contained in the transistor 200 can be prevented. Therefore, aluminum oxide is suitably used for a protective film of the transistor 200.

For the insulator 212 and the insulator 216, a material similar to that for the insulator 320 can be used, for example. When a material with a relatively low permittivity is used for an interlayer film, the parasitic capacitance generated between wirings can be reduced. A silicon oxide film, a silicon oxynitride film, or the like can be used for the insulator 212 and the insulator 216, for example.

A conductor 218, a conductor (the conductor 205) included in the transistor 200, and the like are embedded in the insulator 210, the insulator 212, the insulator 214, and the insulator 216. Note that the conductor 218 has a function of a plug or a wiring that is electrically connected to the capacitor 100 or the transistor 300. The conductor 218 can be provided using a material similar to those for the conductor 328 and the conductor 330.

In particular, part of the conductor 218 that is in contact with the insulator 210 and the insulator 214 is preferably a conductor having a barrier property against oxygen, hydrogen, and water, so that the transistor 300 and the transistor 200 can be separated by a layer having a barrier property against oxygen, hydrogen, and water. As a result, the diffusion of hydrogen from the transistor 300 to the transistor 200 can be inhibited.

The transistor 200 is provided over the insulator 216. Note that the structure of the transistor of the semiconductor device described in the above embodiment can be used as the structure of the transistor 200. Note that the transistor 200 illustrated in FIG. 25 is an example and the structure is not limited thereto; an appropriate transistor is used in accordance with a circuit configuration or a driving method.

The insulator 281 is provided over the transistor 200.

An insulator 282 is provided over the insulator 281. A substance having a barrier property against oxygen or hydrogen is preferably used for the insulator 282. Therefore, a material similar to that for the insulator 214 can be used for the insulator 282. For the insulator 282, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which cause a change in electrical characteristics of the transistor. Accordingly, the use of aluminum oxide can prevent the entry of impurities such as hydrogen and moisture into the transistor 200 in and after a manufacturing process of the transistor. In addition, release of oxygen from the oxide contained in the transistor 200 can be prevented. Therefore, aluminum oxide is suitably used for a protective film of the transistor 200.

An insulator 286 is provided over the insulator 282. For the insulator 286, a material similar to that for the insulator 320 can be used. When a material with a relatively low permittivity is used for an interlayer film, the parasitic capacitance generated between wirings can be reduced. For example, a silicon oxide film, a silicon oxynitride film, or the like can be used for the insulator 286.

A conductor 246, a conductor 248, and the like are embedded in the insulator 220, the insulator 222, the insulator 224, the insulator 244, the insulator 280, the insulator 274, the insulator 281, the insulator 282, and the insulator 286.

The conductor 246 and the conductor 248 have a function of plugs or wirings that are electrically connected to the capacitor 100, the transistor 200, or the transistor 300. The conductor 246 and the conductor 248 can be provided using a material similar to those for the conductor 328 and the conductor 330.

In addition, the capacitor 100 is provided above the transistor 200. The capacitor 100 includes the conductor 110, the conductor 120, and the insulator 130.

A conductor 112 may be provided over the conductor 246 and the conductor 248. The conductor 112 has a function of a plug or a wiring that is electrically connected to the capacitor 100, the transistor 200, or the transistor 300. The conductor 110 has a function of the electrode of the capacitor 100. The conductor 112 and the conductor 110 can be formed at the same time.

For the conductor 112 and the conductor 110, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 25; however, the structure is not limited thereto, and a stacked-layer structure of two or more layers may be employed. For example, between a conductor having a barrier property and a conductor having high conductivity, a conductor which is highly adhesive to the conductor having a barrier property and the conductor having high conductivity may be formed.

The conductor 120 is provided to overlap with the conductor 110 with the insulator 130 therebetween. Note that for the conductor 120, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material can be used.

The insulator 150 is provided over the conductor 120 and the insulator 130. The insulator 150 can be provided using a material similar to that for the insulator 320. The insulator 150 may function as a planarization film that covers an uneven shape thereunder.

The transistor 300 is not limited to a transistor provided on a semiconductor substrate. For example, as illustrated in FIG. 27, a transistor 450 may be used instead of the transistor 300. The transistor 450 has a structure similar to that of the transistor 200 and can be manufactured in a process similar to that of the transistor 200.

The transistor 450 is provided over an insulator 410 provided over a substrate (not illustrated). An insulator 412 can be formed using a material and a method similar to those for the insulator 212. Similarly, an insulator 414, an insulator 416, an insulator 420, an insulator 422, an insulator 424, an insulator 444, an insulator 480, and an insulator 474 can be provided using a material and a method similar to those for the insulator 214, the insulator 216, the insulator 220, the insulator 222, the insulator 224, the insulator 244, the insulator 280, and the insulator 274, respectively.

The conductor 110 which is the one electrode of the capacitor 100 is electrically connected to a gate of the transistor 450 through the conductor 246, the conductor 248, the conductor 218, the conductor 428, and the like. In the transistor 450, the description of the same portions as those in the transistor 200 is omitted.

With the use of the structure, a change in electrical characteristics can be inhibited and reliability can be improved in a semiconductor device using a transistor including an oxide semiconductor. A semiconductor device including an oxide semiconductor with a high on-state current can be provided. A semiconductor device including an oxide semiconductor with a low off-state current can be provided. A semiconductor device with reduced power consumption can be provided. A semiconductor device using a transistor including an oxide semiconductor can be miniaturized or highly integrated.

The structure, composition, method, and the like described above in this embodiment can be used in appropriate combination with the structures, compositions, methods, and the like described in the other embodiments and an example.

Embodiment 4

In this embodiment, a NOSRAM will be described as an example of a memory device of one embodiment of the present invention that includes a transistor in which an oxide is used for a semiconductor (hereinafter referred to as an OS transistor) and a capacitor with reference to FIG. 28 to FIG. 30. A NOSRAM (registered trademark) is an abbreviation of "Nonvolatile Oxide Semiconductor RAM", which indicates a RAM including a gain cell (2T or 3T) memory cell. Note that hereinafter, a memory device including an OS transistor, such as a NOSRAM, is referred to as an OS memory in some cases.

A memory device in which OS transistors are used in memory cells (hereinafter referred to as an "OS memory") is used in a NOSRAM. The OS memory is a memory including at least a capacitor and an OS transistor that controls charging and discharging of the capacitor. The OS memory has excellent retention characteristics because the OS transistor has an extremely low off-state current and thus can function as a nonvolatile memory.

<<NOSRAM 1600>>

Figure 28:
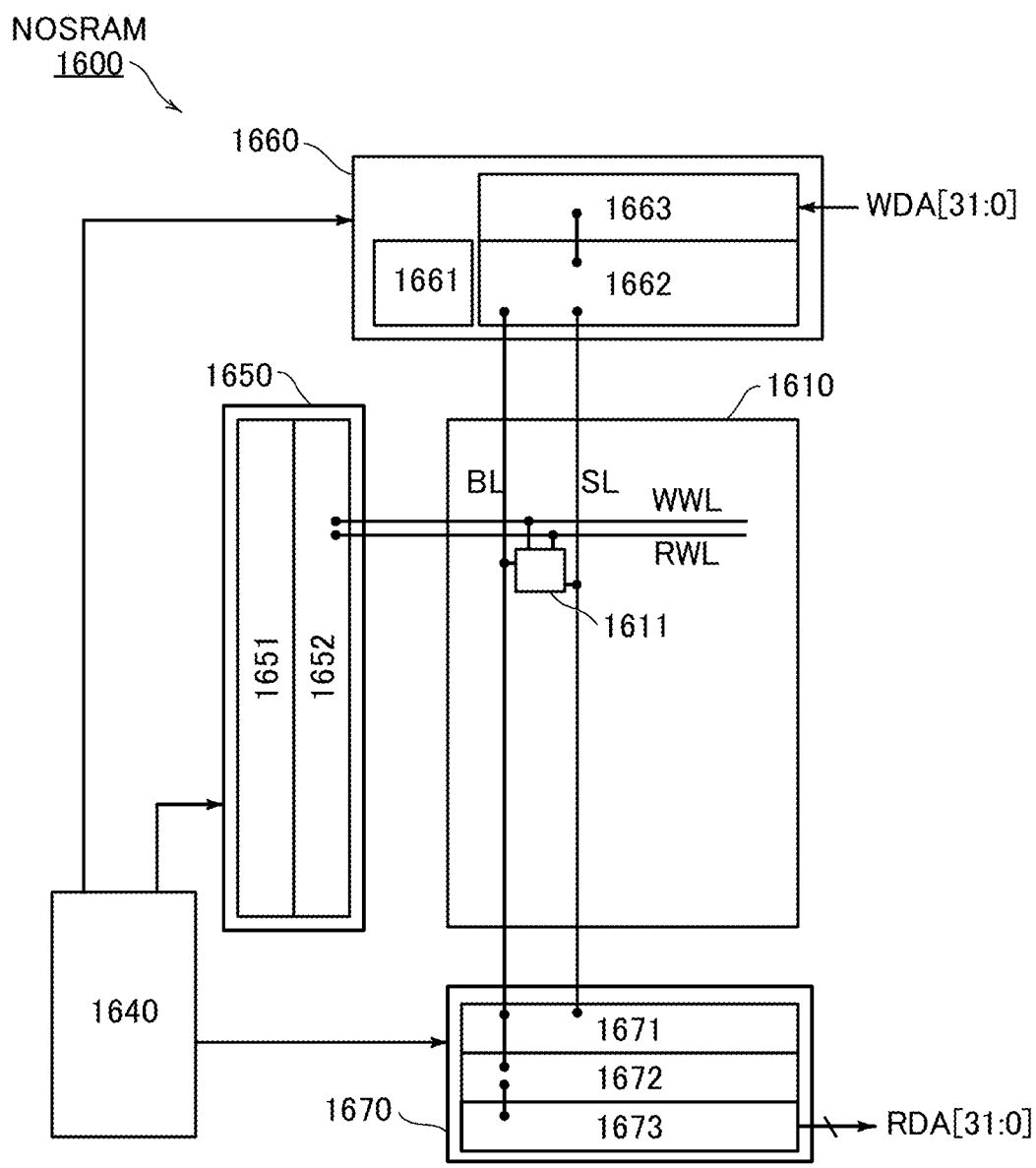
FIG. 28 A block diagram illustrating a configuration example of a memory device of one embodiment of the present invention.

FIG. 28 illustrates a configuration example of a NOSRAM. A NOSRAM 1600 illustrated in FIG. 28 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL, a plurality of word lines RWL, bit lines BL, and source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole and writes data WDA[31:0] and reads data RDA[31:0]. The controller 1640 processes command signals from the outside (e.g., a chip enable signal and a write enable signal) to generate control signals of the row driver 1650, the column driver 1660, and the output driver 1670.

The row driver 1650 has a function of selecting a row to be accessed. The row driver 1650 includes a row decoder 1651 and a word line driver 1652.

The column driver 1660 drives the source lines SL and the bit lines BL. The column driver 1660 includes a column decoder 1661, a write driver 1662, and a DAC (digital-analog converter circuit) 1663.

The DAC 1663 converts 3-bit digital data into an analog voltage. The DAC 1663 converts 32-bit data WDA[31:0] into an analog voltage per 3 bits.

The write driver 1662 has a function of precharging the source lines SL, a function of bringing the source lines SL into an electrically floating state, a function of selecting a source line SL, a function of inputting a writing voltage generated in the DAC 1663 to the selected source line SL, a function of precharging the bit lines BL, a function of bringing the bit lines BL into an electrically floating state, and the like.

The output driver 1670 includes a selector 1671, an ADC (analog-digital converter circuit) 1672, and an output buffer 1673. The selector 1671 selects a source line SL to be accessed and transmits the potential of the selected source line SL to the ADC 1672. The ADC 1672 has a function of converting an analog voltage into 3-bit digital data. The potential of the source line SL is converted into 3-bit data in the ADC 1672, and the output buffer 1673 retains the data output from the ADC 1672.

Note that the configuration of the row driver 1650, the column driver 1660, and the output driver 1670 described in this embodiment is not limited to the above. The arrangement of the drivers and wirings connected to the drivers may be changed or the functions of the drivers and the wirings connected to the drivers may be changed or added, depending on the configuration, the driving method, or the like of the memory cell array 1610. For example, the bit lines BL may have part of a function of the source lines SL.

Note that although the amount of data retained in each of the memory cells 1611 is 3 bits in the above description, the structure of the memory device described in this embodiment is not limited thereto. The amount of data retained in each of the memory cells 1611 may be 2 bits or less or 4 bits or more. In the case where the amount of data retained in each of the memory cells 1611 is one bit, for example, the DAC 1663 and the ADC 1672 are not necessarily provided.

<Memory Cell 1611 to Memory Cell 1614>

Figure 29A:
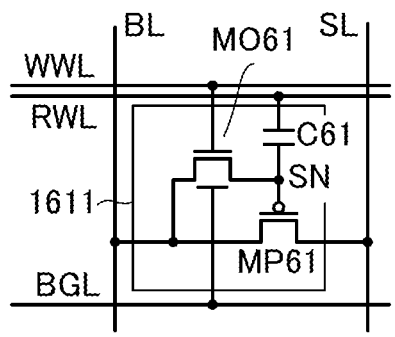
FIGS. 29A to 29E Circuit diagrams illustrating configuration examples of a memory device of one embodiment of the present invention.

FIG. 29(A) is a circuit diagram showing a configuration example of the memory cell 1611. The memory cell 1611 is a 2T gain cell and the memory cell 1611 is electrically connected to the word line WWL, the word line RWL, the bit line BL, the source line SL, and a wiring BGL. The memory cell 1611 includes the node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for retaining the potential of the node SN. The node SN is a node for data retaining and corresponds to a gate of the transistor MP61 here.

The write transistor of the memory cell 1611 is formed using the OS transistor MO61; thus, the NOSRAM 1600 can retain data for a long time.

Figure 29B:
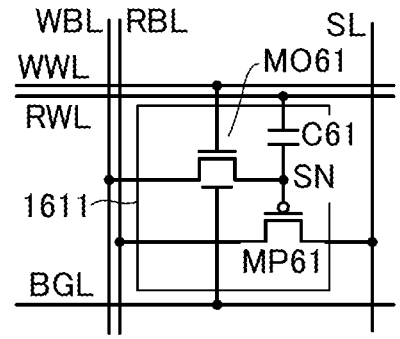

In the example of FIG. 29(A), a common bit line is used for writing and reading; however, as illustrated in FIG. 29(B), a bit line WBL functioning as a write bit line and a bit line RBL functioning as a read bit line may be provided.

Figure 29C:
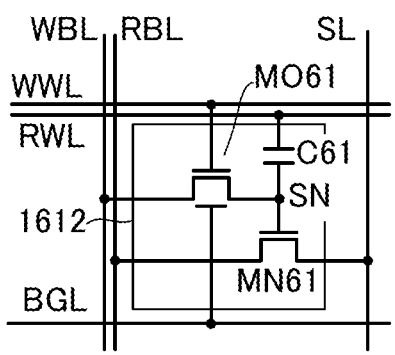
Figure 29D:
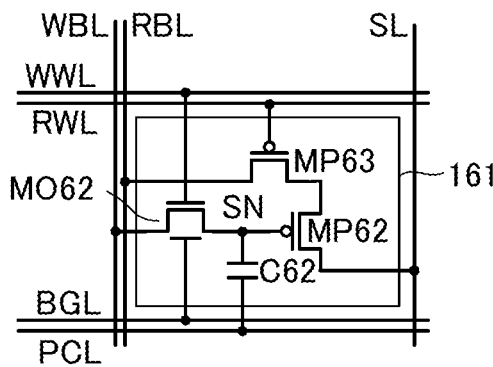
Figure 29E:
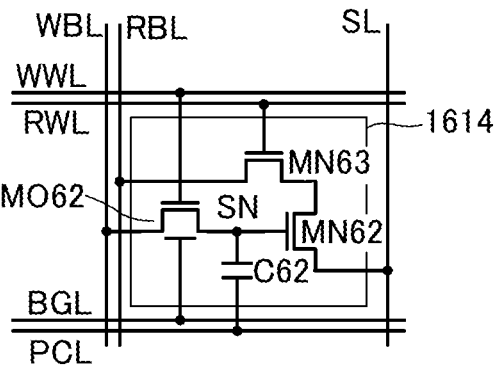

FIG. 29(C) to FIG. 29(E) show other configuration examples of the memory cell. FIG. 29(C) to FIG. 29(E) show examples where the write bit line WBL and the read bit line RBL are provided; however, as in FIG. 29(A), a bit line shared in writing and reading may be provided.

A memory cell 1612 illustrated in FIG. 29(C) is a modification example of the memory cell 1611 where the read transistor is changed into an n-channel transistor (MN61). The transistor MN61 may be an OS transistor or a Si transistor.

In the memory cell 1611 and the memory cell 1612, the OS transistor MO61 may be an OS transistor with no bottom gate.

A memory cell 1613 illustrated in FIG. 29(D) is a 3T gain cell and is electrically connected to the word lines WWL and RWL, the bit line WBL, the bit line RBL, the source line SL, the wirings BGL, and wirings PCL. The memory cell 1613 includes the node SN, an OS transistor MO62, a transistor MP62, a transistor MP63, and a capacitor C62. The OS transistor MO62 is a write transistor. The transistor MP62 is a read transistor and the transistor MP63 is a selection transistor.

A memory cell 1614 illustrated in FIG. 29(E) is a modification example of the memory cell 1613 where the read transistor and the selection transistor are changed into n-channel transistors (a transistor MN62 and a transistor MN63). The transistor MN62 and the transistor MN63 may be OS transistors or Si transistors.

The OS transistors provided in the memory cell 1611 to the memory cell 1614 may each be a transistor with no bottom gate or a transistor with a bottom gate.

A so-called NOR memory device in which the memory cells 1611 or the like are connected in parallel is described above, but the memory device of this embodiment is not limited thereto. For example, a so-called NAND memory device in which memory cells 1615 described below are connected in series may be provided.

Figure 30:
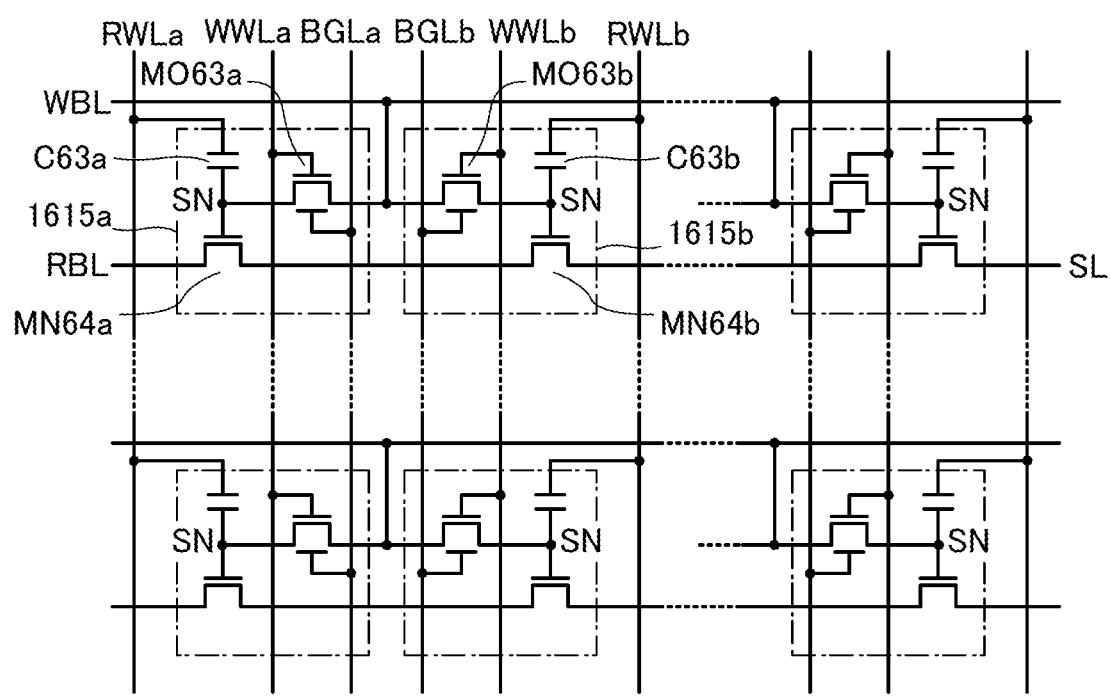
FIG. 30 A circuit diagram illustrating a configuration example of a memory device of one embodiment of the present invention.

FIG. 30 is a circuit diagram showing a configuration example of the NAND memory cell array 1610. The memory cell array 1610 illustrated in FIG. 30 includes the source line SL, the bit line RBL, the bit line WBL, the word line WWL, the word line RWL, the wiring BGL, and the memory cell 1615. The memory cell 1615 includes the node SN, an OS transistor MO63, a transistor MN64, and a capacitor C63. Here, the transistor MN64 is an n-channel Si transistor, for example. The transistor MN64 is not limited thereto and may be a p-channel Si transistor or an OS transistor.

A memory cell 1615*a* and a memory cell 1615*b*, which are illustrated in FIG. 30, are described below as examples. Here, the letter "a" or "b" is added to the reference numerals of the wirings and circuit elements connected to the memory cell 1615*a* or the memory cell 1615*b*.

In the memory cell 1615*a*, a gate of a transistor MN64*a*, one of a source and a drain of an OS transistor MO63*a*, and one electrode of a capacitor C63*a* are electrically connected to each other. The bit line WBL and the other of the source and the drain of the OS transistor MO63*a* are electrically connected to each other. A word line WWLa and a gate of the OS transistor MO63*a* are electrically connected to each other. A wiring BGLa and a bottom gate of the OS transistor MO63*a* are electrically connected to each other. A word line RWLa and the other electrode of the capacitor C63*a* are electrically connected to each other.

The memory cell 1615*b* can be provided to be symmetric to the memory cell 1615*a* with the use of a contact portion to the bit line WBL as a symmetry axis. Therefore, circuit elements of the memory cell 1615*b* are connected to wirings in a manner similar to that for the memory cell 1615*a*.

A source of the transistor MN64a of the memory cell 1615a is electrically connected to a drain of a transistor MN64b of the memory cell 1615b. A drain of the transistor MN64a of the memory cell 1615a is electrically connected to the bit line RBL. A source of the transistor MN64b of the memory cell 1615b is electrically connected to the source line SL through the transistors MN64 of the plurality of memory cells 1615. As described here, the plurality of transistors MN64 are connected in series between the bit line RBL and the source line SL in the NAND memory cell array 1610.

In a memory device including the memory cell array 1610 illustrated in FIG. 30, writing operation and reading operation are performed for every plurality of memory cells (hereinafter referred to as a memory cell column) connected to the same word line WWL (or the word line RWL). For example, the writing operation can be performed as follows. A potential at which the OS transistor MO63 is turned on is supplied to the word line WWL connected to a memory cell column on which writing is to be performed so that the OS transistors MO63 in the memory cell column on which writing is to be performed are turned on. Accordingly, the potential of the bit line WBL is supplied to the gates of the transistors MN64 and one electrode of the capacitors C63 in the selected memory cell column, whereby a predetermined charge is supplied to the gates. After that, when the OS transistors MO63 in the memory cell column are turned off, the predetermined charge supplied to the gates can be retained. Thus, data can be written to the memory cells 1615 in the selected memory cell column.

For example, the reading operation can be performed as follows. First, a potential at which the transistor MN64 is turned on is supplied to the word lines RWL not connected to a memory cell column on which reading is to be performed regardless of a charge supplied to the gates of the transistors MN64, so that the transistors MN64 in memory cell columns other than the memory cell column on which reading is to be performed are turned on. Then, a potential (reading potential) at which an on state or an off state of the transistor MN64 is selected is supplied to the word line RWL connected to the memory cell column on which reading is to be performed in accordance with a charge of the gates of the transistors MN64. After that, a constant potential is supplied to the source line SL and a reading circuit connected to the bit line RBL is operated. Here, the plurality of transistors MN64 between the source line SL and the bit line RBL are turned on except the transistor MN64 in the memory cell column on which reading is to be performed; therefore, the conductance between the source line SL and the bit line RBL depends on the state (an on state or an off state) of the transistor MN64 in the memory cell column on which reading is to be performed. Since the conductance of the transistor varies depending on the charge of the gate of the transistor MN64 in the memory cell column on which reading is to be performed, the potential of the bit line RBL varies accordingly. By reading the potential of the bit line RBL with the reading circuit, data can be read from the memory cell 1615 in the selected memory cell column.

There is theoretically no limitation on the number of rewriting operations of the NOSRAM 1600 because data is rewritten by charging and discharging of the capacitor C61, the capacitor C62, or the capacitor C63; and data can be written and read with low energy. Furthermore, since data can be retained for a long time, the refresh rate can be reduced.

In the case where the semiconductor device described in the above embodiment is used for the memory cell 1611, the memory cell 1612, the memory cell 1613, the memory cell 1614, and the memory cell 1615, the transistors 200 can be used as the OS transistor MO61, the OS transistor MO62, and the OS transistor MO63, the capacitors 100 can be used as the capacitor C61, the capacitor C62, and the capacitor C63, and the transistors 300 can be used as the transistor MP61, the transistor MP62, the transistor MP63, the transistor MN61, the transistor MN62, the transistor MN63, and the transistor MN64. Thus, the area occupied by one set consisting of a transistor and a capacitor can be reduced when seen from the above, so that the memory device of this embodiment can be further highly integrated. As a result, storage capacity per unit area of the memory device of this embodiment can be increased.

The structure described in this embodiment can be used in an appropriate combination with the structures described in the other embodiments and an example.

Embodiment 5

In this embodiment, a DOSRAM will be described as an example of the memory device of one embodiment of the present invention that includes an OS transistor and a capacitor, with reference to FIG. 31 and FIG. 32. A DOSRAM (registered trademark) is an abbreviation of "Dynamic Oxide Semiconductor RAM", which indicates a RAM including a 1T (transistor) 1C (capacitor) memory cell. As in the NOSRAM, an OS memory is used in the DOSRAM.

<<DOSRAM 1400>>

Figure 31:
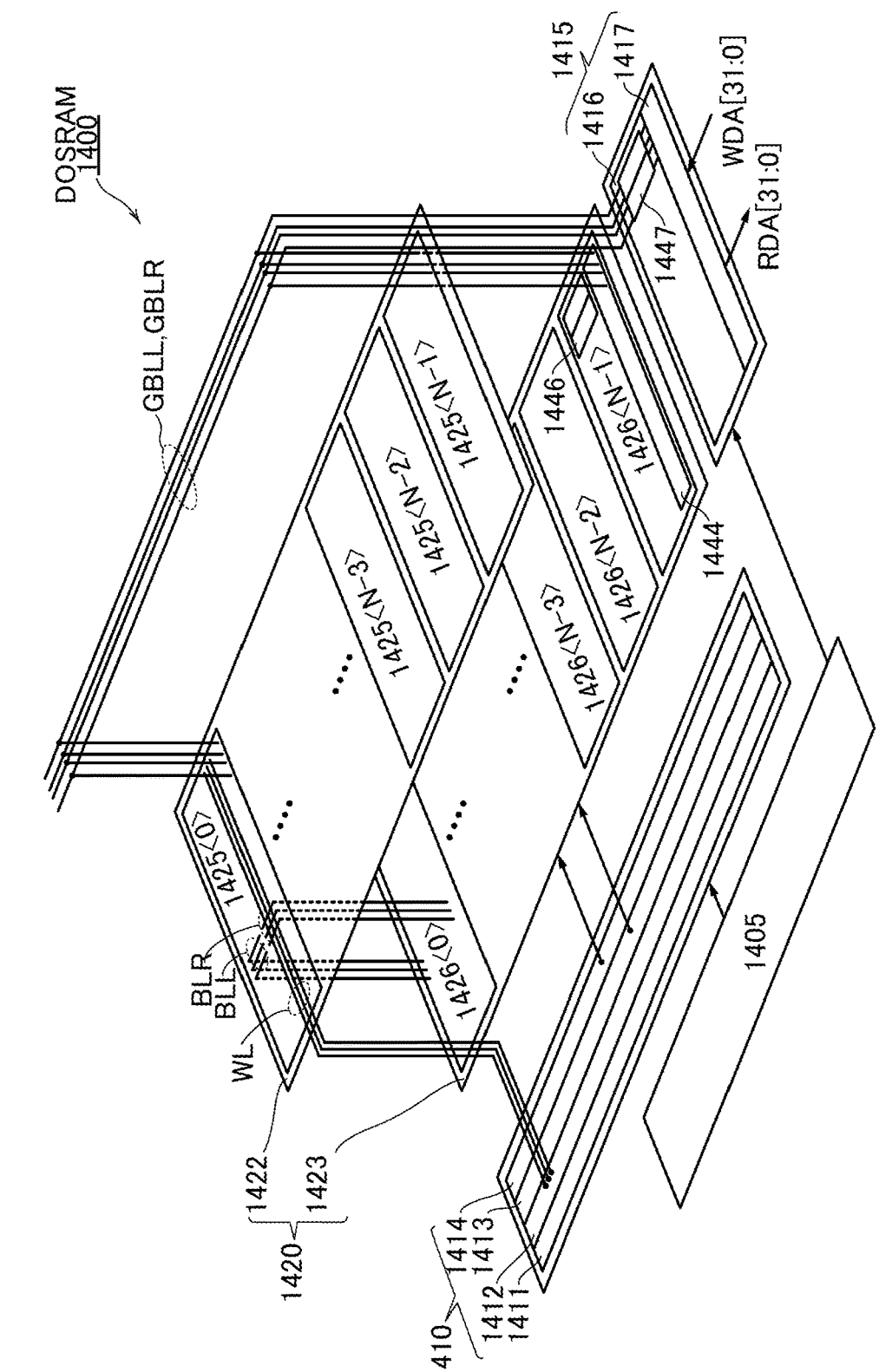
FIG. 31 A block diagram illustrating a configuration example of a memory device of one embodiment of the present invention.

FIG. 31 illustrates a configuration example of a DOSRAM. As shown in FIG. 31, a DOSRAM 1400 includes a controller 1405, a row circuit 1410, a column circuit 1415, and a memory cell and sense amplifier array 1420 (hereinafter referred to as an "MC-SA array 1420").

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit line GBLL and the global bit line GBLR are stacked over the memory cell array 1422. The DOSRAM 1400 adopts, as the bit-line structure, a hierarchical bit line structure hierarchized with local bit lines and global bit lines.

Figure 32A:
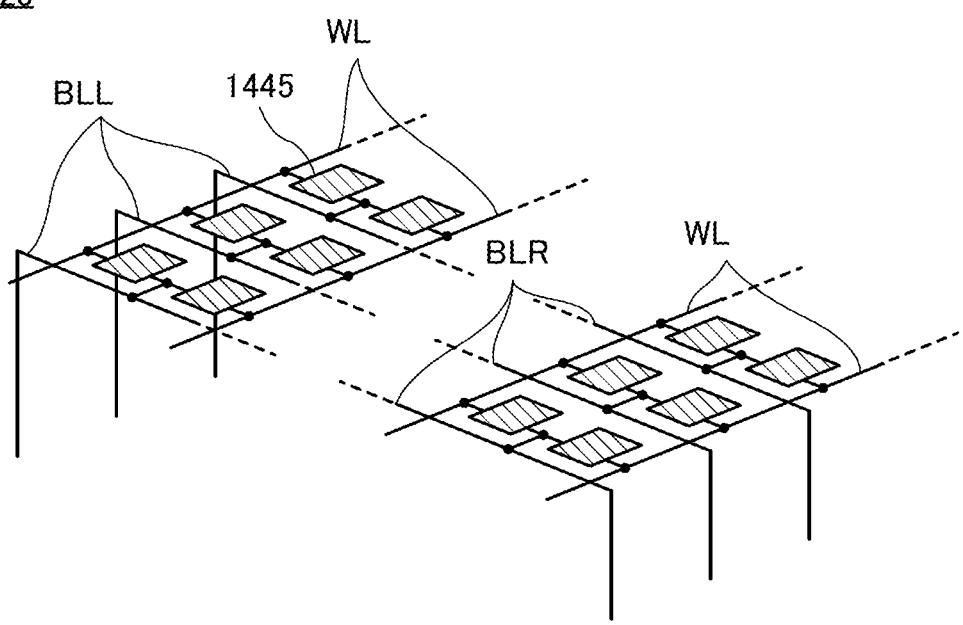
FIGS. 32A and 32B A block diagram and a circuit diagram illustrating a configuration example of a memory device of one embodiment of the present invention.

The memory cell array 1422 includes N (N is an integer greater than or equal to 2) local memory cell arrays 1425<0> to 1425<N−1>. FIG. 32(A) illustrates a configuration example of the local memory cell array 1425. The local memory cell array 1425 includes a plurality of memory cells 1445, a plurality of word lines WL, a plurality of bit lines BLL, and a plurality of bit lines BLR. In the example of FIG. 32(A), the local memory cell array 1425 has an open bit-line architecture but may have a folded bit-line architecture.

Figure 32B:
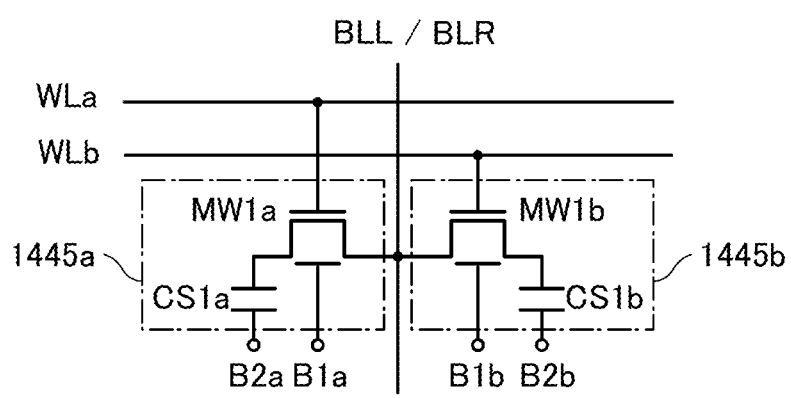

FIG. 32(B) illustrates a circuit configuration example of a pair of memory cells 1445a and 1445b connected to the same bit line BLL (bit line BLR). The memory cell 1445a includes a transistor MW1a, a capacitor CS1a, a terminal B1a, and a terminal B2a, and is connected to a word line WLa and the bit line BLL (bit line BLR). The memory cell

1445b includes a transistor MW1b, a capacitor CS1b, a terminal B1b, and a terminal B2b, and is connected to a word line WLb and the bit line BLL (bit line BLR). Note that hereinafter, in the case where either the memory cell 1445a or the memory cell 1445b is not particularly limited, reference numerals without the letter "a" or "b" are used for the memory cell 1445 and its components, in some cases.

The transistor MW1a has a function of controlling charging and discharging of the capacitor CS1a, and the transistor MW1b has a function of controlling charging and discharging of the capacitor CS1b. A gate of the transistor MW1a is electrically connected to the word line WLa, a first terminal is electrically connected to the bit line BLL (bit line BLR), and a second terminal is electrically connected to a first terminal of the capacitor CS1a. A gate of the transistor MW1b is electrically connected to the word line WLb, a first terminal is electrically connected to the bit line BLL (bit line BLR), and a second terminal is electrically connected to a first terminal of the capacitor CS1b. In this way, the bit line BLL (bit line BLR) is shared by the first terminal of the transistor MW1a and the first terminal of the transistor MW1b.

The transistor MW1 has a function of controlling charging and discharging of the capacitor CS1. A second terminal of the capacitor CS1 is electrically connected to the terminal B2. A constant potential (e.g., a low power supply potential) is input to the terminal B2.

In the case where the semiconductor device described in the above embodiment is used for the memory cell 1445a and the memory cell 1445b, the transistor 200a can be used as the transistor MW1a, the transistor 200b can be used as the transistor MW1b, the capacitor 100a can be used as the capacitor CS1a, and the capacitor 100b can be used as the capacitor CS1b. Thus, the area occupied by one set consisting of a transistor and a capacitor can be reduced when seen from the above, so that the memory device of this embodiment can be highly integrated. As a result, storage capacity per unit area of the memory device of this embodiment can be increased.

The transistor MW1 includes a bottom gate, and the bottom gate is electrically connected to the terminal B1. This makes it possible to change the $V_{th}$ of the transistor MW1 with a potential of the terminal B1. For example, the potential of the terminal B1 is a fixed potential (e.g., a negative constant potential); alternatively, the potential of the terminal B1 may be changed in response to the operation of the DOSRAM 1400.

The bottom gate of the transistor MW1 may be electrically connected to the gate, the source, or the drain of the transistor MW1. Alternatively, the bottom gate is not necessarily provided in the transistor MW1.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a potential difference between the bit line pair, and a function of retaining the potential difference. The switch array 1444 has a function of selecting a bit line pair and bringing the selected bit line pair and a global bit line pair into a conduction state.

Here, a bit line pair refers to two bit lines which are compared by a sense amplifier at the same time. A global bit line pair refers to two global bit lines which are compared by a global sense amplifier at the same time. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, the plurality of local sense amplifier arrays 1426 are independently driven. (Column Circuit 1415) The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a potential difference between the global bit line pair (GBLL, GBLR), and a function of retaining the potential difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a target column. The local sense amplifier array 1426 amplifies the written data, and retains the amplified data. In the specified local memory cell array 1425, the word line WL of a target row is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified by an address signal. In the specified local memory cell array 1425, the word line WL of a target row is in a selected state, and data of the memory cell 1445 is written to the bit line. The local sense amplifier array 1426 detects a potential difference between the bit line pair of each column as data, and retains the data. Among the data retained at the local sense amplifier array 1426, the data of a column specified by the address signal is written to the global bit line pair by the switch array 1444. The global sense amplifier array 1416 detects and retains the data of the global bit line pair. The data retained at the global sense amplifier array 1416 is output to the input/output circuit 1417. Thus, the data reading operation is completed.

There is theoretically no limitation on the number of rewriting operations of the DOSRAM 1400 because data is rewritten by charging and discharging of the capacitor CS1; and data can be written and read with low energy. In addition, the memory cell 1445 has a simple circuit configuration, and thus the capacity can be easily increased.

The transistor MW1 is an OS transistor. The extremely low off-state current of the OS transistor can inhibit charge leakage from the capacitor CS1. Therefore, the retention time of the DOSRAM 1400 is much longer than that of a DRAM. This allows less frequent refresh, which can reduce the power needed for refresh operations. Thus, the DOSRAM 1400 is suitable for a memory device that rewrites a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which can reduce the storage capacitance of the memory cell 1445. In addition, providing the switch array 1444 in the local sense amplifier array 1426 can reduce the number of long bit lines. For the reasons described above, a driving load during access to the DOSRAM 1400 is reduced, enabling a reduction in power consumption.

The structure described in this embodiment can be used in an appropriate combination with the structures described in the other embodiments and an example.

Embodiment 6

In this embodiment, an AI system in which the semiconductor device of the above embodiment is used will be described with reference to FIG. 33.

Figure 33:
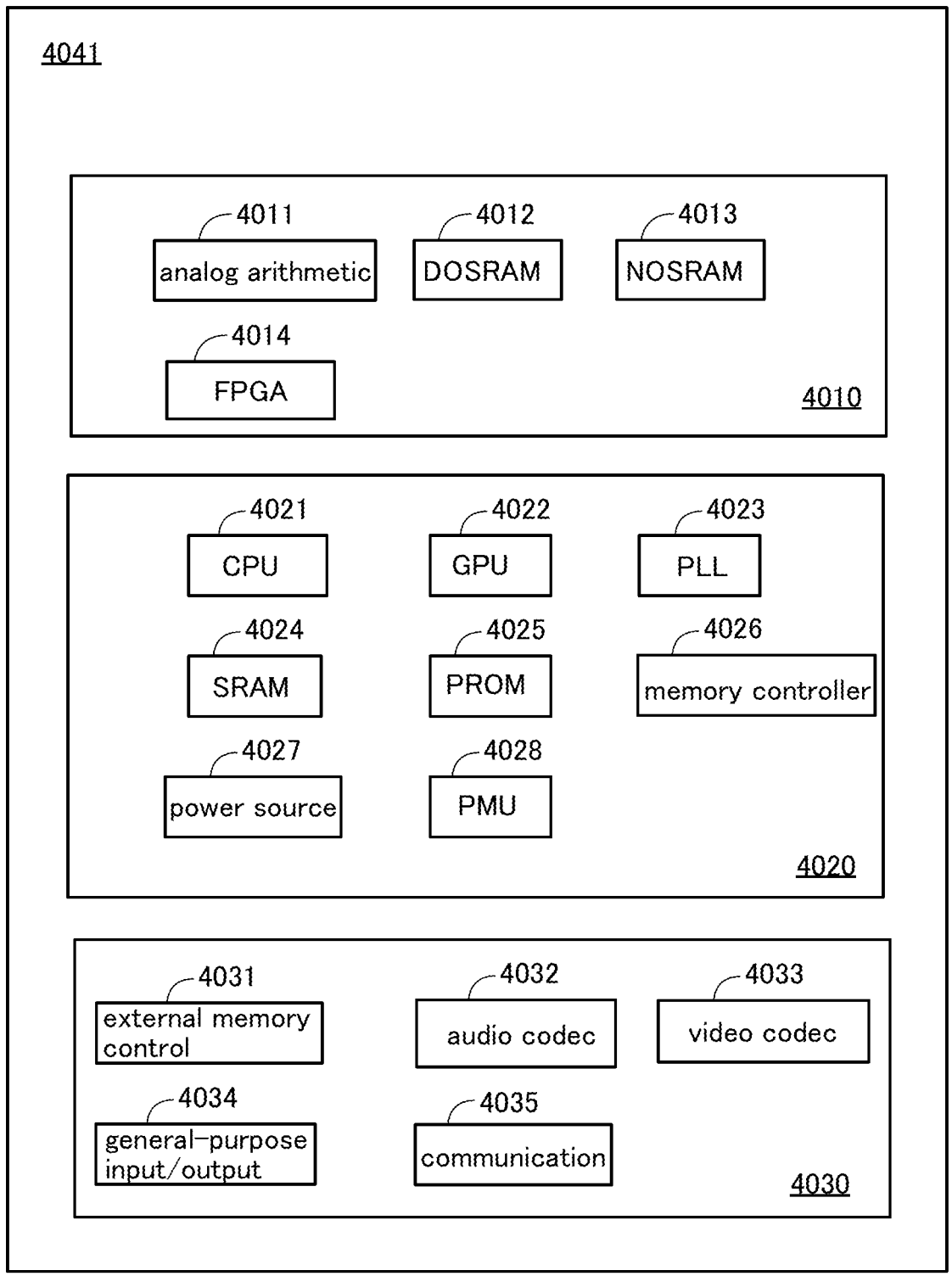
FIG. 33 A block diagram illustrating a structure example of an AI system of one embodiment of the present invention.

FIG. 33 is a block diagram illustrating a configuration example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA (Field Programmable Gate Array) 4014. The DOSRAM 1400 and the NOSRAM 1600 described in the above embodiment can be used as the DOSRAM 4012 and the NOSRAM 4013, respectively. In the FPGA 4014, an OS memory is used for a configuration memory and a register. Here, such an FPGA is referred to as an "OS-FPGA".

The control portion 4020 includes a CPU 4021, a GPU 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for the learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data have to be stored piece by piece because of the circuit area limitation and small storage capacity of the SRAM. The DOSRAM 4012 has a larger storage capacity than an SRAM because the memory cells can be highly integrated even in a limited circuit area. Therefore, the DOSRAM 4012 can efficiently store the input data.

The NOSRAM 4013 is a nonvolatile memory using an OS transistor. The NOSRAM 4013 consumes less power in writing data than the other nonvolatile memories such as a flash memory, a ReRAM (Resistive Random Access Memory), and an MRAM (Magnetoresistive Random Access Memory). Furthermore, unlike a flash memory and a ReRAM in which elements deteriorate by data writing, there is no limitation on the number of times of data writing.

Furthermore, the NOSRAM 4013 can store multilevel data of two or more bits as well as one-bit binary data. The multilevel data storage in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are not necessary. Therefore, the area of a peripheral circuit for the NOSRAM 4013 can be reduced. Note that in this specification, analog data refers to data having a resolution of three bits (eight levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 can have a longer bit line than the DOSRAM 4012 and thus can have an increased storage capacity.

The FPGA 4014 is an FPGA using an OS transistor. With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with hardware. Establishing the connection of the neural network with hardware enables higher-speed neural network calculation.

The FPGA 4014 is an FPGA including an OS transistor. An OS-FPGA can have a smaller memory area than an FPGA including an SRAM. Thus, addition of a context switching function only causes a small increase in area. Moreover, an OS-FPGA can transmit data and parameters at high speed by boosting.

In the AI system 4041, the analog arithmetic circuit 4011, the DOSRAM 4012, the NOSRAM 4013, and the FPGA 4014 can be provided on one die (chip). Thus, the AI system 4041 can execute the neural network calculation at high speed with low power consumption. In addition, the analog arithmetic circuit 4011, the DOSRAM 4012, the NOSRAM 4013, and the FPGA 4014 can be manufactured through the same manufacturing process. Therefore, the AI system 4041 can be manufactured at low cost.

Note that the arithmetic portion 4010 does not necessarily include all of the following: the DOSRAM 4012, the NOSRAM 4013, and the FPGA 4014. One or more memories selected from the DOSRAM 4012, the NOSRAM 4013, and the FPGA 4014 are provided in accordance with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013.

The existing programs that exist as libraries are mostly premised on processing with a GPU. For this reason, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be executed at high speed.

The power supply circuit 4027 generates not only a low power supply potential for a logic circuit but also a potential for an analog operation. The power supply circuit 4027 may use an OS memory. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. By including the OS memory, the PLL 4023 can retain an analog potential with which the clock oscillation cycle is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data exchange can be performed at high speed.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external memory device (such as an HDD (Hard Disk Drive) or an SSD (Solid State Drive)) in many cases. Therefore, the AI system 4041 preferably includes the external memory control circuit 4031 functioning as an interface with the external memory device.

Because learning and inference using the neural network often deal with audio and video, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/output module 4034. The general-purpose input/output module 4034 includes a USB (Universal Serial Bus) or an I2C (Inter-Integrated Circuit), for example.

The AI system 4041 can perform learning or inference using data obtained via the Internet. For this reason, the AI system 4041 preferably includes the communication module 4035.

The analog arithmetic circuit 4011 may use a multi-level flash memory as an analog memory. However, the flash memory has a limitation on the number of rewriting times. In addition, it is extremely difficult to embed the multi-level flash memory (to form the arithmetic circuit and the memory on the same die).

Alternatively, the analog arithmetic circuit 4011 may use a ReRAM as an analog memory. However, the ReRAM has a limitation on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structure described in this embodiment can be used in an appropriate combination with the structures described in the other embodiments and an example.

Embodiment 7

Application Example of AI System

In this embodiment, application examples of the AI system described in the above embodiment will be described with reference to FIG. 34.

Figure 34A:
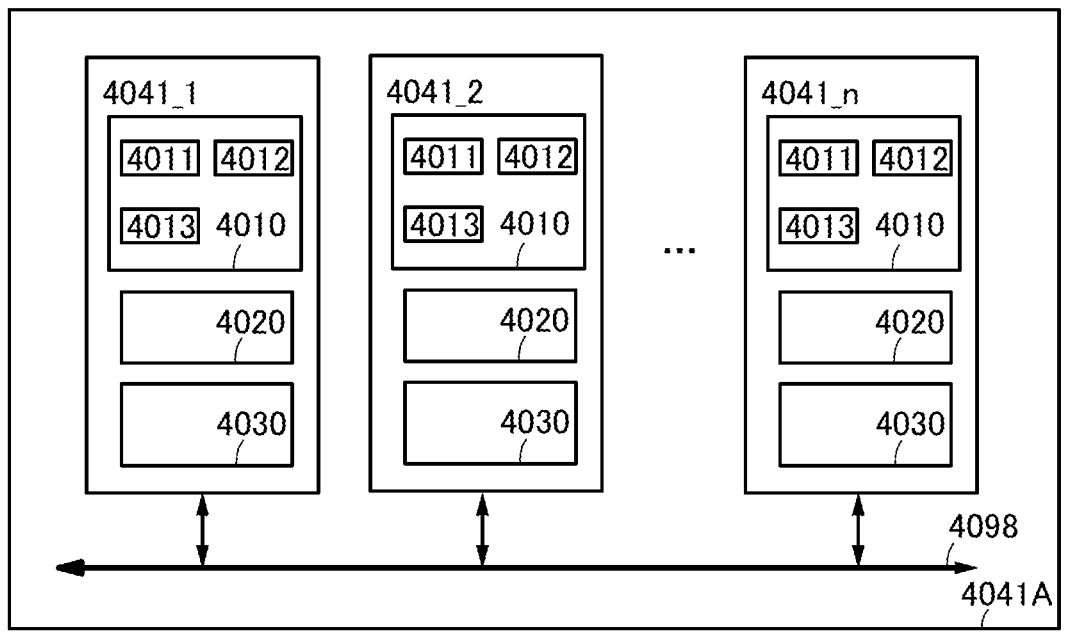
FIGS. 34A and 34B Block diagrams illustrating application examples of an AI system of one embodiment of the present invention.

FIG. 34(A) illustrates an AI system 4041A in which the AI systems 4041 described with FIG. 33 are arranged in parallel and a signal can be transmitted between the systems via a bus line.

The AI system 4041A illustrated in FIG. 34(A) includes a plurality of AI systems 4041_1 to 4041_n (n is a natural number). The AI system 4041_1 to the AI system 4041_n are connected to each other via a bus line 4098.

Figure 34B:
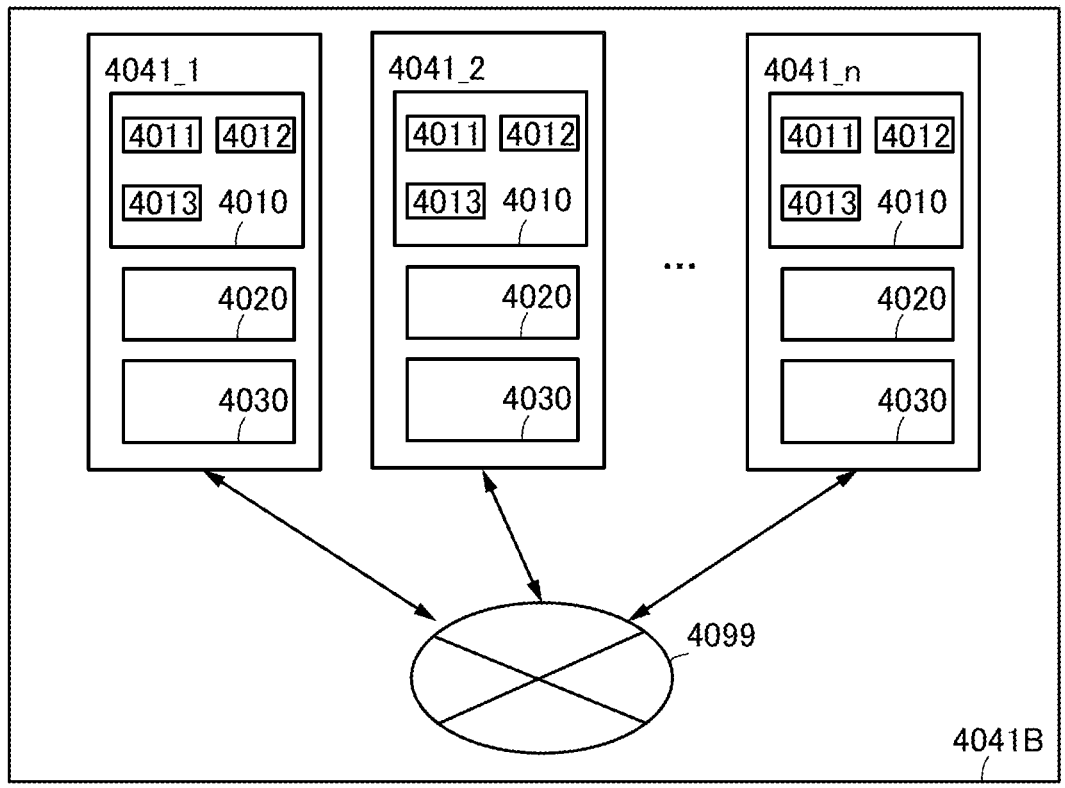

FIG. 34(B) illustrates an AI system 4041B in which the AI systems 4041 described with FIG. 33 are arranged in parallel as in FIG. 34(A) and a signal can be transmitted between the systems via a network.

The AI system 4041B illustrated in FIG. 34(B) includes the plurality of AI systems 4041_1 to 4041_n. The AI system 4041_1 to the AI system 4041_n are connected to each other via a network 4099.

A structure may be employed in which a communication module is provided in each of the AI system 4041_1 to the AI system 4041_n to perform wireless or wired communication via the network 4099. A communication module can perform communication via an antenna. For example, the communication can be performed in such a manner that an electronic device is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE such as Wi-Fi (registered trademark), Bluetooth (registered trademark), or ZigBee (registered trademark).

With the configuration illustrated in FIG. 34(A) and FIG. 34(B), analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning can be performed with a smaller amount of arithmetic processing. As a result, recognition accuracy can be increased. The information obtained with each AI system is expected to enable instant understanding of collective biological information that irregularly changes.

The structure described in this embodiment can be used in an appropriate combination with the structures described in the other embodiments and an example.

Embodiment 8

In this embodiment, an example of an IC into which the AI system described in the above embodiment is incorporated will be described.

In the AI system described in the above embodiment, a digital processing circuit such as a CPU that includes a Si transistor, an analog arithmetic circuit that uses an OS transistor, an OS-FPGA, and an OS memory such as a DOSRAM or a NOSRAM can be integrated into one die.

Figure 35:
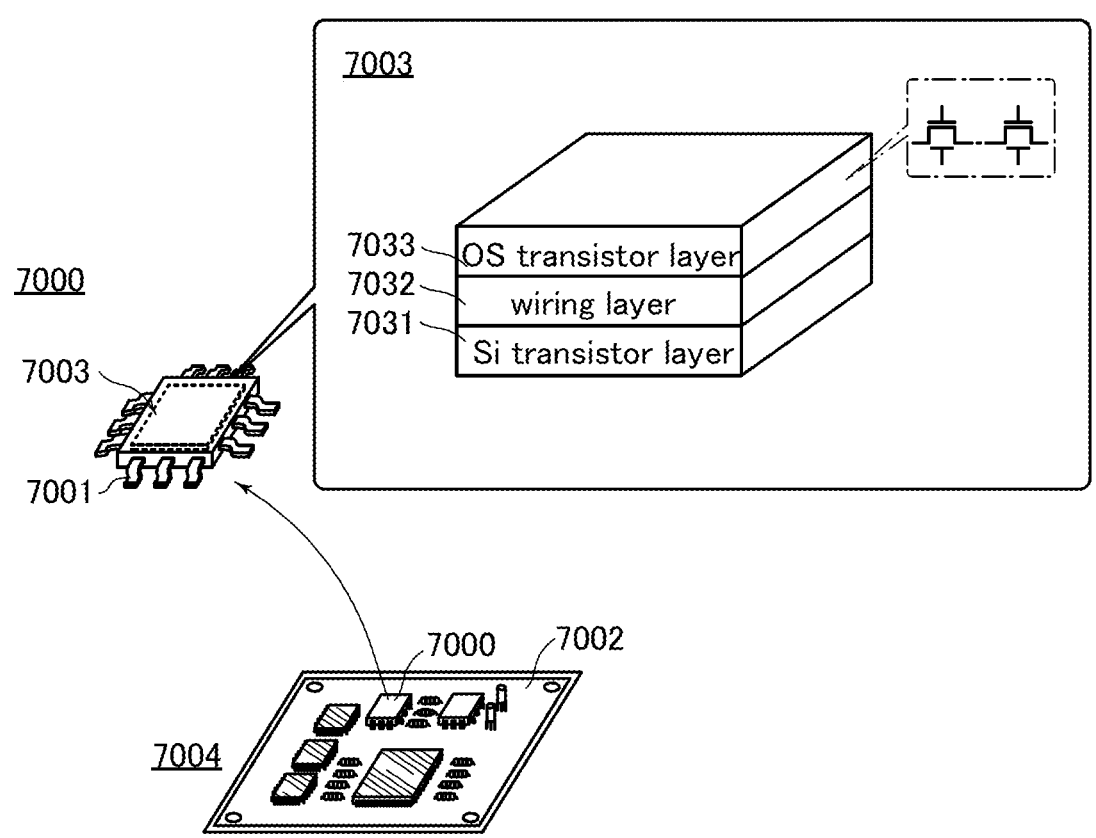
FIG. 35 A schematic perspective view illustrating a structure example of an IC into which an AI system of one embodiment of the present invention is incorporated.

FIG. 35 illustrates the example of the IC into which the AI system is incorporated. An AI system IC 7000 illustrated in FIG. 35 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the various circuits described in the above embodiment are provided on one die. The circuit portion 7003 has a stacked-layer structure as described in the above embodiment, and is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 35, the embodiment of the package is not limited thereto.

The digital processing circuit such as a CPU, the analog arithmetic circuit that uses an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of constituent elements is increased, and accordingly the AI system can be incorporated into the IC at low cost.

The structure described in this embodiment can be used in an appropriate combination with the structures described in the other embodiments and an example.

Embodiment 9

The semiconductor device of one embodiment of the present invention can be used for a processor such as a CPU and a GPU or a computer. FIG. 36 to FIG. 38 illustrate specific examples of electronic devices including a processor such as a CPU and a GPU or a computer of one embodiment of the present invention.

<Electronic Device and System>

The GPU or the computer of one embodiment of the present invention can be mounted on a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. In addition, when the integrated circuit or the computer of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 36 illustrates examples of the electronic device.

[Information Terminal 1]

Figure 36A:
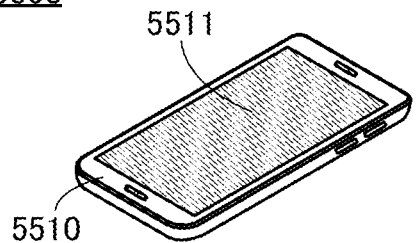

FIG. 36(A) illustrates a mobile phone (smartphone) which is a type of an information terminal. An information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the computer of one embodiment of the present invention. Examples of the application utilizing artificial intelligence include an application for recognizing a conversation and displaying the contents of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal 2]

Figure 36B:
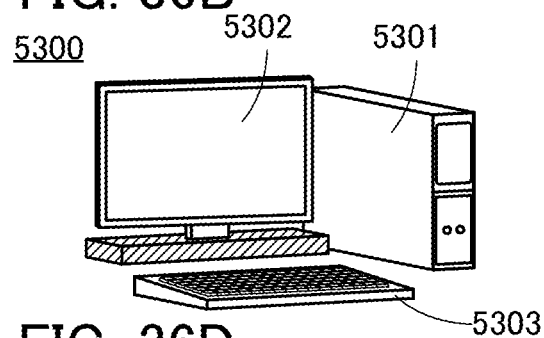

FIG. 36(B) illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the computer of one embodiment of the present invention as the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although the smartphone and the desktop information terminal are respectively illustrated in FIGS. 36(A) and 36(B) as examples of the electronic device, one embodiment of the present invention can also be applied to an information terminal other than the smartphone and the desktop information terminal. Examples of an information terminal other than a smartphone and a desktop information terminal include a PDA (Personal Digital Assistant), a laptop information terminal, and a workstation.

[Electrical Appliance]

Figure 36C:
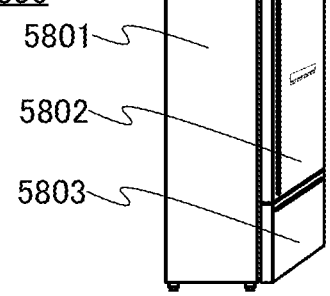

FIG. 36(C) illustrates an electric refrigerator-freezer 5800 which is an example of an electrical appliance. The electric refrigerator-freezer 5800 includes a housing 5801, a refrigerator door 5802, a freezer door 5803, and the like.

When the computer of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature in the electric refrigerator-freezer 5800 to a temperature appropriate for the stored foods, and the like.

Although the electric refrigerator-freezer is described as an electrical appliance in the example, other examples of the electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 36D:
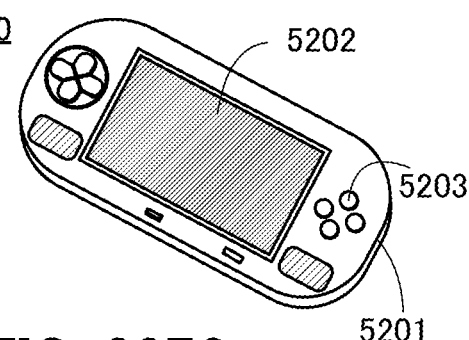
Figure 36D:
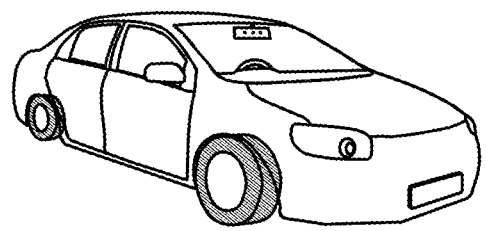
Figure 36D:
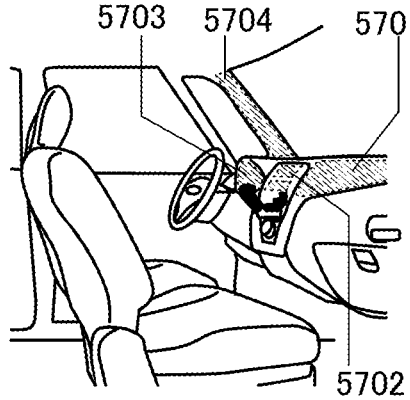

FIG. 36(D) illustrates a portable game machine 5200 which is an example of a game machine. The portable game machine includes a housing 5201, a display portion 5202, a button 5203, and the like.

With the use of the GPU or the computer of one embodiment of the present invention in the portable game machine 5200, the portable game machine 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the computer of one embodiment of the present invention in the portable game machine 5200, the portable game machine 5200 including artificial intelligence can be obtained.

Basically, the progress of a game, the actions and words of game characters, and expressions of a phenomenon or the like that occurs in the game are determined by a program of the game; however, the use of artificial intelligence in the portable game machine 5200 enables expressions not limited by the program of the game. For example, expressions are possible in which questions posed by the player, the progress of the game, time, and the actions and words of game characters are changed.

In the case where a game that needs a plurality of players is played with the portable game machine 5200, the artificial intelligence can construct a virtual game player; thus, the game can be played by one person with the use of the game player constructed by the artificial intelligence as an opponent.

Although the portable game machine is illustrated in FIG. 36(D) as an example of a game machine, the game machine using the GPU or the computer of one embodiment of the present invention is not limited thereto. Examples of the game machine using the GPU or the computer of one embodiment of the present invention include a home video game machine, an arcade game machine installed in entertainment facilities (a game center, an amusement park, or the like), and a throwing machine for batting practice installed in sports facilities.

[Moving Vehicle]

The GPU or the computer of one embodiment of the present invention can be used in an automobile, which is a moving vehicle, and around a driver's seat in the automobile.

FIG. 36(E1) illustrates an automobile 5700 which is an example of a moving vehicle, and FIG. 36(E2) illustrates the periphery of a windshield inside the automobile. FIG. 36(E1) illustrates a display panel 5701, a display panel 5702, and a display panel 5703 that are attached to a dashboard and a display panel 5704 that is attached to a pillar.

The display panel 5701 to the display panel 5703 can display a variety of kinds of information such as a speedometer, a tachometer, a mileage, a fuel meter, a gearshift indicator, and air-condition setting. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 can fill in blind areas and improve safety. In addition, display of an image that complements the area that cannot be seen makes it possible to confirm safety more naturally and comfortably. The display panel 5704 can also be used as a lighting device.

Because the GPU or the computer of one embodiment of the present invention can be used as a component of artificial intelligence, the computer can be used in an automatic driving system of the automobile 5700, for example. The computer can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the computer of one embodiment of the present invention.

[Broadcasting System]

The GPU or the computer of one embodiment of the present invention can be used in a broadcasting system.

Figure 36F:
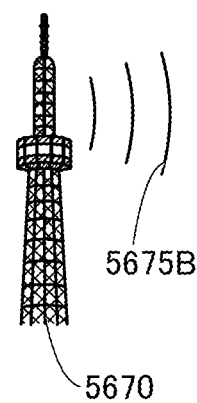
Figure 36F:
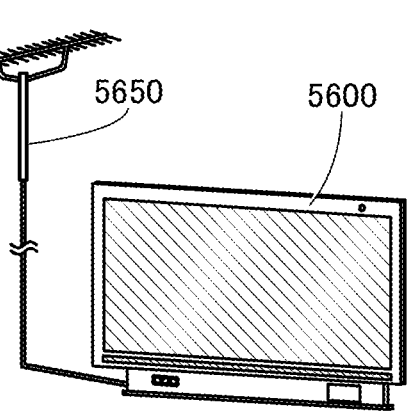

FIG. 36(F) schematically illustrates data transmission in a broadcasting system. Specifically, FIG. 36(F) illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 36(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 36(F) and may be satellite broadcasting using an artificial satellite, data broadcasting using an optical line, or the like.

The above-described broadcasting system may be a broadcasting system utilizing artificial intelligence by including the computer of one embodiment of the present invention. When the broadcast data is transmitted from the broadcast station 5680 to the TV 5600 of each household, the broadcast data is compressed by an encoder. The antenna 5650 receives the compressed broadcast data, and then the broadcast data is decompressed by a decoder of the receiving device in the TV 5600. Utilizing the artificial intelligence enables, for example, recognition of a display pattern included in a displayed image in motion compensation prediction, which is one of the compressing methods for the encoder. In addition, in-frame prediction or the like can also be performed utilizing the artificial intelligence. Furthermore, for example, when the broadcast data with low resolution is received and the broadcast data is displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

<Parallel Calculator>

A parallel calculator can be constructed by forming a cluster using a plurality of computers of one embodiment of the present invention.

Figure 37A:
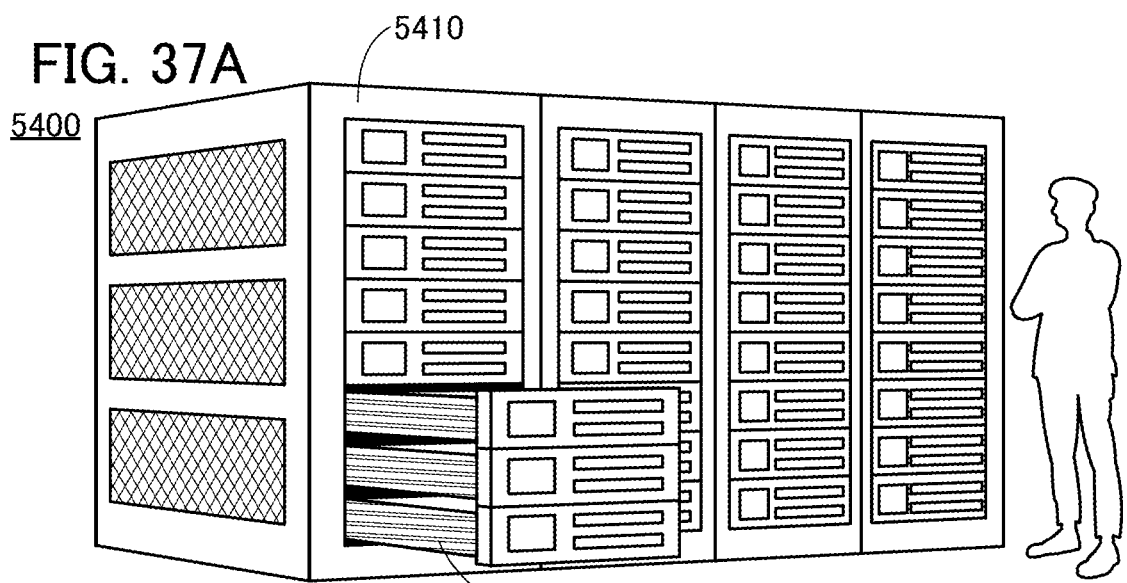
FIGS. 37A to 37C Diagrams illustrating structure examples of a parallel calculator, a calculator, and a PC card of one embodiment of the present invention.

FIG. 37(A) illustrates a large-sized parallel calculator 5400. In the parallel calculator 5400, a plurality of rack-mounted-type calculators 5420 are stored in a rack 5410.

Figure 37B:
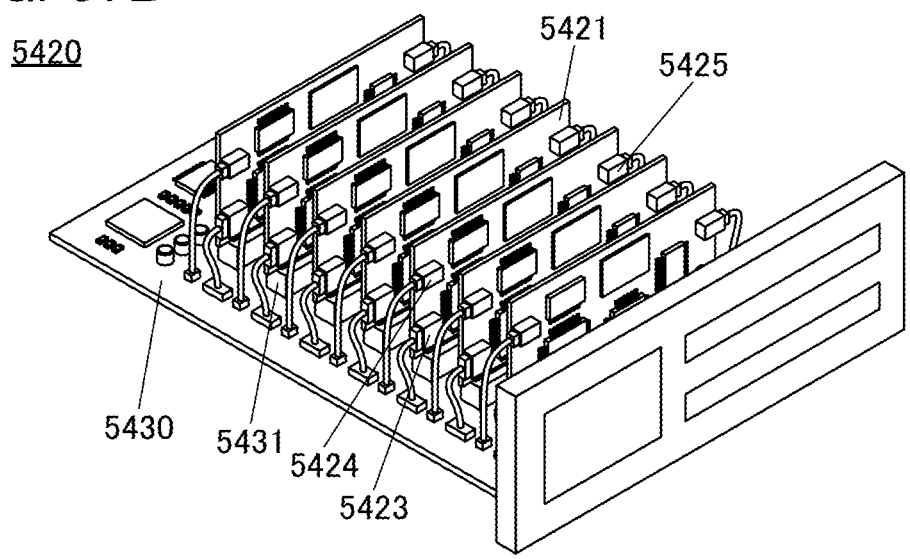

The calculator 5420 can have a structure of a perspective view illustrated in FIG. 37(B), for example. In FIG. 37(B), the calculator 5420 includes a motherboard 5430, and the motherboard includes a plurality of slots 5431, a plurality of connection terminals, and the like. A PC card 5421 is inserted in the slot 5431. In addition, the PC card 5421 includes a connection terminal 5423, a connection terminal 5424, and a connection terminal 5425, and the connection terminals are each connected to the motherboard 5430.

Figure 37C:
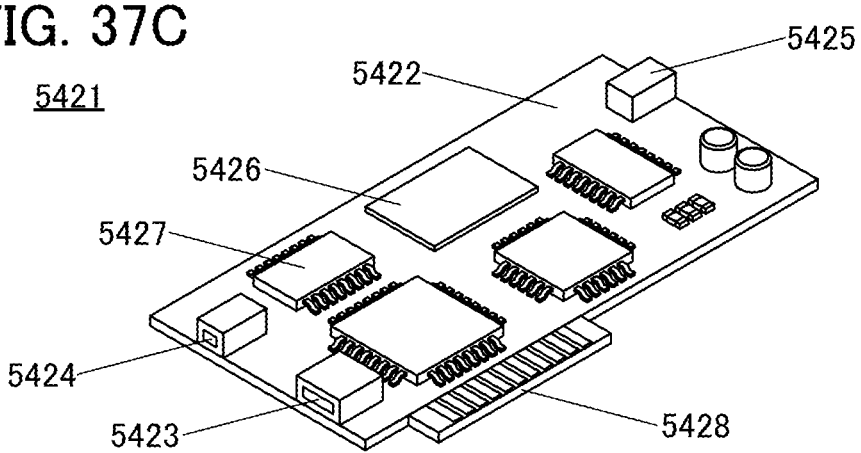

The PC card 5421 is a processing board provided with a CPU, a GPU, a memory device, and the like of one embodiment of the present invention. For example, FIG. 37(C) illustrates a structure in which the PC card 5421 includes a board 5422, and the board 5422 includes the connection terminal 5423, the connection terminal 5424, the connection terminal 5425, a chip 5426, a chip 5427, and a connection terminal 5428. Note that chips other than the chip 5426 and the chip 5427 are illustrated in FIG. 37(C), and for the description of the chips, the description of the chip 5426 and the chip 5427 described below is referred to.

The connection terminal 5428 has a shape that can be inserted in the slot 5431 of the motherboard 5430, and the connection terminal 5428 functions as an interface for connecting the PC card 5421 and the motherboard 5430. As a standard for the connection terminal 5428, for example, PCIe can be given.

The connection terminal 5423, the connection terminal 5424, and the connection terminal 5425 can be used as interfaces for supplying electric power and inputting a signal to the PC card 5421, for example. Furthermore, the connection terminals can be used as interfaces for outputting a signal calculated by the PC card 5421, for example. Examples of a standard for the connection terminal 5423, the connection terminal 5424, and the connection terminal 5425 include USB (Universal Serial Bus), SATA (Serial ATA), and SCSI (Small Computer System Interface). In the case where image signals are output from the connection terminal 5423, the connection terminal 5424, and the connection terminal 5425, HDMI (registered trademark) or the like can be given as a standard for the connection terminals.

The chip 5426 includes a signal input/output terminal (not illustrated). The terminal is inserted in a socket (not illustrated) of the PC card 5421, which allows electrical connection between the chip 5426 and the PC card 5421. The chip 5426 can be a GPU of one embodiment of the present invention, for example.

The chip 5427 includes a plurality of terminals. The terminals are soldered to the wiring of the PC card 5421 by a reflow method, for example, which allows electrical connection between the chip 5427 and the PC card 5421. Examples of the chip 5427 include a memory device, an FPGA, and a CPU.

Application of the computer of one embodiment of the present invention to the calculator 5420 of the parallel calculator 5400 illustrated in FIG. 37(A) enables a large-scale calculation required for learning and inference of artificial intelligence, for example.

<Server and System Including Server>

The computer of one embodiment of the present invention can be applied to a server functioning on the network, for example. Accordingly, a system including the server can be formed.

Figure 38A:
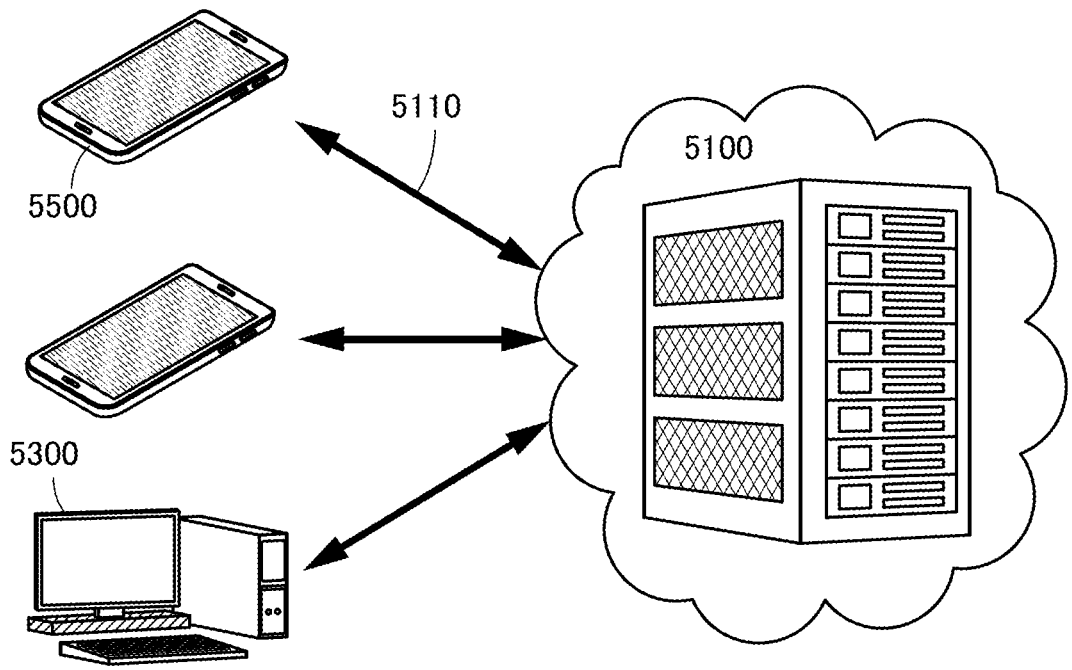
FIGS. 38A and 38B Diagrams illustrating structure examples of a system of one embodiment of the present invention.

As an example, FIG. 38(A) schematically illustrates a state where communication is performed between a server 5100 using the computer of one embodiment of the present invention and the information terminals 5500 and the desktop information terminal 5300, which are described above. Note that FIG. 38(A) illustrates communication 5110 as a state where communication is performed.

Formation of such a mode allows a user to access the server 5100 with the information terminal 5500, the desktop information terminal 5300, or the like. Then, the user can receive service offered by an administrator of the server 5100 through the communication 5110 via the Internet. Examples of the service include email; SNS (Social Networking Service); online software; cloud storage; a navigation system; a translation system; a net game; online shopping; transactions of financial products such as stock, currency, and credit; reservation of public facilities, commercial facilities, accommodation facilities, hospitals, and the like; and video viewing of Internet programs, speeches, lectures, and the like.

In particular, by applying the computer of one embodiment of the present invention to the server 5100, artificial intelligence can be utilized for the above-described service in some cases. For example, introduction of artificial intelligence into a navigation system enables the system to guide a user to a destination according to traffic congestion, train operation information, or the like in some cases. Moreover, for example, introduction of artificial intelligence into a translation system enables the system to appropriately translate unique wording such as a dialect or slang in some cases. Furthermore, for example, utilization of artificial intelligence for a reservation system of a hospital or the like enables the system to introduce an appropriate hospital, an appropriate clinic, or the like by judging the degree of symptoms or injury or the like of a user in some cases.

When a user wants to develop artificial intelligence, the user can access the server 5100 via the Internet and perform the development on the server 5100. That is favorable in the case where the processing capacity of the information terminal 5500, the desktop information terminal 5300, or the like in user's possession is insufficient, or the case where a development environment cannot be constructed by the information terminal 5500, the desktop information terminal 5300, for example.

Although FIG. 38(A) illustrates, as a system including a server, an example of a system including the information terminal and the server 5100, a system including an electronic device other than the information terminal and the server 5100 may be given as another example. That is, an IoT (Internet of Things) mode in which the electronic device is connected to the Internet may be employed.

Figure 38B:
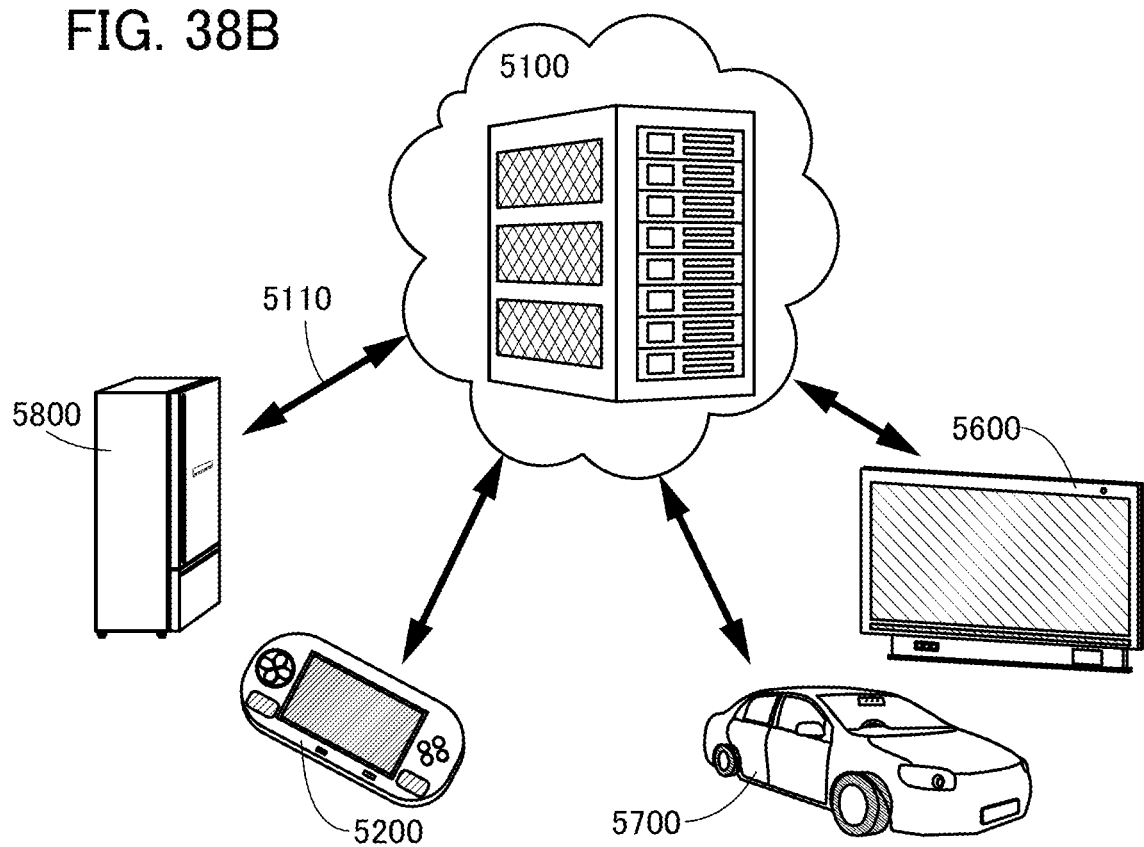

As an example, FIG. 38(B) schematically illustrates a state where communication is performed between the electronic devices described with FIG. 36 (the electric refrigerator-freezer 5800, the portable game machine 5200, the automobile 5700, and the TV 5600) and the server 5100. Note that FIG. 38(B) illustrates the communication 5110 as a state where communication is performed.

In the case where each of the electronic devices described with FIG. 36 includes artificial intelligence, arithmetic operation necessary for operating the artificial intelligence can be executed in the server 5100 as illustrated in FIG. 38(B). For example, input data necessary for the arithmetic operation is transmitted from one of the electronic devices to the server 5100 through the communication 5110, whereby output data is calculated on the basis of the input data by artificial intelligence included in the server 5100. The output data is transmitted from the server 5100 to the one of the electronic devices through the communication 5110. Thus, the one of the electronic devices can operate on the basis of the data output from the artificial intelligence.

The electronic devices illustrated in FIG. 38(B) are examples, and a structure may be employed in which an electronic device not illustrated in FIG. 38(B) is connected to the server 5100 and intercommunication is performed in the above-described manner.

The electronic device and the functions of the electronic device, the application example of the artificial intelligence and its effects, and the like described in this embodiment can be combined as appropriate with the description of another electronic device.

This embodiment can be implemented in an appropriate combination with any of the structures described in the other embodiments, an example, and the like.

EXAMPLE

In this example, Sample 1 in which a plurality of transistors having a structure similar to that of the transistor 200 illustrated in FIG. 16 are provided was fabricated as the semiconductor device of one embodiment of the present invention. Evaluation results of electrical characteristics and reliability of the semiconductor device are described.

First, a structure of the transistor of Sample 1 is described. As illustrated in FIG. 16, the transistor of Sample 1 includes the insulator 214, the conductor 205*a*, the conductor 205*b*, the insulator 216, the insulator 220, the insulator 222, the insulator 224, the oxide 230*a*, the oxide 230*b*, the oxide 230*c*, the insulator 250, the conductor 260*a*, the conductor 260*b*, the conductor 242*a*, the conductor 242*b*, the insulator 254*a*, the insulator 254*b*, the insulator 244, the insulator 280, and the insulator 274.

As the insulator 214, 40-nm-thick aluminum oxide was used. As the conductor 205*a*, tantalum nitride was used. As the conductor 205*b*, titanium nitride and tungsten deposited over the titanium nitride were used. As the insulator 216, silicon oxynitride was used.

As the insulator 220, 5-nm-thick silicon oxynitride was used. As the insulator 222, 10-nm-thick hafnium oxide deposited by an ALD method was used. As the insulator 224, 30-nm-thick silicon oxynitride was used.

As the oxide 230*a*, 5-nm-thick In—Ga—Zn oxide deposited by a DC sputtering method was used. In the deposition of the oxide 230*a*, a target with In:Ga:Zn=1:3:4 [atomic ratio] was used; an oxygen gas at 45 sccm was used as the deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As the oxide 230*b*, 15-nm-thick In—Ga—Zn oxide deposited by a DC sputtering method was used. In the deposition of the oxide 230*b*, a target with In:Ga:Zn=4:2:4.1 [atomic ratio] was used; an argon gas at 30 sccm and an oxygen gas at 15 sccm were used as the deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As each of the conductor 242a and the conductor 242b, 25-nm-thick tantalum nitride was used. As each of the insulator 254a and the insulator 254b, a stacked film of 5-nm-thick aluminum oxide deposited by a sputtering method and 3-nm-thick aluminum oxide deposited thereover by an ALD method was used.

As the oxide 230c, 5-nm-thick In—Ga—Zn oxide deposited by a DC sputtering method was used. In the deposition of the oxide 230c, a target with In:Ga:Zn=4:2:4.1 [atomic ratio] was used; an oxygen gas at 45 sccm was used as the deposition gas; the deposition pressure was 0.7 Pa (measured with Miniature Gauge MG-2 manufactured by CANON ANELVA CORPORATION); the deposition power was 500 W; the substrate temperature was 130° C.; and the target-substrate distance was 60 mm.

As the insulator 250, 10-nm-thick silicon oxynitride was used. As the conductor 260a, 10-nm-thick titanium nitride was used. As the conductor 260b, 30-nm-thick tungsten was used.

As the insulator 244, a 7-nm-thick aluminum oxide film deposited by an ALD method was used. The insulator 244 is formed to cover the conductor 260, the insulator 250, the oxide 230, and the conductor 242, and the opening 290 formed in the insulator 244 surrounds the transistor 200.

As the insulator 280, silicon oxynitride was used. As the insulator 274, 40-nm-thick aluminum oxide was used.

The transistor has a channel length of 60 nm and a channel width of 60 nm (designed values). In Sample 1, two transistors are arranged per square micrometer. Note that Sample 1 includes, in addition to the above components, the conductor 240 and the like in the insulator 280 and includes an insulating film functioning as an interlayer film, a conductive film functioning as a wiring, and the like over the insulator 274.

Next, $I_D$—$V_G$ measurement was performed on the transistor of Sample 1. Furthermore, additional heat treatment was performed at 400° C. in a nitrogen atmosphere for 4 hours, and then $I_D$—$V_G$ measurement was performed again on the transistor of Sample 1 under the same conditions. The $I_D$—$V_G$ measurement on the transistor was performed under the following conditions: the drain potential $V_D$ of the transistor was set to +0.1 V and +1.2 V; the source potential $V_S$ was set to 0 V; and the top gate potential $V_G$ was swept from −4.0 V to +4.0 V. The bottom gate potential $V_{BG}$ was set to 0 V.

Figure 39A:
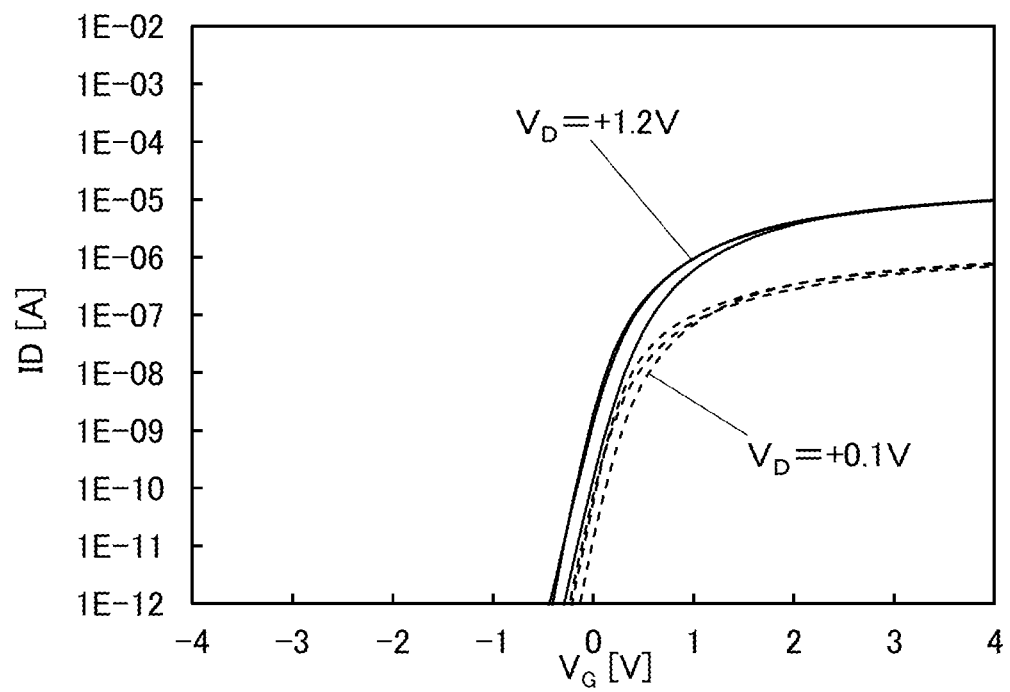
FIGS. 39A and 39B Diagrams showing electrical characteristics of a transistor of an example of the present invention.
Figure 39B:
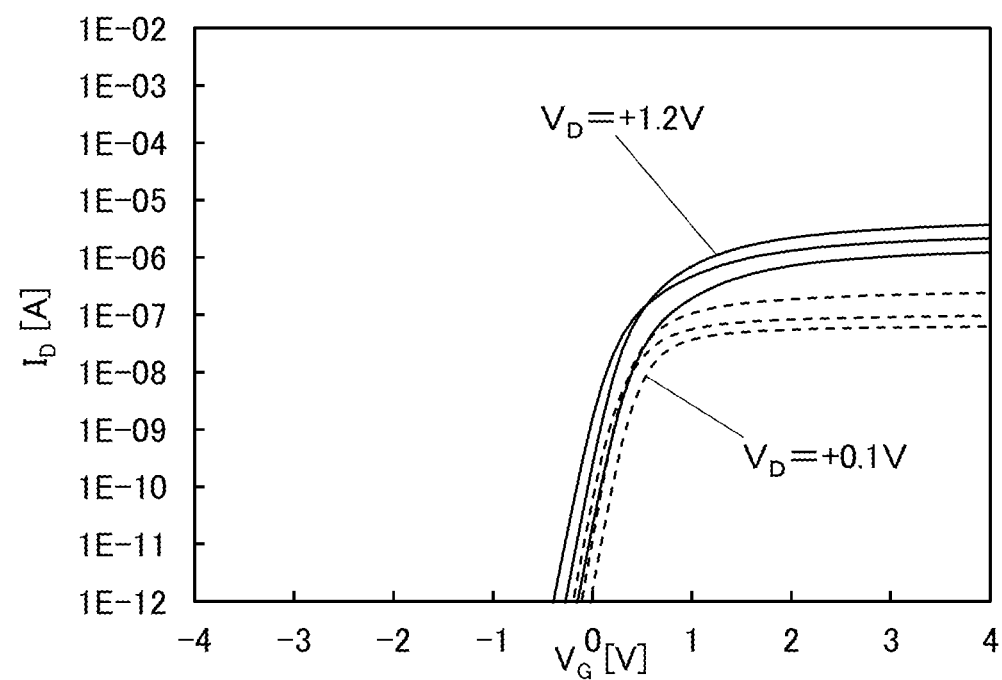

FIG. 39 shows $I_D$—$V_G$ curves of the transistor of Sample 1 of this example at $V_D$=+0.1 V and +1.2 V. FIG. 39(A) shows the $I_D$—$V_G$ curves of the transistor of Sample 1 before the additional heat treatment and FIG. 39(B) shows the $I_D$—$V_G$ curves of the transistor of Sample 1 after the additional heat treatment. In each graph, the vertical axis represents $I_D$ [A] and the horizontal axis represents $V_G$ [V].

As shown in FIG. 39(A), the semiconductor device of one embodiment of the present invention exhibited favorable electrical characteristics with high on-off ratio. Furthermore, as shown in FIG. 39(B), it was confirmed that the semiconductor device of one embodiment of the present invention maintains favorable electrical characteristics with high on-off ratio even after the long-time additional heat treatment. Thus, the transistor of this example is stable with respect to high temperatures in the manufacturing process (what is called thermal budget).

Accordingly, it was confirmed that a change in transistor characteristics due to heat treatment can be inhibited in the semiconductor device of one embodiment of the present invention.

Next, reliability evaluation was performed on Sample 1. As the reliability evaluation, a +GBT (Gate Bias Temperature) stress test was performed. In the +GBT stress test, the conductor 242a functioning as a source electrode of the transistor, the conductor 242b functioning as a drain electrode, and the conductor 205 functioning as a bottom gate electrode are at the same potential, and a potential higher than those of the conductor 242a, the conductor 242b, and the conductor 205 is applied to the conductor 260 functioning as a top gate electrode for a certain time while the substrate is heated.

In the +GBT stress test of this example, stress was applied to Sample 1 under the following conditions: set temperature was set to 125° C.; the drain potential $V_D$, the source potential $V_S$, and the bottom gate potential $V_{BG}$ were set to 0 V; and the top gate potential $V_G$ was set to +3.63 V.

During the +GBT stress test, $I_D$—$V_G$ measurement was performed at certain intervals. The $I_D$—$V_G$ measurement was performed under the following conditions: the drain potential $V_D$ of the transistor was set to +1.2 V; the source potential $V_S$ was set to 0 V; the bottom gate potential $V_{BG}$ was set to 0 V; and the gate potential $V_G$ was swept from −3.3 V to +3.3 V. Note that a semiconductor parameter analyzer manufactured by Keysight Technologies was used for the $I_D$—$V_G$ measurement. In the +GBT stress test, $\Delta V_{sh}$ representing the amount of change in the shift voltage $V_{sh}$ from the start of the measurement was used as an indicator of the amount of change in the electrical characteristics of the transistor. Note that the shift voltage $V_{sh}$ is defined as, in the $I_D$—$V_G$ curve of the transistor ($I_D$ is in a log scale), $V_G$ at the intersection point of the tangent at a point where the slope of the curve is the steepest and the line of $I_D$=1 pA.

Figure 40:
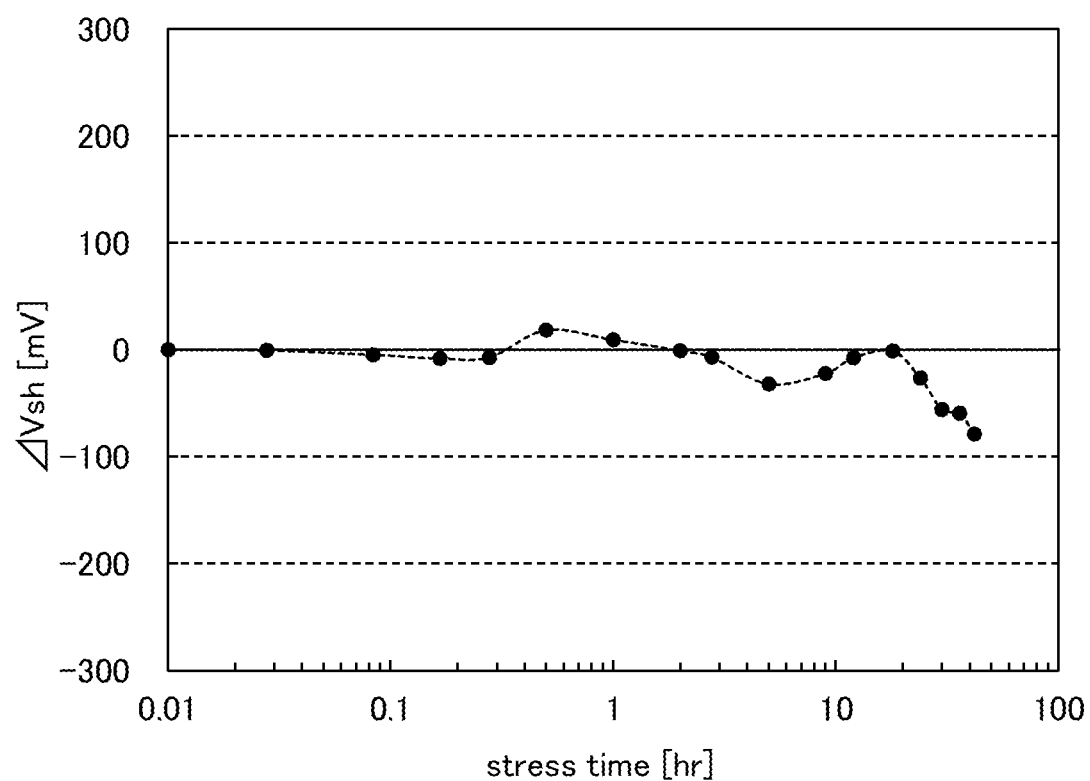
FIG. 40 A diagram showing stress time dependence of $\Delta V_{sh}$ of a transistor of an example of the present invention.

FIG. 40 shows the results of the +GBT stress test on Sample 1. In FIG. 40, the horizontal axis represents stress time [hr], and the vertical axis represents $\Delta V_{sh}$ [mV].

As shown in FIG. 40, the amount of change in the shift voltage $\Delta V_{sh}$ was less than or equal to 100 mV even after the stress is applied to Sample 1 for 42 hours.

At least part of the structure, the method, and the like described in this example can be implemented in appropriate combination with the embodiments described in this specification.

REFERENCE NUMERALS

200: transistor, 200a: transistor, 200b: transistor, 203: conductor, 203a: conductor, 203b: conductor, 205: conductor, 205a: conductor, 205b: conductor, 210: insulator, 212: insulator, 214: insulator, 216: insulator, 218: conductor, 220: insulator, 222: insulator, 224: insulator, 230: oxide, 230a: oxide, 230A: oxide film, 230b: oxide, 230B: oxide film, 230c: oxide, 230C: oxide film, 230d: oxide, 231: region, 231a: region, 231b: region, 234: region, 240: conductor, 240a: conductor, 240A: conductive film, 240b: conductor, 242: conductor, 242a: conductor, 242A: conductive film, 242b: conductor, 243: region, 243a: region, 243b: region, 244: insulator, 244A: insulating film, 246: conductor, 248: conductor, 250: insulator, 250A: insulating film, 254a: insulator, 254b: insulator, 260: conductor, 260a: conductor, 260A: conductive film, 260b: conductor, 260B: conductive film, 274: insulator, 280: insulator, 281: insulator, 282: insulator, 286: insulator, 290: opening, 292: oxygen

The invention claimed is:

1. A semiconductor device comprising:
a first insulator;
a second insulator over the first insulator;
an oxide over the second insulator;
a first conductor and a second conductor apart from each other over the oxide;
a third insulator over the oxide, the first conductor, and the second conductor;
a third conductor over the third insulator and at least partly overlapping with a region between the first conductor and the second conductor;
a fourth insulator covering the oxide, the first conductor, the second conductor, the third insulator, and the third conductor;
a fifth insulator over the fourth insulator; and
a sixth insulator over the fifth insulator,
wherein an opening reaching the second insulator is formed in part of the fourth insulator,
wherein the fifth insulator is in contact with the second insulator through the opening, and
wherein the first insulator, the fourth insulator, and the sixth insulator have a lower oxygen permeability than the second insulator.

2. The semiconductor device according to claim 1, wherein the fourth insulator is in contact with a side surface of the oxide, a side surface of the first conductor, a side surface of the second conductor, and a top surface of the second insulator.

3. The semiconductor device according to claim 1, wherein the first insulator, the fourth insulator, and the sixth insulator are oxides containing at least one of aluminum and hafnium.

4. The semiconductor device according to claim 1, wherein a seventh insulator is between the second insulator, the oxide, and the first conductor and the third insulator and the fourth insulator,
wherein an eighth insulator is between the second insulator, the oxide, and the second conductor and the third insulator and the fourth insulator, and
wherein the seventh insulator and the eighth insulator have a lower oxygen permeability than the second insulator.

5. The semiconductor device according to claim 4, wherein a side surface of the seventh insulator or the eighth insulator is substantially aligned with an edge of the opening formed in the fourth insulator.

6. The semiconductor device according to claim 4, wherein the seventh insulator and the eighth insulator are oxides containing at least one of aluminum and hafnium.

7. The semiconductor device according to claim 1, wherein the oxide contains In and an element M, and wherein M is Al, Ga, Y, or Sn.

8. The semiconductor device according to claim 7, wherein the oxide contains Zn, and
wherein an atomic ratio of Zn in the oxide is smaller than an atomic ratio of In in the oxide.

9. The semiconductor device according to claim 1, wherein the oxide has crystallinity.

10. The semiconductor device according to claim 1, wherein the first conductor and the second conductor include at least one of tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel.

11. A semiconductor device comprising:
a first insulator;
a second insulator over the first insulator;
a first oxide over the second insulator and comprising, in part of the first oxide, a region where the second insulator is exposed;
a second oxide over the first oxide and in contact with the second insulator via the region where the second insulator is exposed;
a third oxide over the second oxide;
a first conductor and a second conductor apart from each other over the third oxide;
a third insulator over the third oxide, the first conductor, and the second conductor;
a third conductor over the third insulator and at least partly overlapping with a region between the first conductor and the second conductor;
a fourth insulator covering the third oxide, the first conductor, the second conductor, the third insulator, and the third conductor;
a fifth insulator over the fourth insulator; and
a sixth insulator over the fifth insulator,
wherein an opening reaching the second insulator is formed in part of the fourth insulator,
wherein the fifth insulator is in contact with the second insulator through the opening,
wherein the first insulator, the fourth insulator, and the sixth insulator have a lower oxygen permeability than the second insulator, and
wherein the first oxide has a lower oxygen permeability than the second oxide.

12. The semiconductor device according to claim 11, wherein the first oxide to the third oxide contain In, an element M, and Zn,
wherein an atomic ratio of the element M in the first oxide is larger than an atomic ratio of the element M in the second oxide,
wherein an atomic ratio of In in the third oxide is larger than an atomic ratio of In in the second oxide, and
wherein M is Al, Ga, Y, or Sn.

13. A method for manufacturing a semiconductor device, comprising:
depositing a first insulating film, a second insulating film, a first oxide film, a second oxide film, and a first conductive film in this order over a substrate;
selectively removing part of the first oxide film, part of the second oxide film, and part of the first conductive film to form an oxide, a first conductor, and a second conductor over the second insulating film;
depositing a third insulating film and a second conductive film in this order over the second insulating film, the oxide, the first conductor, and the second conductor;
selectively removing part of the third insulating film and part of the second conductive film to form a first insulator and a third conductor;
depositing a fourth insulating film by an ALD method to cover the oxide, the first conductor, the second conductor, the first insulator, and the third conductor;
selectively removing part of the fourth insulating film to form an opening reaching the second insulating film in part of the fourth insulating film;
depositing a fifth insulating film over the fourth insulating film;

depositing a sixth insulating film over the fifth insulating film by a sputtering method in an oxygen-containing atmosphere; and performing heat treatment, wherein the first insulating film, the fourth insulating film, and the sixth insulating film have a lower oxygen permittivity than the second insulating film.

14. The method for manufacturing a semiconductor device according to claim 13, wherein heat treatment is performed before the third insulating film is deposited, and wherein the third insulating film is deposited without exposure to an air after the heat treatment.

15. The method for manufacturing a semiconductor device according to claim 13, wherein the oxide film is deposited by a sputtering method using a target containing In and an element M, and wherein M is Al, Ga, Y, or Sn.

16. The method for manufacturing a semiconductor device according to claim 15, characterized in that:

wherein the target contains Zn, and wherein an atomic ratio of Zn in the target is smaller than an atomic ratio of In in the target.

17. The method for manufacturing a semiconductor device according to claim 15, wherein the deposition of the oxide film by sputtering is performed while the substrate is heated in an oxygen-containing atmosphere.

18. The method for manufacturing a semiconductor device according to claim 13, wherein the first insulating film, the fourth insulating film, and the sixth insulating film are oxides containing at least one of aluminum and hafnium.

19. A method for manufacturing a semiconductor device, comprising:

depositing a first insulating film, a second insulating film, a first oxide film, a second oxide film, and a first conductive film in this order over a substrate;

selectively removing part of the first oxide film, part of the second oxide film, and part of the first conductive film to form an oxide, a first conductor, and a second conductor over the second insulating film;

depositing a third insulating film and a second conductive film in this order over the second insulating film, the oxide, the first conductor, and the second conductor;

selectively removing part of the third insulating film and part of the second conductive film to form a first insulator and a third conductor;

depositing a fourth insulating film by an ALD method to cover the oxide, the first conductor, the second conductor, the first insulator, and the third conductor;

selectively removing part of the fourth insulating film to form an opening reaching the second insulating film in part of the fourth insulating film;

depositing a fifth insulating film over the fourth insulating film;

adding oxygen from above the fifth insulating film by an ion implantation method;

depositing a sixth insulating film over the fifth insulating film by a sputtering method in an oxygen-containing atmosphere; and performing heat treatment, wherein the first insulating film, the fourth insulating film, and the sixth insulating film have a lower oxygen permittivity than the second insulating film.

20. A method for manufacturing a semiconductor device, comprising:

depositing a first insulating film, a second insulating film, a first oxide film, a second oxide film, and a first conductive film in this order over a substrate;

selectively removing part of the first oxide film, part of the second oxide film, and part of the first conductive film to form an oxide, a first conductor, and a second conductor over the second insulating film;

depositing a third insulating film and a second conductive film in this order over the second insulating film, the oxide, the first conductor, and the second conductor;

selectively removing part of the third insulating film and part of the second conductive film to form a first insulator and a third conductor;

depositing a fourth insulating film by an ALD method to cover the oxide, the first conductor, the second conductor, the first insulator, and the third conductor;

selectively removing part of the fourth insulating film to form an opening reaching the second insulating film in part of the fourth insulating film;

depositing a fifth insulating film over the fourth insulating film;

depositing a sixth insulating film over the fifth insulating film by a sputtering method in an oxygen-containing atmosphere;

adding oxygen from above the sixth insulating film by an ion implantation method; and performing heat treatment, wherein the first insulating film, the fourth insulating film, and the sixth insulating film have a lower oxygen permittivity than the second insulating film.

* * * * *